(12) United States Patent
Wang et al.

(10) Patent No.: US 11,636,897 B2
(45) Date of Patent: Apr. 25, 2023

(54) PEAK CURRENT AND PROGRAM TIME OPTIMIZATION THROUGH LOOP DEPENDENT VOLTAGE RAMP TARGET AND TIMING CONTROL

(71) Applicant: SanDisk Technologies LLC, Addison, TX (US)

(72) Inventors: Yanjie Wang, San Jose, CA (US); Henry Chin, Fremont, CA (US); Guirong Liang, Cupertino, CA (US); Jianzhi Wu, Milpitas, CA (US)

(73) Assignee: SanDisk Technologies LLC

( * ) Notice: Subject to any disclaimer, the term of this patent is extended or adjusted under 35 U.S.C. 154(b) by 0 days.

(21) Appl. No.: 17/191,153

(22) Filed: Mar. 3, 2021

(65) Prior Publication Data

US 2022/0284964 A1 Sep. 8, 2022

(51) Int. Cl.
G11C 16/04 (2006.01)
G11C 16/10 (2006.01)
G11C 11/56 (2006.01)
G11C 16/34 (2006.01)

(52) U.S. Cl.
CPC .......... *G11C 16/10* (2013.01); *G11C 11/5628* (2013.01); *G11C 11/5671* (2013.01); *G11C 16/0483* (2013.01); *G11C 16/3459* (2013.01)

(58) Field of Classification Search
CPC . G11C 16/10; G11C 11/5628; G11C 11/5671; G11C 16/0483; G11C 16/3459
See application file for complete search history.

(56) References Cited

U.S. PATENT DOCUMENTS

| | | | |
|---|---|---|---|
| 6,956,770 B2 | 10/2005 | Khalid et al. |
| 7,495,956 B2 | 2/2009 | Fong et al. |
| 7,633,802 B2 | 12/2009 | Mokhlesi |
| 8,374,032 B2 | 2/2013 | Namiki et al. |
| 8,395,945 B2 | 3/2013 | Mokhlesi |
| 8,472,266 B2 | 6/2013 | Khandelwal et al. |
| 8,665,567 B2 | 3/2014 | Shum et al. |
| 8,665,649 B2 | 3/2014 | Park |
| 8,804,425 B2 | 8/2014 | Chen et al. |
| 8,854,890 B1 | 10/2014 | Miwa |

(Continued)

FOREIGN PATENT DOCUMENTS

JP 2012133851 A 7/2012
JP 2020205130 A 12/2020

(Continued)

*Primary Examiner* — Uyen Smet
(74) *Attorney, Agent, or Firm* — Dickinson Wright PLLC; Steven C. Hurles

(57) ABSTRACT

An apparatus includes a plurality of solid-state storage elements, a plurality of control lines coupled to the plurality of solid-state storage elements, and control circuitry in communication with the plurality of control lines. The control circuitry is configured to during a first phase of a control line pre-charging stage, charge one or more unselected control lines of the plurality of control lines using a regulated charging current for a period of time based at least in part on a predicted parasitic capacitance associated with the programming state of the control lines, and during a second phase of the control line pre-charging stage, charge the one or more unselected bit lines to an inhibit voltage level using an unregulated charging current.

14 Claims, 30 Drawing Sheets

(56) References Cited

U.S. PATENT DOCUMENTS

| | | |
|---|---|---|
| 8,929,142 B2 | 1/2015 | Dong et al. |
| 8,995,211 B2 | 3/2015 | Lee |
| 9,013,928 B1 | 4/2015 | Dutta et al. |
| 9,099,202 B2 | 8/2015 | Mihnea et al. |
| 9,251,902 B2 | 2/2016 | Harada et al. |
| 9,460,805 B1 | 10/2016 | Pang et al. |
| 9,536,617 B2 | 1/2017 | Al-Shamma et al. |
| 9,620,238 B2 | 4/2017 | Khandelwal et al. |
| 9,640,273 B1 | 5/2017 | Chen et al. |
| 9,799,401 B2 | 10/2017 | Kim et al. |
| RE46,665 E | 1/2018 | Park et al. |
| 10,008,271 B1 | 6/2018 | Diep et al. |
| 10,283,202 B1 | 5/2019 | Chen et al. |
| 10,559,365 B2 | 2/2020 | Yang et al. |
| 10,839,915 B1 | 11/2020 | Yang et al. |
| 10,861,537 B1 | 12/2020 | Lien et al. |
| 2005/0057967 A1 | 3/2005 | Khalid et al. |
| 2006/0002175 A1 | 1/2006 | Yamamoto et al. |
| 2006/0140007 A1 | 6/2006 | Cernea et al. |
| 2007/0081379 A1 | 4/2007 | Clinton et al. |
| 2011/0188317 A1 | 8/2011 | Mui et al. |
| 2012/0182804 A1 | 7/2012 | Hung et al. |
| 2013/0279258 A1 | 10/2013 | Lee |
| 2014/0063968 A1* | 3/2014 | Shim .................. G11C 16/3459 365/185.22 |
| 2014/0075133 A1 | 3/2014 | Li et al. |
| 2016/0012899 A1 | 1/2016 | Lin et al. |
| 2017/0109040 A1 | 4/2017 | Raghu et al. |
| 2017/0117035 A1 | 4/2017 | Mokhesi et al. |
| 2020/0006634 A1 | 1/2020 | Brockman et al. |
| 2021/0166771 A1* | 6/2021 | Jung .................. G11C 16/0483 |
| 2021/0375338 A1* | 12/2021 | Lien ...................... G11C 7/106 |

FOREIGN PATENT DOCUMENTS

| | | |
|---|---|---|
| KR | 20140131914 A | 11/2014 |
| KR | 102016036 B1 | 8/2019 |
| KR | 1020210020697 A | 2/2021 |
| TW | 201140593 A | 11/2011 |

* cited by examiner

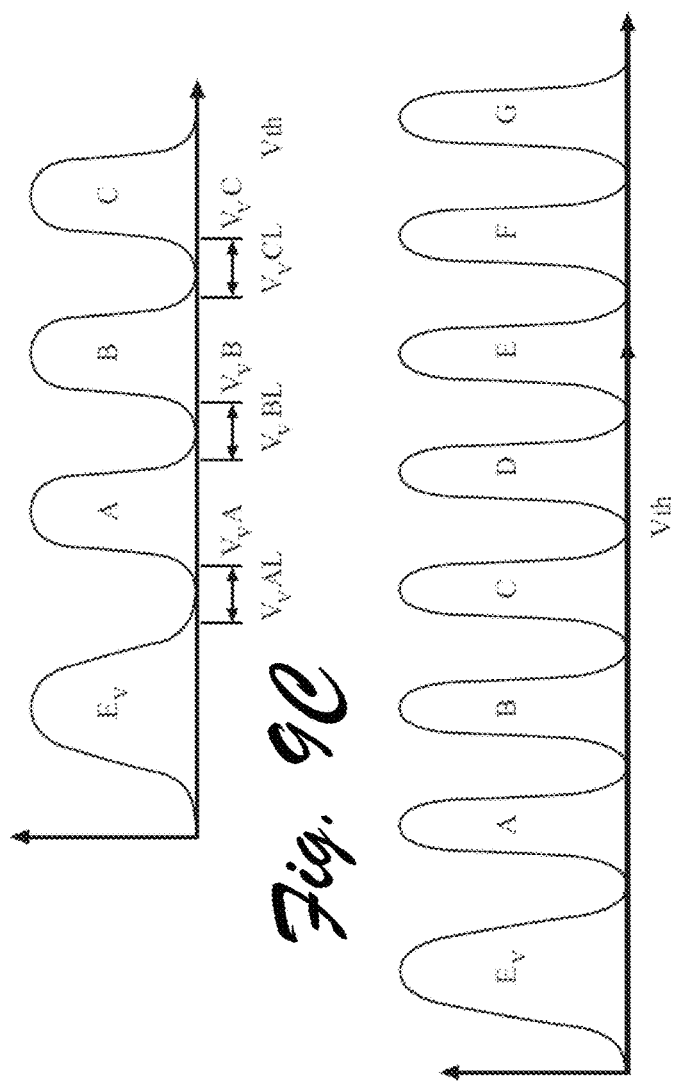
Fig. 9C
Fig. 9D
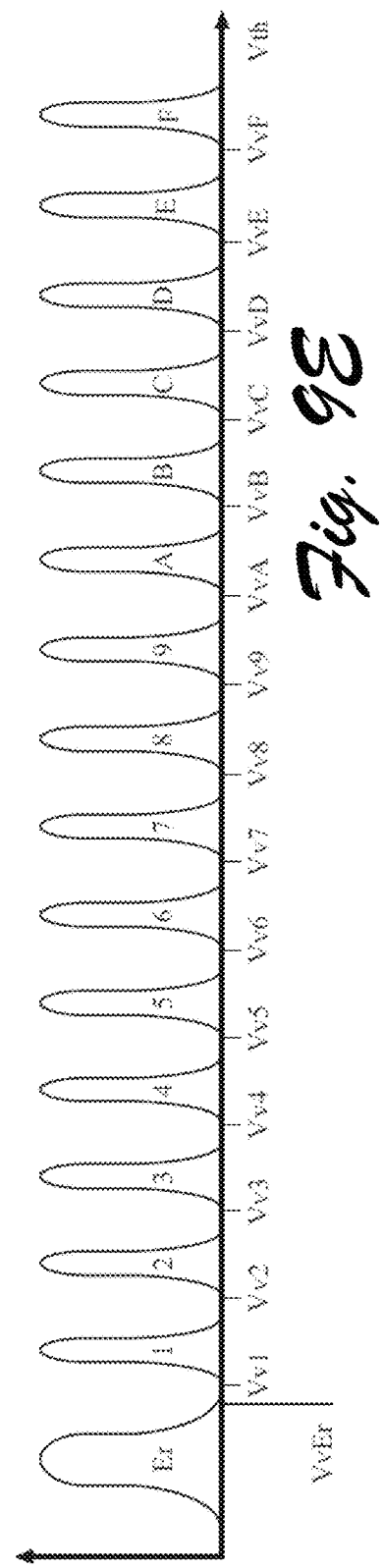
Fig. 3b

| BL data pattern | BL Equiv. Cap. |
|---|---|
| 0-0-1-0-0 | $Cbl+C2bl+Co$ |
| 1-0-1-0-0 | $Cbl+C2bl/2+Co$ |
| 0-0-1-0-1 | $Cbl+C2bl/2+Co$ |
| 1-0-1-0-1 | $Cbl+Co$ |
| 0-1-1-0-0 | $Cbl/2+C2bl+Co$ |
| 0-0-1-1-0 | $Cbl/2+C2bl+Co$ |
| 1-1-1-0-0 | $Cbl/2+C2bl/2+Co$ |
| 1-0-1-1-0 | $Cbl/2+C2bl/2+Co$ |
| 0-1-1-0-1 | $Cbl/2+C2bl/2+Co$ |
| 0-0-1-1-1 | $Cbl/2+C2bl/2+Co$ |
| 1-1-1-0-1 | $Cbl/2+Co$ |
| 1-0-1-1-1 | $C2bl/2+Co$ |
| 0-1-1-1-0 | $C2bl+Co$ |
| 1-1-1-1-0 | $C2bl/2+Co$ |
| 0-1-1-1-1 | $C2bl/2+Co$ |
| 1-1-1-1-1 | $Co$ |
| 0-0-0-1-1 | 0 |
| 0-0-0-1-0 | 0 |
| 0-0-0-0-1 | 0 |
| 0-0-0-0-0 | 0 |
| 1-1-0-1-1 | 0 |
| 1-1-0-1-0 | 0 |
| 1-1-0-0-1 | 0 |
| 1-1-0-0-0 | 0 |
| 0-1-0-1-1 | 0 |
| 0-1-0-1-0 | 0 |
| 0-1-0-0-1 | 0 |
| 0-1-0-0-0 | 0 |
| 1-0-0-1-1 | 0 |
| 1-0-0-1-0 | 0 |
| 1-0-0-0-1 | 0 |
| 1-0-0-0-0 | 0 |

Fig. 14D

PEAK CURRENT AND PROGRAM TIME OPTIMIZATION THROUGH LOOP DEPENDENT VOLTAGE RAMP TARGET AND TIMING CONTROL

FIELD

The present technology relates to electronic storage devices. More particularly, the disclosure relates to systems and methods for optimizing peak current and minimizing programming time impacts during loop-dependent control of voltage ramp targets.

BACKGROUND

In certain computing systems, such as solid-state memories or data storage systems, high peak current levels can negatively impact performance and/or efficiency. While prior approaches to decrease peak current levels during programming have been attempted, they often introduce undesired side effects such as substantial increases in programming time, significantly slowing operation of memory components.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), an electrically erasable programmable read-only memory (EEPROM), a flash memory, and/or the like. In an EEPROM or flash NAND array architecture, memory cells may be arranged in a matrix of rows and columns, such that gates of each memory cell are coupled by rows to word lines. The memory cells may be arranged together in strings such that memory cells in a given string are coupled together in series, from source to drain, between a common source line and a common bit line. More particularly, in current NAND flash design, one of the most challenging issues is reducing peak current consumption (peak ICC), as it may lead to peak power drop, which can cause malfunctions in NAND flash memory. However, previous approaches to reduce peak ICC also introduce unacceptable performance degradation, especially by increasing programming time of the affected memory devices and reducing operational performance.

SUMMARY

There is provided an apparatus includes a plurality of solid-state storage elements, a plurality of control lines coupled to the plurality of solid-state storage elements, and control circuitry in communication with the plurality of control lines. The control circuitry is configured to during a first phase of a control line pre-charging stage, charge one or more unselected control lines of the plurality of control lines using a regulated charging current for a period of time based at least in part on a predicted parasitic capacitance associated with the programming state of the control lines, and during a second phase of the control line pre-charging stage, charge the one or more unselected bit lines to an inhibit voltage level using an unregulated charging current.

Aspects of the present disclosure provide a loop-dependent adjustment of the threshold detection parameter $V_{HSATGT}$, allowing reduction of large peak ICC current spikes while optimizing total programming time with less tprog penalty that non-dynamic approaches. Aspects of the present disclosure utilize analysis of potential data patterns on control lines to predict bit line capacitive loading for each loop of a program cycle, and then the regulated to unregulated charging threshold parameter $V_{HSATGT}$ can be applied differently for each pulse depending on expected capacitance.

There is provided a non-volatile memory device, having a plurality of memory cells electrically respectively electrically coupled to a plurality of bit lines and control circuitry coupled to the plurality of memory cells and configured to perform the steps of determining a loop-dependent programming adjustment parameter based on a programming cycle of the plurality of memory cells; performing a programming and verify operation on the plurality of memory cells as modified by the loop-dependent programming adjustment parameter; and wherein the determination of the loop-dependent programming adjustment parameter is based upon a relative capacitance of a plurality of bit lines respectively in electrical communication with the of the plurality of memory cells. The control circuitry may provide any desired function, including being further configured to perform the steps of determining a position of a program loop in a sequence of program loops performed to complete a programming operation on a the plurality of memory cells and wherein the determination of the loop-dependent programming adjustment parameter is further based upon the position of the loop within the sequence of program loops. Further, in the non-volatile memory device, the position of the loop within the sequence of program control circuitry may be determined to be in one of a beginning section, a middle section, or an ending section and setting the adjustment parameter to a first lower value if the loop position is within the beginning section, setting the adjustment parameter to a higher value if the loop position is within the middle section; and setting the adjustment parameter to a second lower value if the loop position is within the ending section. The relative capacitance of the plurality of bit lines may be determined in any desired manner, such as determining the capacitance based on a configuration of inhibit or program voltages as respectively assigned to the plurality of bit lines. Further, the relative capacitance of the plurality of bit lines may also be determined based on respective programming states of the plurality of memory cells.

Various aspects of the present disclosure reduce peak ICC current of the memory device. In this light, modification of the programming and verify operation on the plurality of memory cells may result in a reduced peak current utilization by the memory device. Further, any parameters used by the memory device or control systems therein may be adjusted to provide operational improvement for at least peak current management and timing/operational management. In one aspect, the programming adjustment parameter comprises a voltage detection threshold for inhibit voltage charge-up of the respective bit lines, and in another aspect, the programming adjustment parameter comprises a bit line equalization time value for a program recovery phase of the programming cycle, and in yet another aspect, the programming adjustment parameter comprises a bit line setup to read voltage time value for a program verify/read phase of the programming cycle. The loop-dependent programming adjustment parameters may be based upon a voltage threshold state of at least one of the memory cells of the memory device. In addition to the storage device as described above, methods of the present disclosure may set forth steps to control a non-volatile memory device comprising a plurality of memory cells respectively electrically coupled to a plurality of bit lines, and control circuitry coupled to the plurality of memory cells, the method comprising: determining a loop-dependent programming adjustment parameter based on a programming cycle of the plurality of memory cells; performing a programming and verify operation on the plurality of memory cells as modified by the loop-dependent programming adjustment parameter; and wherein the determination of the loop-dependent programming adjustment parameter is based upon a relative capacitance of a plurality of bit lines respectively in electrical communication with the of the plurality of memory cells. The control circuitry may provide any desired function, including being further configured to perform the steps of determining a position of a program loop in a sequence of program loops performed to complete a programming operation on a the plurality of memory cells and wherein the determination of the loop-dependent programming adjustment parameter is further based upon the position of the loop within the sequence of program loops. Further, in the non-volatile memory device, the position of the loop within the sequence of program control circuitry may be determined to be in one of a beginning section, a middle section, or an ending section and setting the adjustment parameter to a first lower value if the loop position is within the beginning section, setting the adjustment parameter to a higher value if the loop position is within the middle section; and setting the adjustment parameter to a second lower value if the loop position is within the ending section. The relative capacitance of the plurality of bit lines may be determined in any desired manner, such as determining the capacitance based on a configuration of inhibit or program voltages as respectively assigned to the plurality of bit lines. Further, the relative capacitance of the plurality of bit lines may also be determined based on respective programming states of the plurality of memory cells.

BRIEF DESCRIPTION OF THE DRAWINGS

The accompanying drawings, which are incorporated in and constitute a part of this specification illustrate various aspects of the disclosure and together with the description, serve to explain its principles. Wherever convenient, the same reference numbers will be used throughout the drawings to refer to the same or like elements.

FIG. 9C illustrates the Vth distributions of memory cells in an example one-pass programming operation with four data states.

FIG. 9D illustrates the Vth distributions of memory cells in an example one-pass programming operation with eight data states.

FIG. 9E illustrates the Vth distributions of memory cells in an example one-pass programming operation with sixteen data states.

FIG. 14D provides a table of formulas for predicting parasitic capacitances of bit lines based on current bit line inhibit or program configuration.

DETAILED DESCRIPTION

Figure 1A:
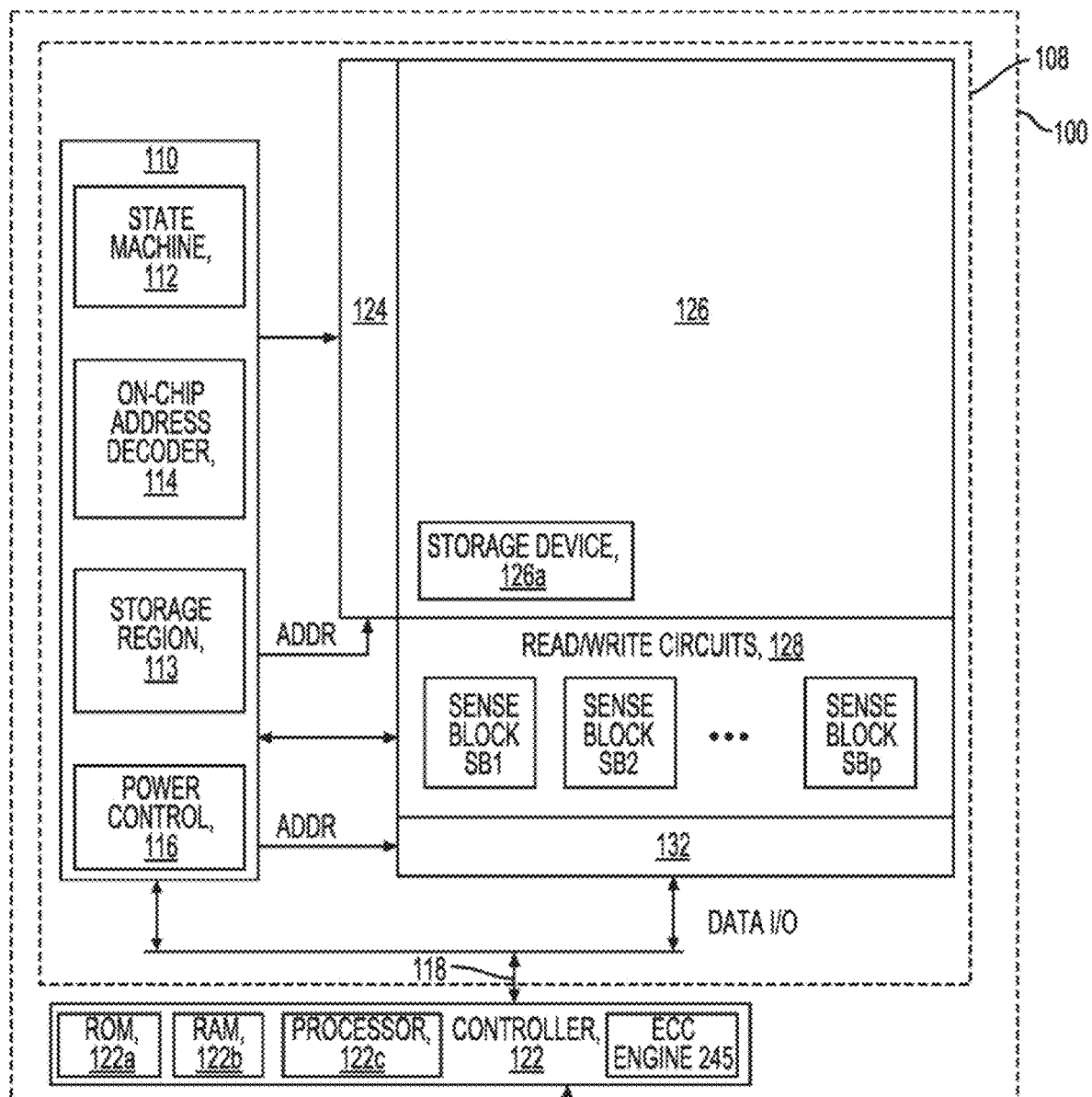
FIG. 1A illustrates a block diagram of an example memory device.

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit. Further, in an EEPROM or flash NAND array architecture, memory cells may be arranged in a matrix of rows and columns, such that gates of each memory cell are coupled by rows to word lines. The memory cells may be arranged together in an array of strings such that memory cells in a given string are coupled together in series, from source to drain, between a common source line and a common control line or bit line. For purposes of the present disclosure, generally the term "bit line" is considered a type of control line and the terms are therefore used interchangeably.

In current flash memory design, one of the most challenging issues is reducing peak current consumption (peak ICC), which can lead to peak power drop causing malfunctions in flash memory. More specifically, in the case of multiple concurrently operated flash memories of a memory device, peak ICC is multiplied by the number of flash memories that are operated concurrently. Thus, reduction of peak ICC per flash memory can help a memory device work within a peak current limitation of a host.

Peak current management may be necessary or desirable in order to ensure that the solid-state memory device meets necessary or desirable current specifications, which may be related to the average current consumption during program and/or read operations. Therefore, excessively high current spikes may increase the average current consumption across data points over a programming operation. Furthermore, absolute peak current, as defined by the highest current level consumed during a program or read operation, may likewise represents an important or critical specification or characteristic of the solid-state memory device, wherein excessively high peak current levels may limit the number of solid-state memory dies that may be run in parallel due to the power supply burden imposed by the current spike(s).

To program memory cells included in the array of memory strings, a programming operation may be performed to apply a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. When programming is completed for a memory cell, it can be locked out from further programming while programming continues for other memory cells in subsequent program loops.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. A memory cell can be in an erased data state (referred to herein as an erased state) or can be programmed to a programmed data state (referred to herein as a programmed state) that is different from the erased state. For example, in a one-bit per cell memory device (single-level cell (SLC)), there are two data states including the erased state and one higher data state. Also, in a two-bit per cell memory device (multi-level cell (MLC)), there are four data states including the erased state and three programmed data states referred to as the A, B and C data states (see FIG. 9C). In a three-bit per cell memory device (or a triple-level cell (TLC)), there are eight data states including the erased state and seven programmed data states referred to as the A, B, C, D, E, F and G data states (see FIG. 9D). In a four-bit per cell memory device (quad-level cell (QLC)), there are sixteen data states including the erased state and fifteen programmed data states referred to as the Er, 1, 2, 3, 4, 5, 6, 7, 8, 9, A, B, C, D, E and F data states (see FIG. 9D)

When a program command is issued, the write data is stored in latches associated with the memory cells. During programming, the latches of a memory cell can be read to determine the data state to which the cell is to be programmed. Each memory cell is considered to have completed programming when a sensing operation determines that a threshold voltage (Vth) is satisfied by (e.g., above) the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

When programming memory cells, it is important to perform a program-verify operation in a way that is both fast and controls peak ICC to prevent device malfunctions. During a program loop, a particular programming clock time interval (identified as P7 below) is susceptible to occurrence of large ICC current spikes during bit line pre-charging. As describe in more detail below, one way to address this issue is by applying a regulated current pre-charge control, as varied by control circuitry configured with a parameter identified herein as $V_{HSASLOWP}$ that provides for bit line peak current control from to slow the pre-charge rate of the bit lines. However, by slowing the charge-up of the relevant bit lines to an inhibit state, the overall programming time is adversely impacted if this regulated current operates all the way to the maximum charge level (e.g. $V_{DDSA}$). More typically, a voltage threshold parameter (e.g., $V_{HSATGT}$) is set to allow the control circuitry to switch from a regulated charging to an unregulated charging configuration to shorten the charge-up period. However, as more completely described below, selection of an ideal regulated to unregulated charging point is problematic. In embodiments of the present disclosure, as described below, bit line charge-up is controlled based on a statistical prediction of effective bit-line capacitance based on neighboring bit line configurations, and by controlling the application of a threshold charging transition point, peak ICC can be controlled with minimal overall impact to device programming time, tprog.

One solution is to implement a multistep verify (MSV) operation. The MSV operation is a two-step operation, where a different verify voltage is applied during each step. Once a threshold voltage for a memory cell reaches a first verify voltage, a control voltage is changed to slow down the faster-programmed memory cells. However, an MSV operation may result in degraded performance (e.g., relative to one-step programming operations) due to electron migration or disturbance on the memory cells. Furthermore, the MSV operation is inefficient as it requires an additional step in order to program the memory cells.

For these reasons, and other reasons that will become apparent to one of ordinary skill in the art upon reading the present specification and corresponding figures, there is a need in the art for a way to create narrow Vth distributions without reducing programming throughput of the memory device.

Some embodiments, described herein, may include systems and/or methods for performing iterations of a verify operation to verify data states of memory cells in a selected word line, where a fast-programming verification technique or a precision-based verification technique is selected and implemented for each iteration of the verify operation. For example, the systems and/or methods may select a verification technique (e.g., the fast-programming verification technique or the precision-based verification technique) based on an iteration of the verify operation that is being performed, based on whether positions of memory cells are part of an upper or lower tail of a natural threshold voltage distribution (NVD)(e.g., use fast-programming verification technique) or part of a middle portion of the NVD (e.g., use precision-based verification technique), and/or the like.

The systems and/or methods described herein are able to efficiently and effectively narrow the Vth distributions of the memory cells. Furthermore, the systems and/or methods conserve resources (e.g., processing resources, memory resources, and/or the like) by reducing program-verify operation execution time relative to an inferior system or method (e.g., that utilizes only the fast-programming verification technique or only the precision-based verification technique). Reducing a total program-verify time conserves resources (e.g., power resources, processing resources, memory resources, and/or the like) that would have otherwise be expended programming and verifying the memory cells using only the precision-based verification technique.

In one approach, a verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and may be lower than the final verify voltage. When a memory cell is close to completion of programming, the programming speed of the memory cell may be reduced such as by elevating a voltage of a respective bit line during one or more subsequent program voltages. For example, in FIG. 9 a memory cell which is to be programmed to the A data state may be subject to verify tests at VvAL, an offset verify voltage of the A data state, and VvA, a final verify voltage of the A data state.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a programming operation for one set of memory cells, wherein the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

Figure 1B:
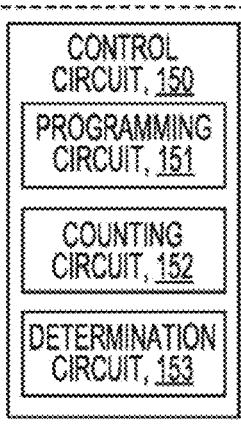
FIG. 1B illustrates a block diagram of an example control circuit which comprises a programming circuit, a counting circuit, and a determination circuit.

For example, FIG. 1B is a block diagram of an example control circuit 150 which comprises a programming circuit 151, a counting circuit 152 and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors. Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Additionally, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
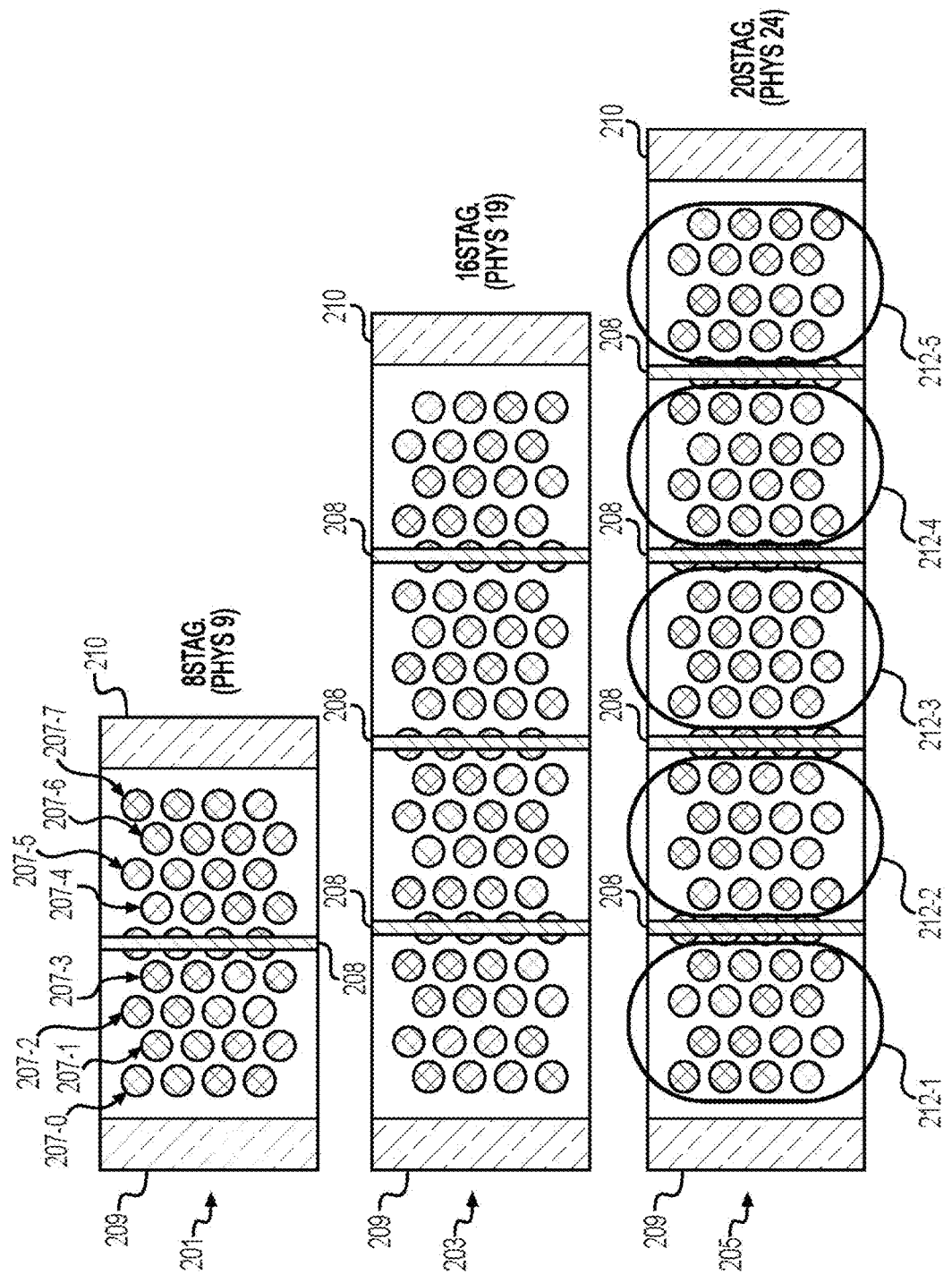
FIG. 2 illustrates a schematic view of three memory string architectures according to the principles of the present disclosure.

FIG. 2 illustrates a schematic view of example BiCS memory architectures utilizing staggered memory strings. For example, reference number 201 shows a schematic view of an example BiCS 4 memory architecture, reference number 203 shows a schematic view of an example BiCS 5 memory architecture, and reference number 205 shows a schematic view of an example BiCS 6 memory architecture. In some embodiments, as shown, a BiCS memory architecture may include an array of staggered NAND strings.

With reference to memory architecture 201, the memory strings are shown in rows 207-0 through 207-7 in string architecture 201. A memory string may include a set of memory cells (e.g., which correspond to a set of memory holes). Each row is shown with four ends to the memory strings. A memory string may be connected to an adjacent string at an end (not visible beneath this view). A first group of rows 207-0 through 207-3 of shown on a left side of a dummy row 208. A second group of rows 207-4 through 207-7 of shown on a right side of the dummy row 208. The dummy row 208 separates the two groups of rows in the staggered eight row. A source line 209 is positioned at an edge of the first group and is remote from the dummy row 208. A source line 210 is positioned at an edge of the second group and is remote from the dummy row 208 and source line 209.

The memory architectures 203 and 205 may be similar to that of string architecture 201 except additional groups are added. String architecture 203 may be double the size of architecture 201 and may include sixteen rows of strings with each group of four rows separated by a dummy row. String architecture 205 may be larger than both the memory architecture 201 and the memory architecture 203. String architecture 205 may include twenty rows of strings with each group of four rows separated by a dummy row 208.

In some embodiments, memory architectures 201, 203, and/or 205 may include a chip under array structure. For example, memory architectures 201, 203, and/or 205 may include a chip under array structure whereby the control circuitry is under the memory array that includes the groups of memory strings. With the chip under array structure, the memory strings may include a direct strap contact for the source line for read and erase operations.

In some embodiments, the memory architecture 205 may be a BiCS 6 memory architecture. For example, in a BiCS 6 memory architecture, there may be five NAND string groups. NAND string group 212-1, NAND string group 212-2, NAND string group 212-3, NAND string group 212-3, and NAND string group 212-4). NAND string group 212-0 and NAND string group 212-4 may be referred to as outer NAND string groups. NAND string group 212-1, NAND string group 212-2, and NAND string group 212-3 may be referred to collectively as inner NAND string groups. NAND string group 212-2 may be referred to as an inner-most NAND string group.

In some embodiments, the BiCS 6 memory architecture may be a 3-D memory architecture that includes one or more 3-D blocks. In this case, a 3-D block may be logically segmented into multiple sub-blocks corresponding to NAND string groups. The 3-D block may also be segmented into multiple planes. Additional block description is provided further herein.

While one or more embodiments refer to a BiCS memory architecture, it is to be understood that this is provided by way of example. In practice, the techniques described herein may be implemented on any number of different memory architectures, such as pipe-shaped BiCS (P-BiCS), a vertical recess array transistor (VRAT) architecture, and/or any other type of EEPROM or flash memory architecture.

Figure 3:
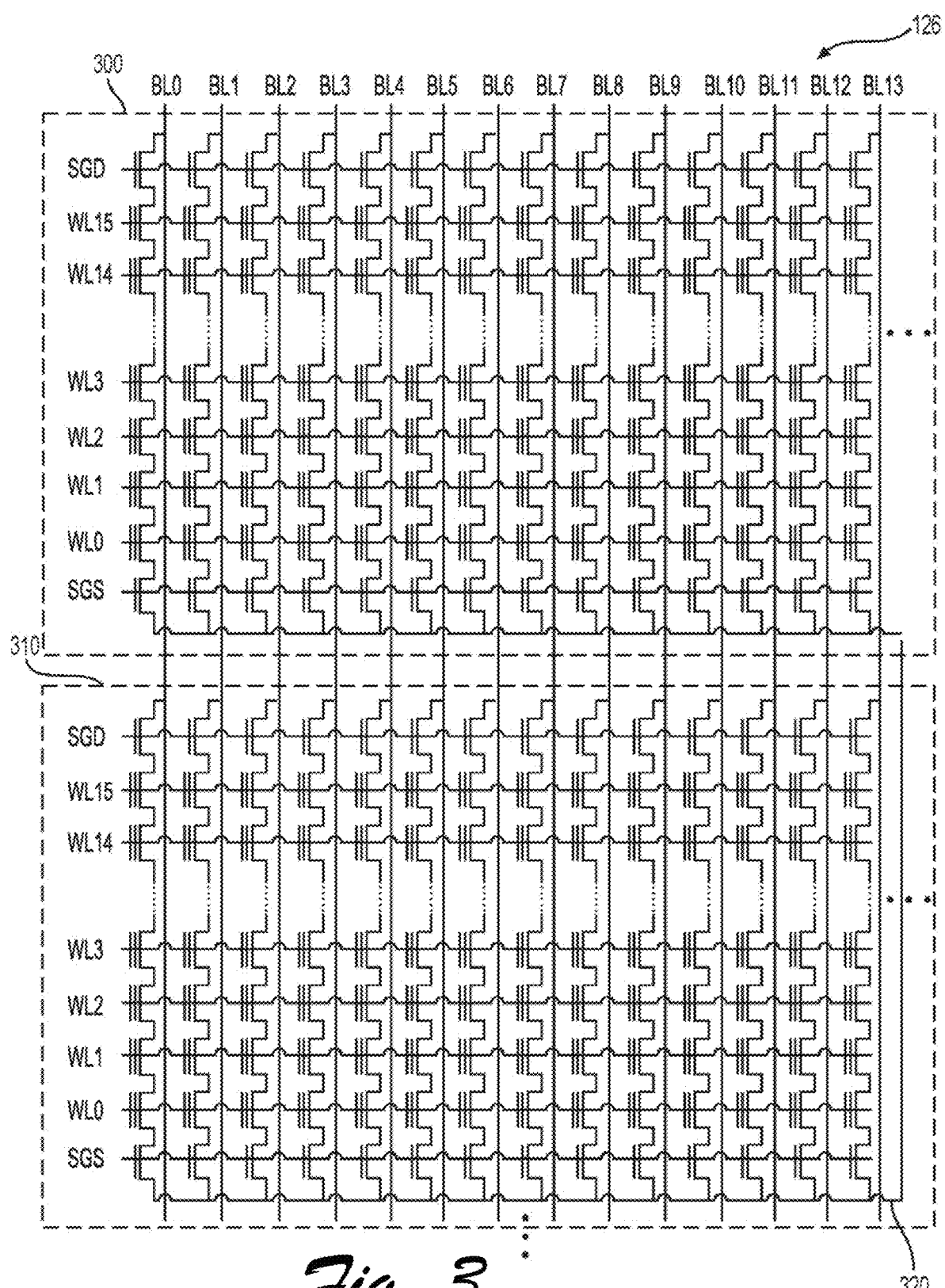
FIG. 3 depicts blocks of memory cells in an example two-dimensional configuration of the memory array of FIG. 1.

FIG. 3 illustrates blocks of memory cells in an example two-dimensional configuration of the memory array 126 of FIG. 1. The memory array can include many blocks. Each example block 300, 310 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 320. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 4A and 4B. Other types of non-volatile memory can also be used. For example, a charge-trapping memory cell uses a non-conductive dielectric material in place of a conductive floating gate to store charge in a non-volatile manner. See FIGS. 5A and 5B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 4A:
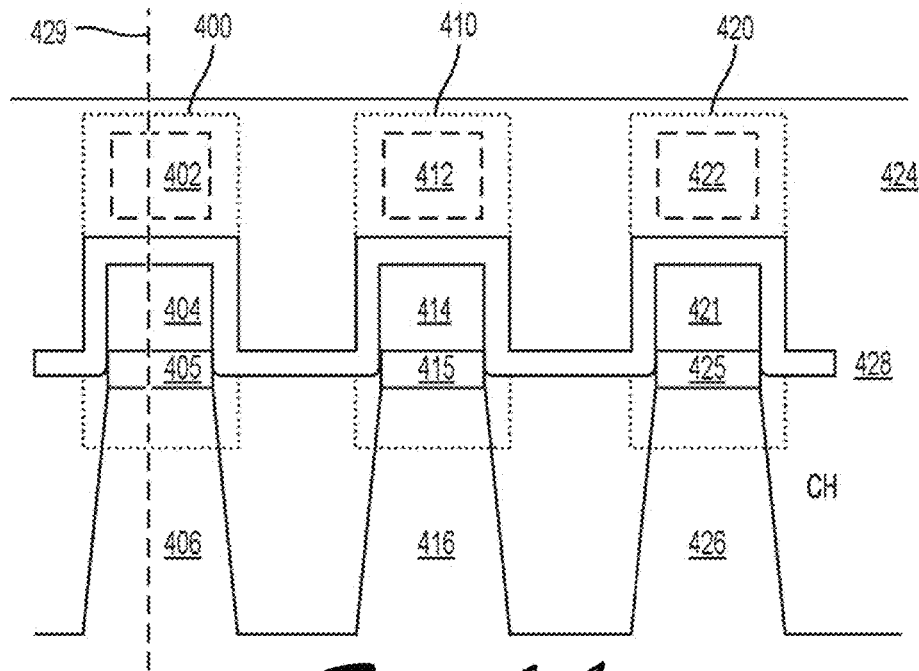
FIG. 4A illustrates a cross-sectional view of example charge-trapping memory cells in NAND strings.
Figure 4B:
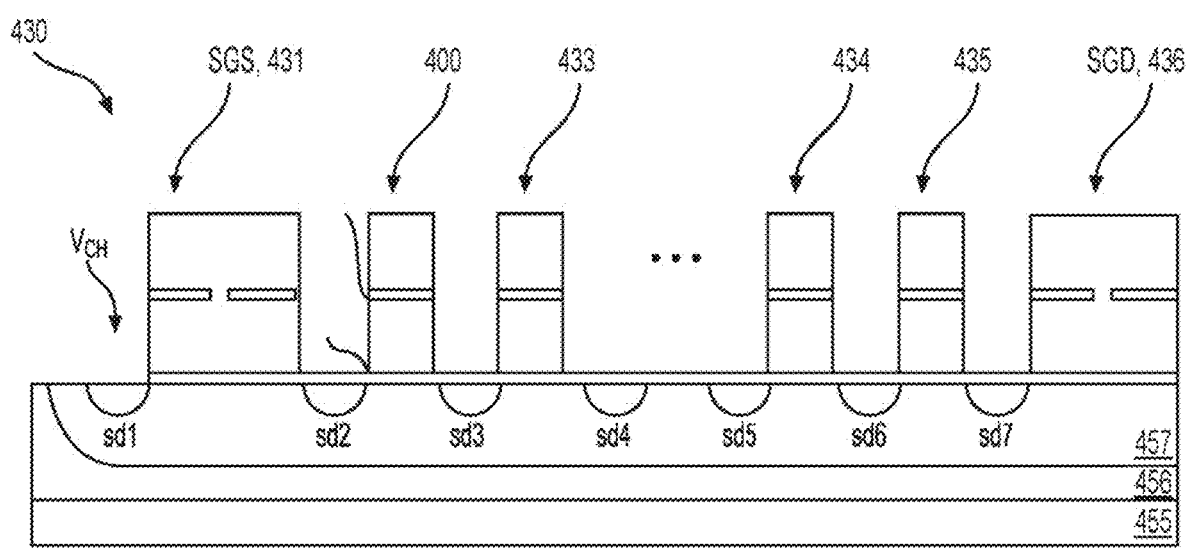
FIG. 4B illustrates a cross-sectional view of the structure of FIG. 4A along line 429.

FIG. 4A illustrates a cross-sectional view of example floating gate memory cells in NAND strings. A bit line or NAND string direction goes into the page, and a word line direction goes from left to right. As an example, word line 424 extends across NAND strings which include respective channel regions 406, 416 and 426. The memory cell 400 includes a control gate 402, a floating gate 404, a tunnel oxide layer 405 and the channel region 406. The memory cell 410 includes a control gate 412, a floating gate 414, a tunnel oxide layer 415 and the channel region 416. The memory cell 420 includes a control gate 422, a floating gate 421, a tunnel oxide layer 425 and the channel region 426. Each memory cell is in a different respective NAND string. An inter-poly dielectric (IPD) layer 428 is also illustrated. The control gates are portions of the word line. A cross-sectional view along contact line connector 429 is provided in FIG. 4B.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates.

Figure 5A:
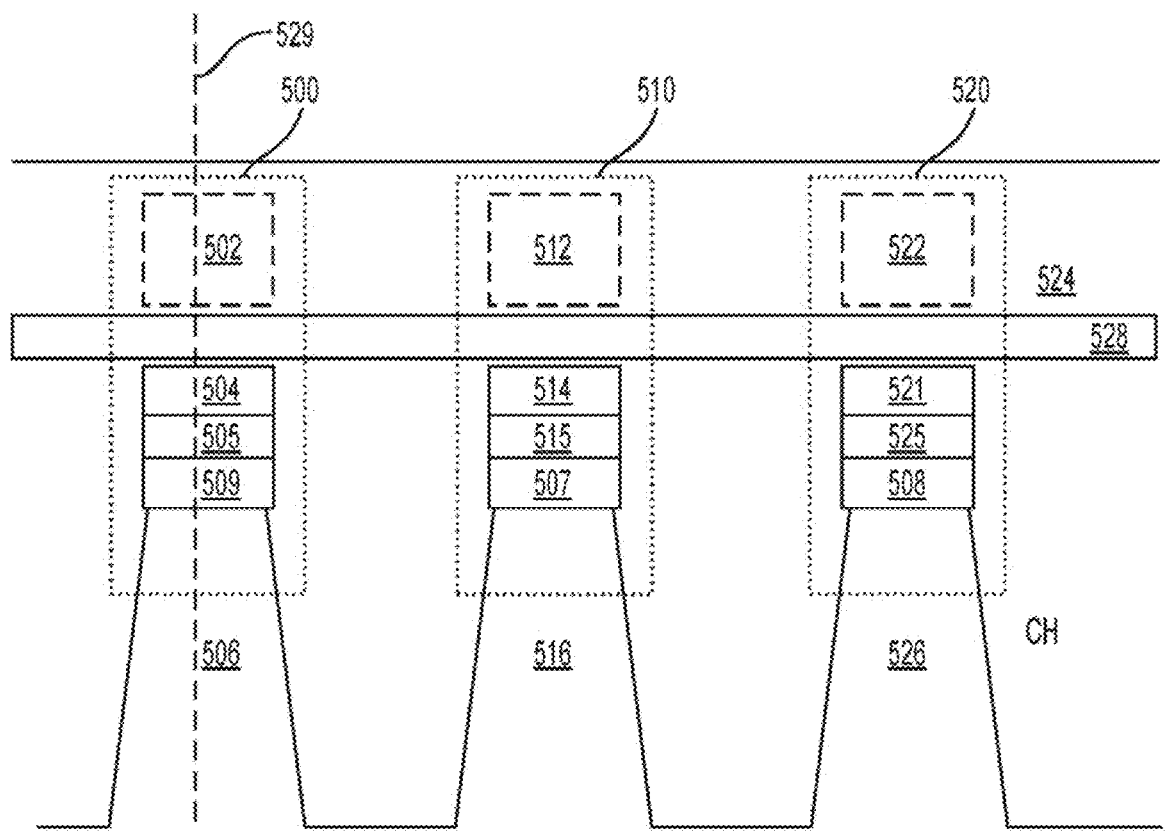
FIG. 5A illustrates an example block diagram of the sense block SB1 of FIG. 1.
Figure 5B:
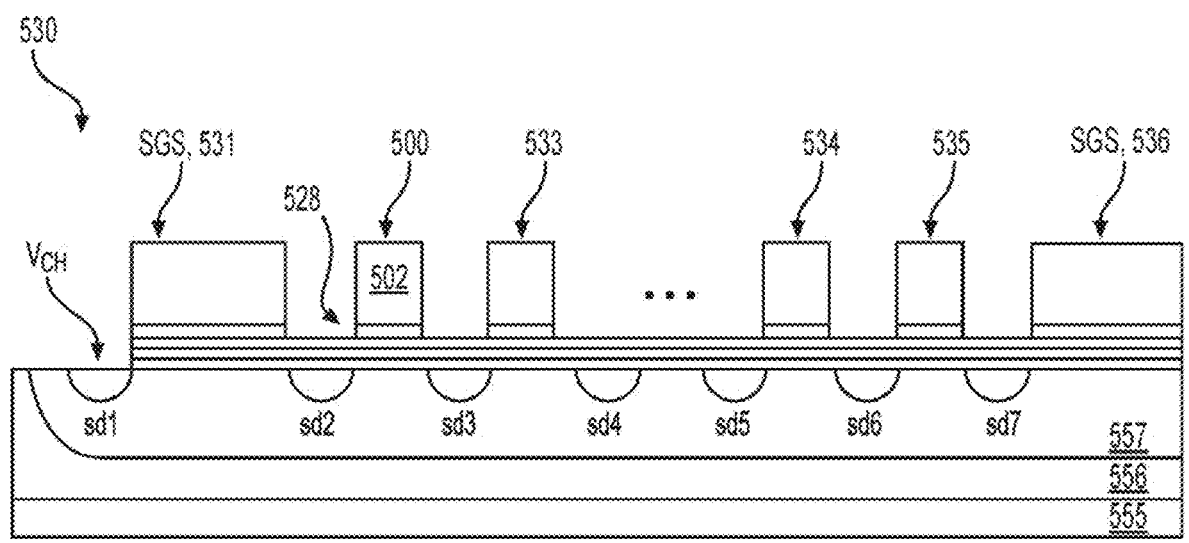
FIG. 5B illustrates another example block diagram of the sense block SB1 of FIG. 1.

As an alternative, as shown in FIGS. 5A and 5B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 5B illustrates a cross-sectional view of the structure of FIG. 5A along contact line connector 529. The NAND string 530 includes an SGS transistor 531, example memory cells 500, 533, . . . , 534 and 535, and an SGD transistor 536. The memory cell 400, as an example of each memory cell, includes the control gate 402, the IPD layer 428, the floating gate 404 and the tunnel oxide layer 505, consistent with FIG. 5A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well. A channel voltage, Vch, may be applied directly to the channel region of the substrate.

Figure 6A:
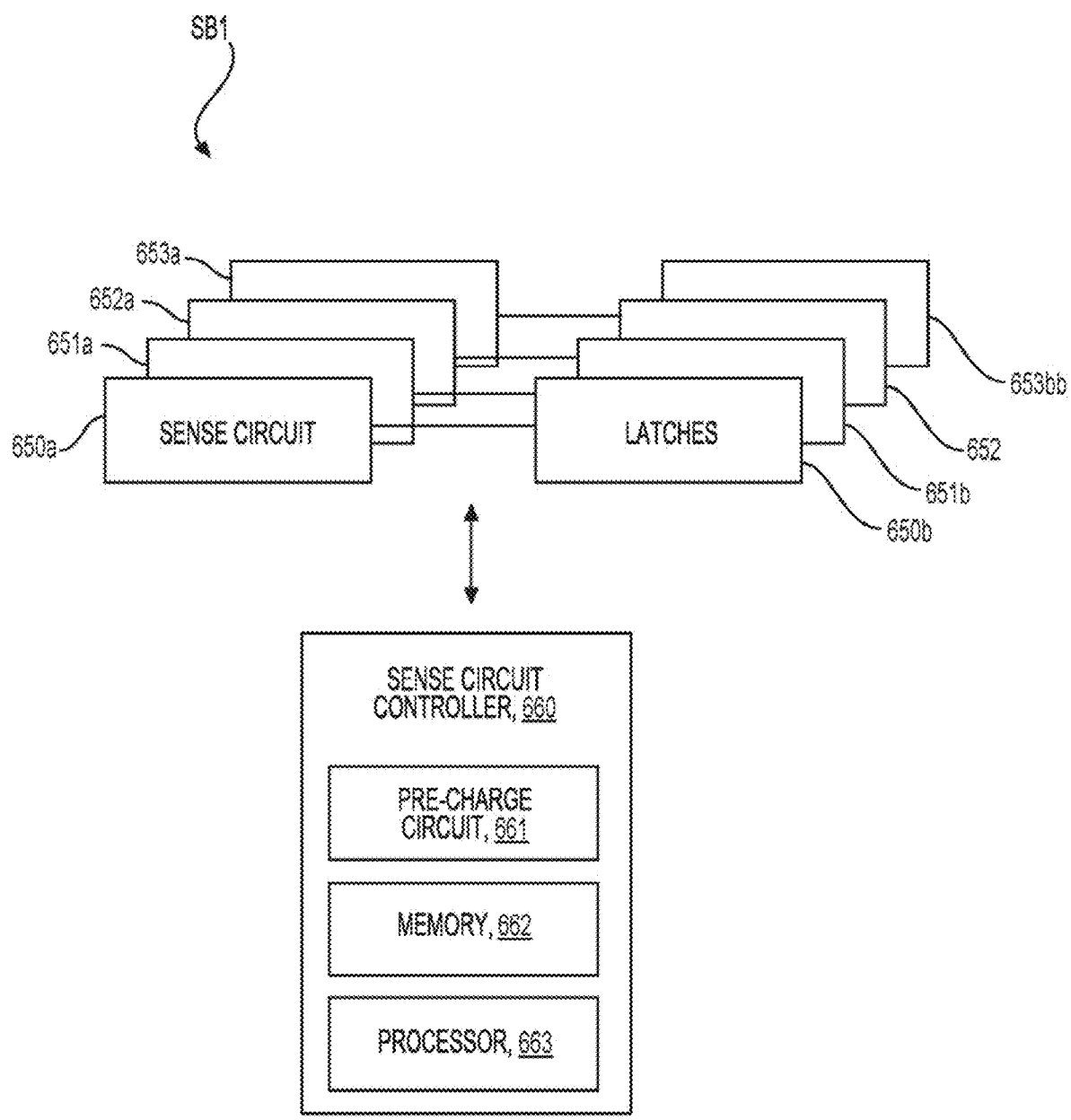
FIG. 6A illustrates an example block diagram of the sense block SB1 of FIG. 1.

FIG. 6A illustrates an example block diagram of the sense block SB1 of FIG. 1. In one approach, a sense block comprises multiple sense circuits. Each sense circuit is associated with data latches. For example, the example sense circuits 650a, 651a, 652a and 553a are associated with the data latches 650b, 551b, 652b and 653b, respectively. In one approach, different subsets of bit lines can be sensed using different respective sense blocks. This allows the processing load which is associated with the sense circuits to be divided up and handled by a respective processor in each sense block. For example, a sense circuit controller 660 in SB1 can communicate with the set of sense circuits and latches. The sense circuit controller may include a pre-charge circuit 661 which provides a voltage to each sense circuit for setting a pre-charge voltage. In one possible approach, the voltage is provided to each sense circuit independently, e.g., via the data bus 603 and a local bus such as LBUS1 or LBUS2 in FIG. 6B. In another possible approach, a common voltage is provided to each sense circuit concurrently, e.g., via the contact line 605 in FIG. 6B. The sense circuit controller may also include a memory 662 and a processor 663. The memory 662 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 650a and 651a are provided below.

The sense circuit controller can communicate with different sense circuits in a time-multiplexed manner, for instance. A contact line 605 may be connected to the voltage clamp in each sense circuit, in one approach.

The sense circuit 651a includes latches 651b, including a trip latch 646, an offset verify latch 647 and data state latches 648. A voltage clamp 641 may be used to set a pre-charge voltage at a sense node 642. A sense node to bit line (BL) switch 643 selectively allows the sense node to communicate with a bit line 645, and a voltage clamp 644 can set a voltage on the bit line. The bit line 645 is connected to one or more memory cells such as a memory cell MC2. A local bus, LBUS2, allows the sense circuit controller to communicate with components in the sense circuit, such as the latches 651b and the voltage clamp in some cases. To communicate with the sense circuit 651a, the sense circuit controller provides a voltage via a contact line 601 to a transistor 606 to connect LBUS2 with DBUS.

The sense circuit 650a may be a first sense circuit which comprises a first trip latch 626 and the sense circuit 651a may be a second sense circuit which comprises a second trip latch 646.

The sense circuit 650a is an example of a first sense circuit comprising a first sense node 622, where the first sense circuit is associated with a first memory cell MC1 and a first bit line 625. The sense circuit 651a is an example of a second sense circuit comprising a second sense node 642, where the second sense circuit is associated with a second memory cell MC2 and a second bit line 645.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6B:
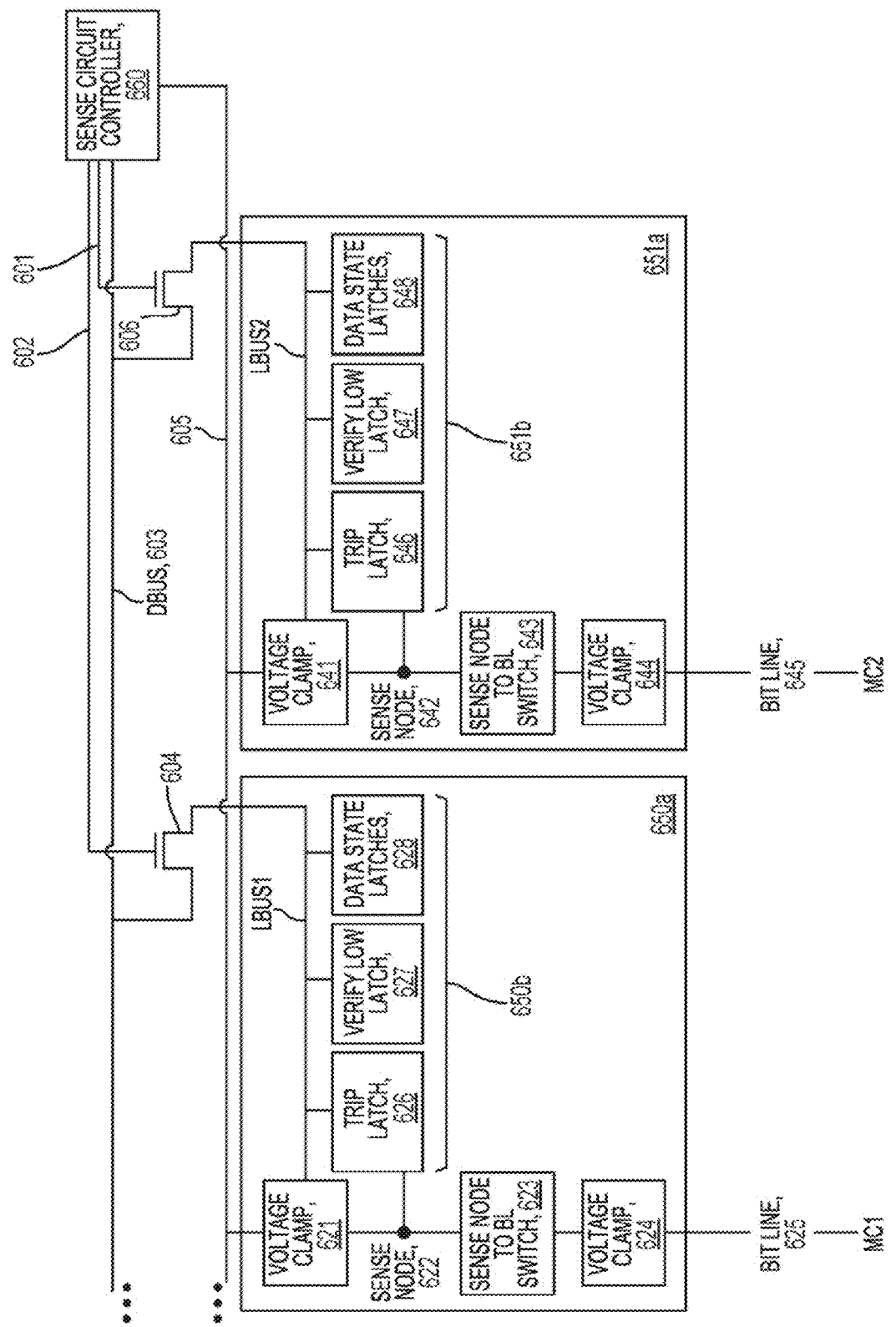
FIG. 6B illustrates another example block diagram of the sense block SB1 of FIG. 1.

FIG. 6B illustrates another example block diagram of the sense block SB1 of FIG. 1. The sense circuit controller 660 communicates with multiple sense circuits including example sense circuits 650a and 651a, also shown in FIG. 6A. The sense circuit 650a includes latches 650b, including a trip latch 626, an offset verify latch 627 and data state latches 628. The sense circuit further includes a voltage clamp 621 such as a transistor which sets a pre-charge voltage at a sense node 622. A sense node to bit line (BL) switch 623 selectively allows the sense node to communicate with a bit line 625, e.g., the sense node is electrically connected to the bit line so that the sense node voltage can decay. The bit line 625 is connected to one or more memory cells such as a memory cell MC1. A voltage clamp 624 can set a voltage on the bit line, such as during a sensing operation or during a program voltage. A local bus, LBUS1, allows the sense circuit controller to communicate with components in the sense circuit, such as the latches 650b and the voltage clamp in some cases. To communicate with the sense circuit 650a, the sense circuit controller provides a voltage via a contact line 602 to a transistor 604 to connect LBUS1 with a data bus DBUS 603. The communicating can include sending data to the sense circuit and/or receive data from the sense circuit.

Figure 6C:
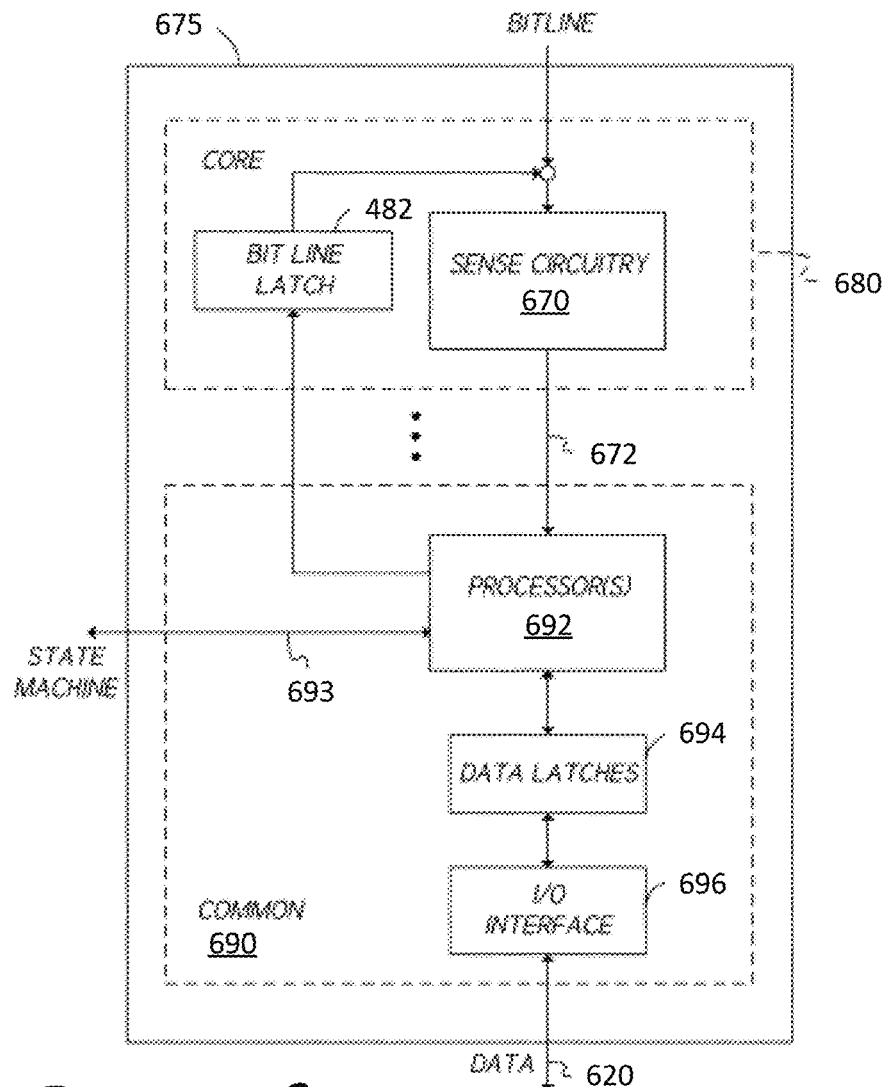
FIG. 6C is a block diagram of sense circuitry in accordance with one or more embodiments.

FIG. 6C is a block diagram of an individual sense block 675 partitioned into a core portion, referred to as a sense module 680, and a common portion 690. The elements shown and described in accordance with FIG. 6C may comprise the same or different elements than those described in accordance with FIGS. 6A and 6B above, and may augment the functions described above to operate with embodiments of the present disclosure. In some embodiments, a separate sense module 680 may be provided for each bit line, whereas a single common portion may be provided for a set of multiple sense modules. In certain embodiments, a sense block includes one common portion 690 and eight or more sense modules 680. Each of the sense modules 680 in a group may communicate with the associated common portion via a data bus 672. For further details, refer to U.S. Patent Application Publication 2006/0140007, the contents of which is incorporated herein by reference in its entirety for all purposes.

The sense module 680 may comprise sense circuitry 670. In certain embodiments, the sense circuitry 670 is configured to determine whether a conduction current in a connected bit line is above or below a predetermined threshold level. Alternatively or additionally, the sense circuitry 670 may be configured to determine whether current flows in a bit line and/or memory cell when a given threshold voltage is applied to an associated word line. In some embodiments, the sense module 680 includes a sense amplifier circuit. The sense module 680 may further include one or more bit line latches that are used to set a voltage condition on the connected bit line(s). For example, a predetermined state latched in bit line latch 682 may result in the connected bit line(s) being pulled to a program inhibit state (e.g., VDD). The inhibit voltage level (VDD) is provided by a voltage source input, which may be any type of voltage (or current) source. Although referred to herein as "bit line latches," in some contexts, it should be understood that such elements may be any type of sense data latches ("SDLs") that store control line biasing settings/information in accordance with embodiments of the present disclosure.

The common portion 690 of the sense block 675 comprises one or more processors 692, a set of data latches 694 and/or an input/output (I/O) interface 596 coupled between the set of data latches 694 and a data bus 620. The processor(s) 692 may be configured to perform various computations. For example, the processor(s) 692 may be configured to determine the data stored in the sensed memory cell, and store the determined data in the set of data latches 694. The set of data latches 694 may be used to store data bits determined by processor(s) 692 during a read operation. The data latches 694 may also be used to store data bits imported from the data bus 620 during a program operation. The imported data bits represent write data meant to be programmed into the memory. The I/O interface 696 provides an interface between data latches 694 and the data bus 620.

During read or sensing, the operation of the sense block 675 may be under the control of the state machine that controls the supply of different control gate voltages to the addressed cell. As the state machine steps through the various predefined control gate voltages corresponding to the various memory states supported by the memory, the sense module 680 may trip at one of these voltages and an output will be provided from sense module 680 to the processor(s) 692 via the bus 672. At that point, the processor(s) 692 may determine the resultant memory state by consideration of the tripping event(s) of the sense module and the information about the applied control gate voltage from the state machine via the input lines 693. It then computes a binary encoding for the memory state and stores the resultant data bits in the data latches 694. In some embodiments, the bit line latch 682 serves as a latch for latching the output of the sense module 680, and as a bit line latch as described above. The bit line latch 682 may be one of a plurality of bit line latches configured to store a plurality of bits of data indicating selected and unselected bit lines of a plurality of bit lines or other control lines.

During program or verify, the data to be programmed may be stored in the set of data latches 694 from the data bus 620. The program operation may be performed at least partially under the control of the state machine, and may comprise a series of programming voltage pulses (with increasing magnitudes) applied to the control gates of the addressed memory cells. When the bit line is not associated with a memory cell being programmed, prior to a programming pulse of a programming operation, the bit line may be charged to an inhibit voltage as part of a pre-charging stage, which is described in detail below, when a memory transistor such as M1 is placed in a program inhibit mode, the channel voltage is boosted to a high voltage.

Each programming pulse may be followed by a verify process to determine if the memory cell has been programmed to the desired state. The processor(s) 692 may monitor the verified memory state relative to the desired memory state. When the two are in agreement, the processor(s) 692 may set the bit line latch(es) 682 to cause the bit line(s) to be pulled to the program inhibit voltage level, as referenced above. This inhibits the cell coupled to the bit line from further programming even if it is subjected to programming pulses on its control gate. In some embodiments, the processor(s) 692 initially load the bit line latch 682 and the sense circuitry sets it to an inhibit value during the verify process. In one embodiment, the magnitude of the inhibit value depends on the location of the selected word line.

The data latch stack 694 may contain a stack of data latches corresponding to the sense module 680. In some embodiments, there are 3-5 (or another number) data latches per sense module. In some embodiments, the latches are each one bit. The data latches may be implemented as a shift register so that the parallel data stored therein is converted to serial data for the data bus 620, and vice versa. In one embodiment, all the data latches corresponding to the read/write block of M memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6D:
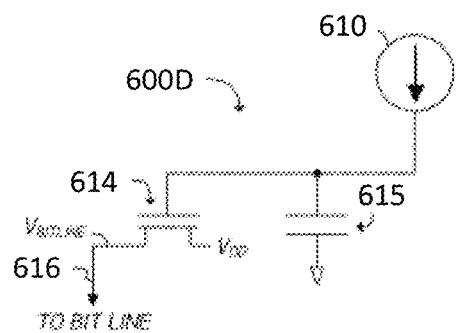
FIG. 6D illustrates is another example block diagram illustrates a schematic diagram of charge pump circuitry in accordance with one or more embodiments of the present disclosure.

FIG. 6D is a schematic diagram of charge pump circuitry 600D according to one or more embodiments. The circuitry 600D may be used in a sense amplifier. In certain embodiments, the circuit 600D may be used in connection with the sense circuitry 670 shown in FIG. 4 and described above. The circuit 600D may include a bit line clamp transistor 614 that is coupled to the bit line. Although a single transistor 614 is shown and described, it should be understood that the illustrated transistor 614 may represent a series-connected transistor stack in some embodiments. One terminal of the transistor 614 is connected to the supply voltage (also referred to herein as "VDD," and may also represent an inhibit voltage in certain configurations). VDD may be an externally- or internally-supplied voltage. In certain embodiments, the rate at which the transistor 54 provides the voltage VDD to the bit line depends on its gate voltage.

The circuit 600D may include one or more capacitors 615. For example, the capacitor(s) 615 may have one node coupled to the gate of the transistor 614 and the other node coupled to a ground reference. The circuit 600D may also comprise or be connected to a current supply 610, which may be variable in some embodiments. The current supply 610 may be coupled to the node of the capacitor(s) 615 that is coupled to the gate of the bit line clamp transistor 614. Therefore, the voltage provided to the gate of the transistor 614 may be controlled at least in part by charging capacitor(s) 615 using the current source 610.

The charge pump circuitry 600D may serve to facilitate or guarantee a constant current value provided to the associated bit line(s) on the path 616. For example, during a controlled-, or constant-current phase of a pre-charging stage for pre-charging the bit line to a target voltage, the charge pump circuitry may be used to provide a constant current to prevent unwanted current spikes when the bit line voltage ramps-up too quickly during the constant-current phase. In order to control the bit line voltage ramp-up rate, the gate bias on the transistor(s) 614 may be modulated by the current source 610. With a higher current from the current source 610, the gate of the transistor 614 bias ramps up faster, resulting in a faster ramp up of the bit line voltage. On the other hand, with a smaller current from the current source 610, the gate of transistor 614 bias ramps up more slowly, resulting in a slower ramp up of the bit line voltage. In some embodiments, a slower bit line charging rate can be achieved by reducing the current from the current source 610 to about ¾ of the full magnitude of the current source. Any percentage of the full magnitude may be used for the slower charge rate. Also, there may be any number of different charge rates.

Although the charge pump circuitry 600D is described herein in certain contexts as providing a charging current for a bit line/control line, it should be understood that the charge from circuitry 600D and/or other charge pumps or charged from circuitry described herein may be used for word line charging, or other control line charging. The term "charge pump circuitry" may generally refer to any type or configuration of circuitry and/or devices configured to provide control line charging/pre-charging in accordance with aspects of the present disclosure. The charge pump circuitry 600D may provide a means for charging a plurality of control lines to a target voltage and/or means for limiting a charging current from a voltage source to a managed current.

In a solid-state data storage system, different charge pumps may be utilized for word line and bit line charging, respectively. For example, the voltage source input (e.g., battery) used for various control line charging functionality may vary for bit line and word line. Furthermore, loading of such circuits may vary for a bit line and word line applications. For example, for certain word line charging applications, a charge pump may advantageously support 0 to 10 V, but may provide relatively lesser accuracy (e.g., 0.1 V step size accuracy, or the like), compared to a bit line charge pump. That is, relative to bit line charge pumps, a word line charge pump may represent a relatively strong pump with lesser accuracy. For bit line charge pumps, different pumps may be used for different stages of charging. For example, for pre-charging, the relevant target voltage may be around, for example, 3 V, whereas for read/verify stage charging, the voltage target may be less, such as around 0.5 V, which may not require as strong a pump, but may require greater accuracy (e.g., 0.01 V accuracy).

Figure 7A:
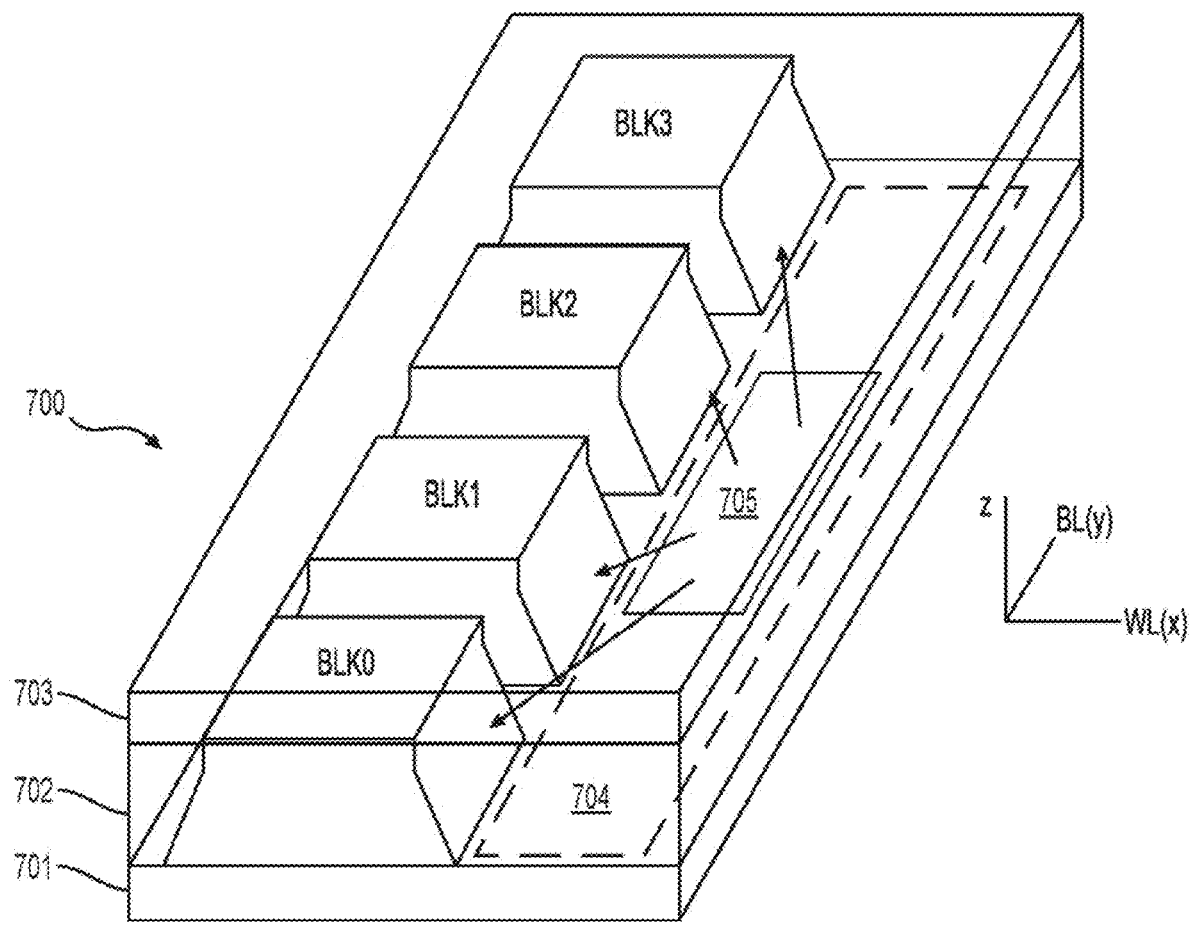
FIG. 7A illustrates a perspective view of a set of blocks in an example three-dimensional configuration of the memory array of FIG. 1.

FIG. 7A is a perspective view of a set of blocks 700 in an example three-dimensional configuration of the memory array 126 of FIG. 1. On the substrate are example blocks BLK0, BLK1, BLK2 and BLK3 of memory cells (storage elements) and a peripheral area 704 with circuitry for use by the blocks. For example, the circuitry can include voltage drivers 705 which can be connected to control gate layers of the blocks. In one approach, control gate layers at a common height in the blocks are commonly driven. The substrate 701 can also carry circuitry under the blocks, along with one or more lower metal layers which are patterned in conductive paths to carry signals of the circuitry. The blocks are formed in an intermediate region 702 of the memory device. In an upper region 703 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 7B:
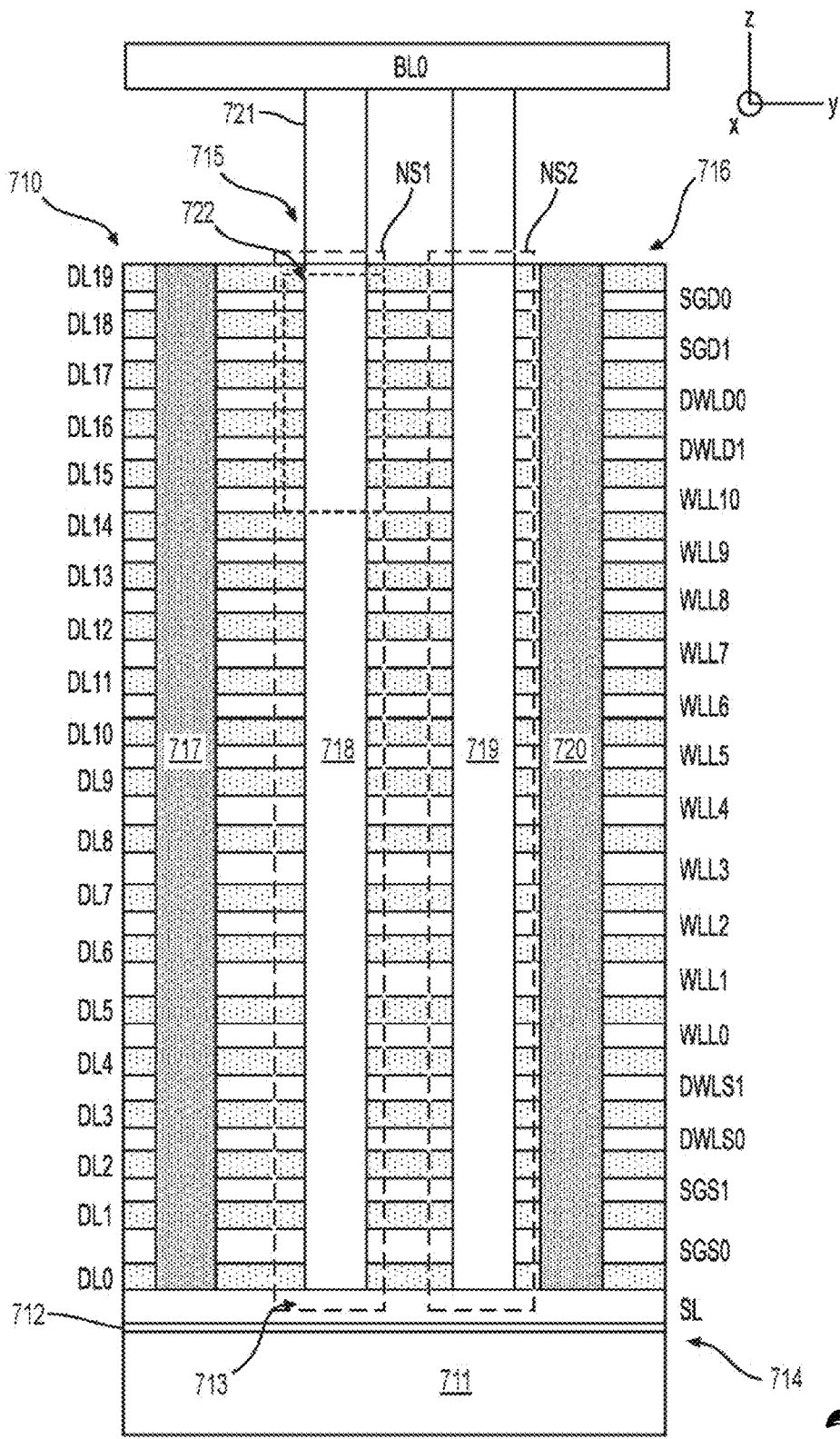
FIG. 7B illustrates an example cross-sectional view of a portion of one of the blocks of FIG. 7A.

FIG. 7B illustrates an example cross-sectional view of a portion of one of the blocks of FIG. 7A. The block comprises a stack 710 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are illustrated. Each NAND string encompasses a memory hole 718 or 719 which is filled with materials which form memory cells adjacent to the word lines. A region 722 of the stack is shown in greater detail in FIG. 7D.

The stack includes a substrate 711, an insulating film 712 on the substrate, and a portion of a source line SL. NS1 has a source-end 713 at a bottom 714 of the stack and a drain-end 715 at a top 716 of the stack. Contact line connectors (e.g., slits, such as metal-filled slits) 717 and 720 may be provided periodically across the stack as interconnects which extend through the stack, such as to connect the source line to a particular contact line above the stack. The contact line connectors may be used during the formation of the word lines and subsequently filled with metal. A portion of a bit line BL0 is also illustrated. A conductive via 721 connects the drain-end 715 to BL0.

Figure 7C:
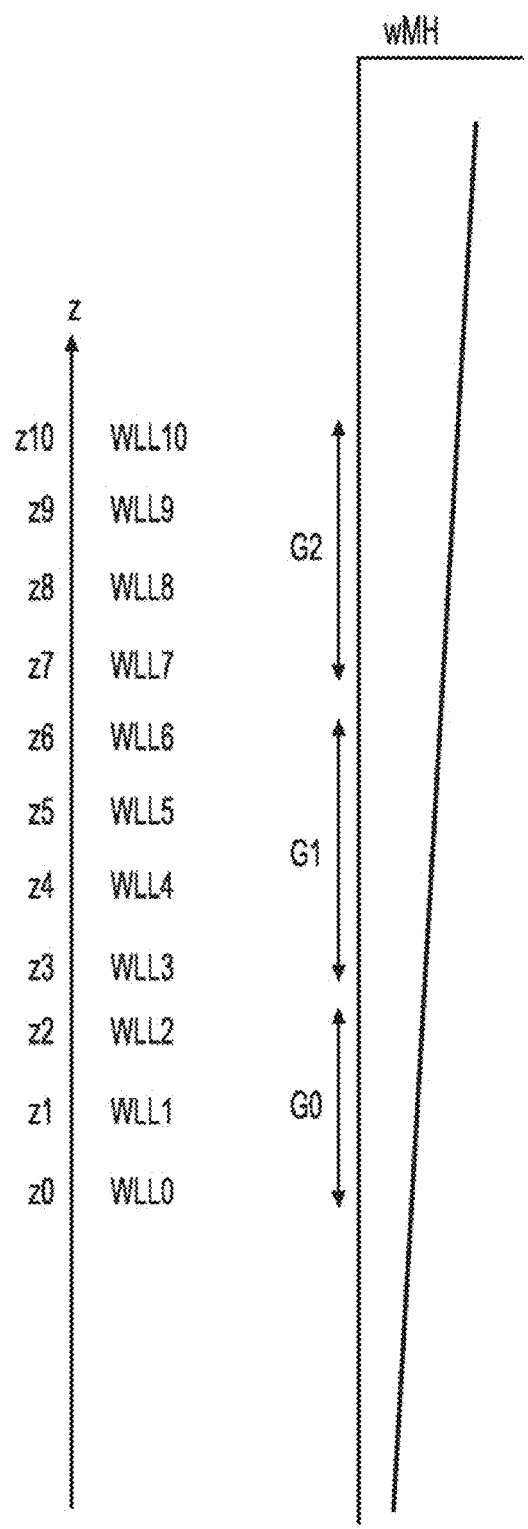
FIG. 7C illustrates a plot of memory hole diameter in the stack of FIG. 7B.

FIG. 7C illustrates a plot of memory hole diameter in the stack of FIG. 7B. The vertical axis is aligned with the stack of FIG. 7B and illustrates a width (wMH), e.g., diameter, of the memory holes 718 and 719. The word line layers WLL0-WLL10 of FIG. 7A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 7D:
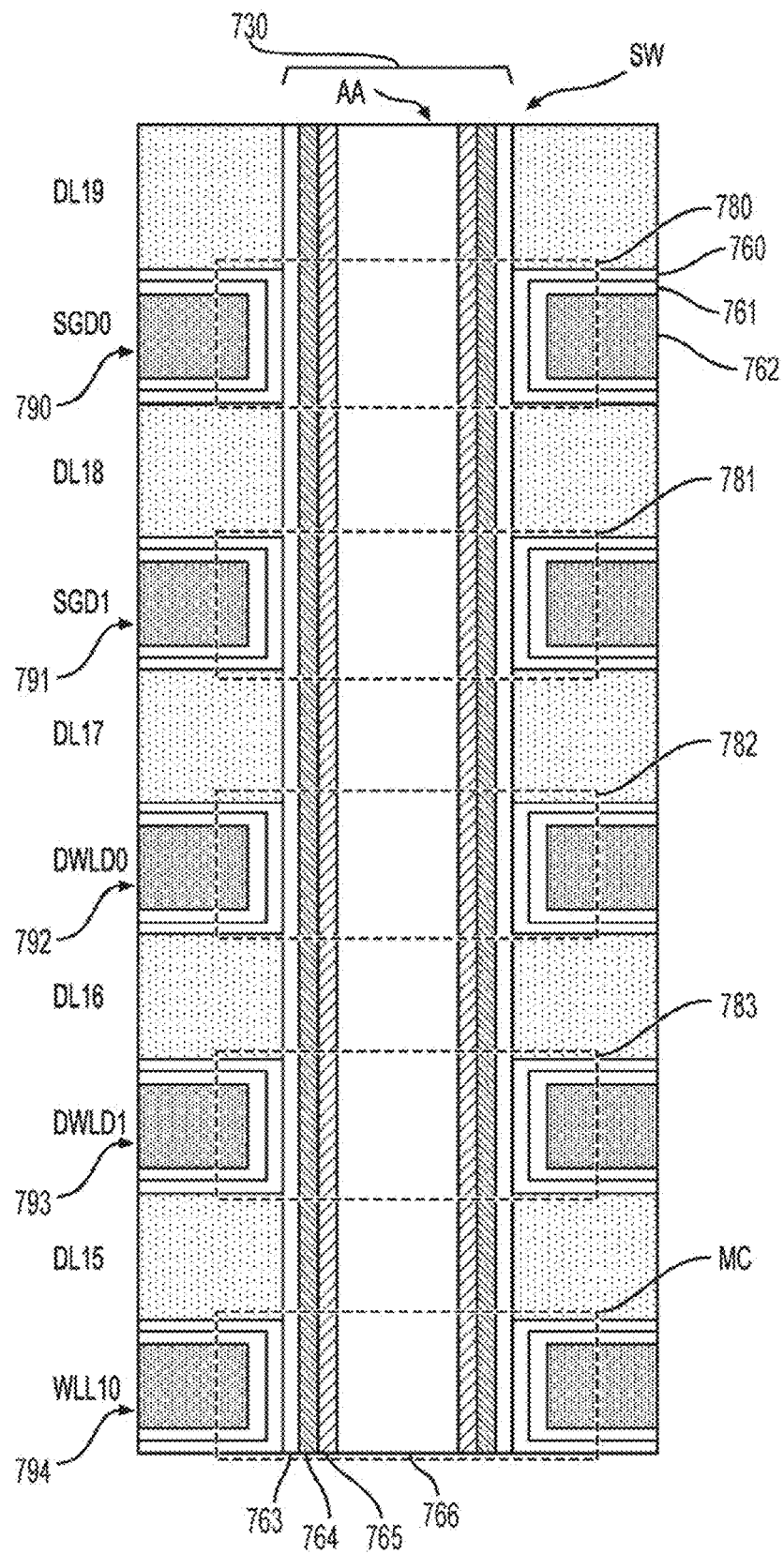
FIG. 7D illustrates a close-up view of the region 622 of the stack of FIG. 7B.

FIG. 7D illustrates a close-up view of the region 722 of the stack of FIG. 7B. Memory cells are formed at the different levels of the stack at the intersection of a word line layer and a memory hole. In this example, SGD transistors 780 and 781 are provided above dummy memory cells 782 and 783 and a data memory cell MC. A number of layers can be deposited along the sidewall (SW) of the memory hole 730 and/or within each word line layer, e.g., using atomic layer deposition. For example, each column (e.g., the pillar which is formed by the materials within a memory hole) can include a charge-trapping layer or film 763 such as SiN or other nitride, a tunneling layer 664, a polysilicon body or channel 765, and a dielectric core 766. A word line layer can include a blocking oxide/block high-k material 760, a metal barrier 761, and a conductive metal 762 such as Tungsten as a control gate. For example, control gates 790, 791, 792, 793 and 794 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 8A:
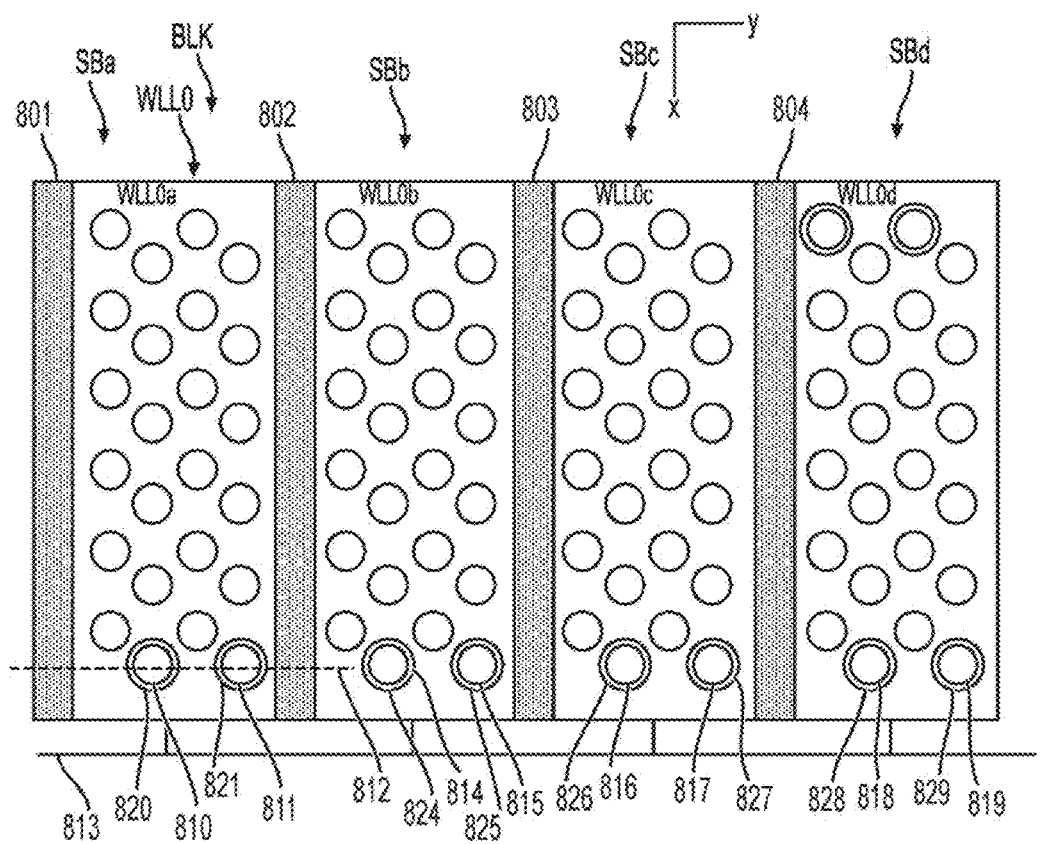
FIG. 8A illustrates a top view of an example word line layer WLL0 of the stack of FIG. 6B.

FIG. 8A illustrates a top view of an example word line layer WLL0 of the stack of FIG. 7B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 8B:
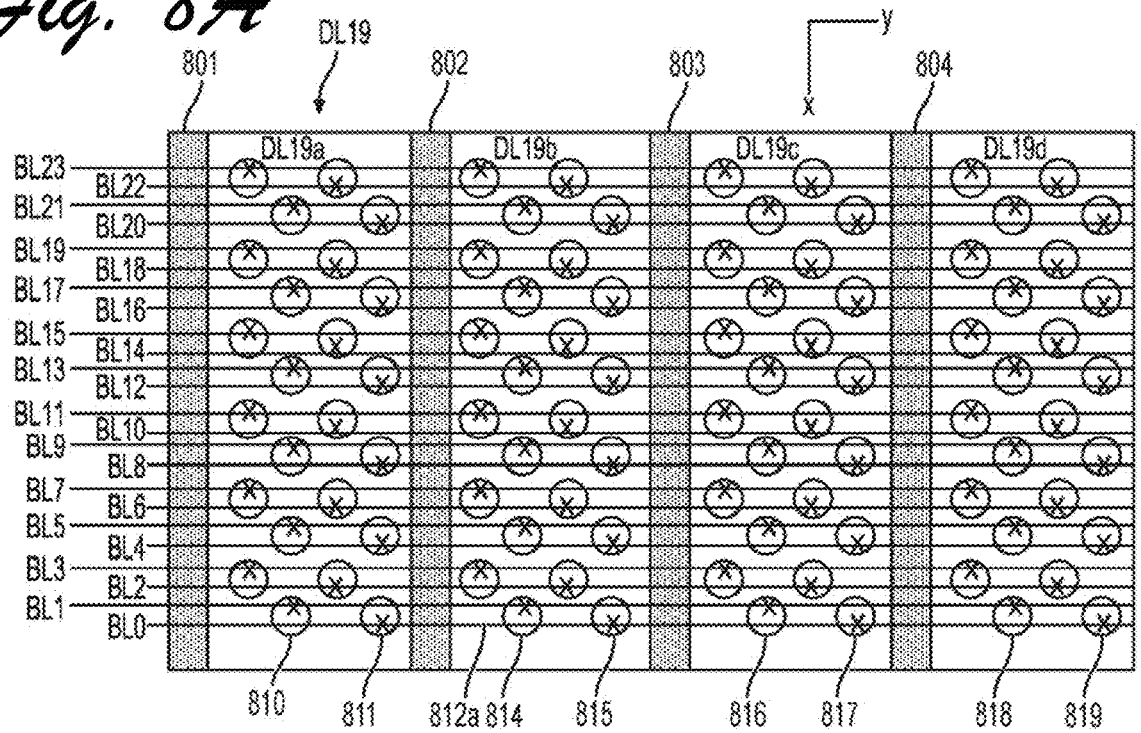
FIG. 8B illustrates a top view of an example top dielectric layer DL19 of the stack of FIG. 67B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0d which are each connected by a contact line 813. The last region of a word line layer in a block can be connected to a first region of a word line layer in a next block, in one approach. The contact line 813, in turn, is connected to a voltage driver for the word line layer. The region WLL0a has example memory holes 810 and 811 along a contact line 812. The region WLL0b has example memory holes 814 and 815. The region WLL0 c has example memory holes 816 and 817. The region WLL0d has example memory holes 818 and 819. The memory holes are also shown in FIG. 8B. Each memory hole can be part of a respective NAND string. For example, the memory holes 810, 814, 816 and 818 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820 and 821 are in WLL0a, memory cells 824 and 825 are in WLL0b, memory cells 826 and 827 are in WLL0c, and memory cells 828 and 829 are in WLL0d. These memory cells are at a common height in the stack.

Contact line connectors (e.g., slits, such as metal-filled slits) 801, 802, 803 and 804 may be located between and adjacent to the edges of the regions WLL0a-WLL0 d. The contact line connectors provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 9A for further details of the sub-blocks SBa-SBd of FIG. 8A.

FIG. 8B illustrates a top view of an example top dielectric layer DL19 of the stack of FIG. 7B. The dielectric layer is divided into regions DL19 a, DL19 b, DL19 c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 810 and 811 along a contact line 812a which is coincident with a bit line BL0. A number of bit lines extend above the memory holes and are connected to the memory holes as indicated by the "X" symbols. BL0 is connected to a set of memory holes which includes the memory holes 811, 815, 817 and 819. Another example bit line BL1 is connected to a set of memory holes which includes the memory holes 810, 814, 816 and 818. The contact line connectors (e.g., slits, such as metal-filled slits) 801, 802, 803 and 804 from FIG. 8A are also illustrated, as they extend vertically through the stack. The bit lines can be numbered in a sequence BL0-BL23 across the DL19 layer in the −x direction.

Different subsets of bit lines are connected to memory cells in different rows. For example, BL0, BL4, BL8, BL12, BL16, and BL20 are connected to memory cells in a first row of cells at the right hand edge of each region. BL2, BL6, BL10, BL14, BL18, and BL22 are connected to memory cells in an adjacent row of cells, adjacent to the first row at the right hand edge. BL3, BL7, BL11, BL15, BL19, and BL23 are connected to memory cells in a first row of cells at the left hand edge of each region. BL1, BL5, BL9, BL13, BL17, and BL21 are connected to memory cells in an adjacent row of memory cells, adjacent to the first row at the left hand edge.

Figure 9A:
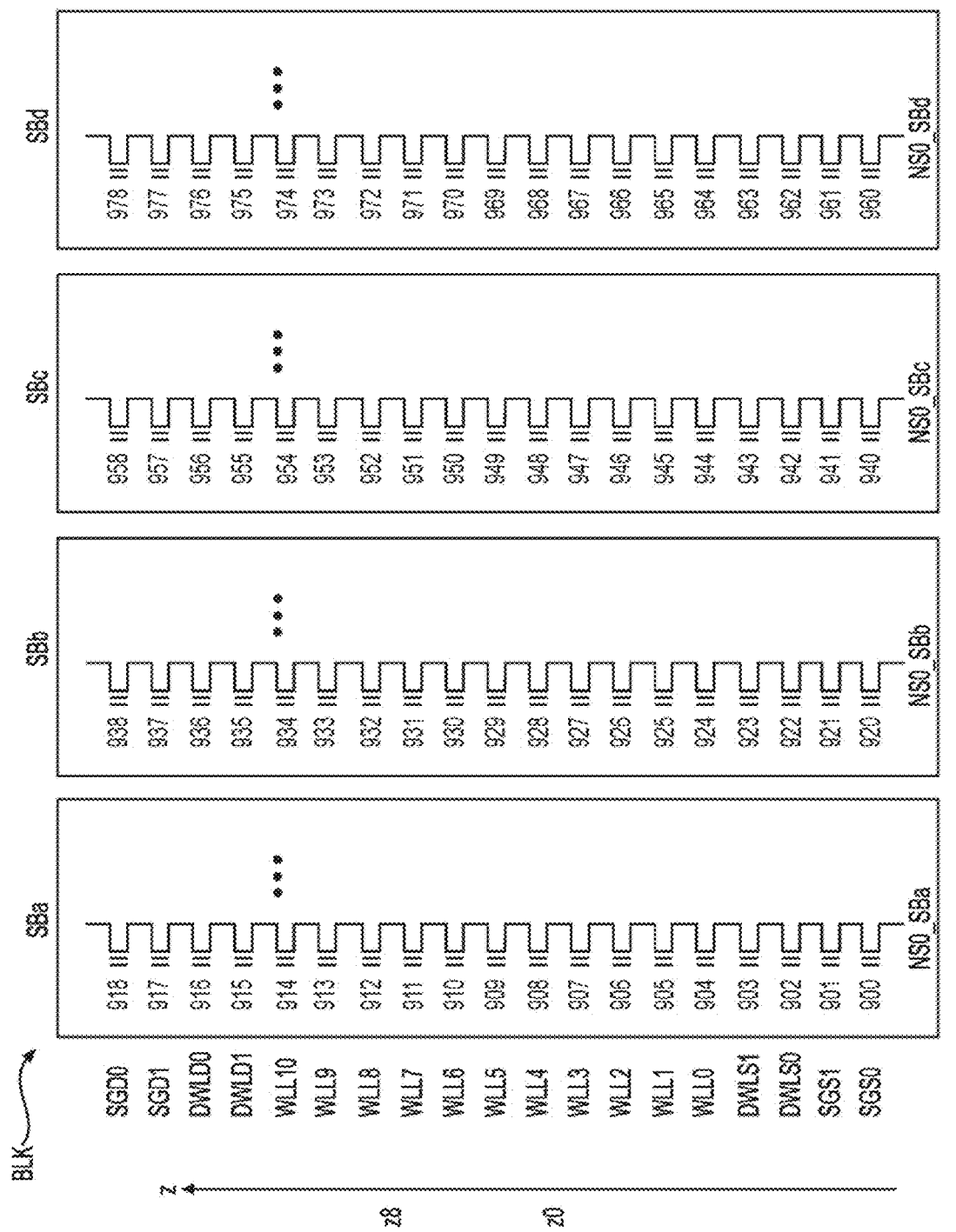
FIG. 9A illustrates example NAND strings in the sub-blocks SBa-SBd of FIG. 8A.

FIG. 9A illustrates example NAND strings in the sub-blocks SBa-SBe of FIG. 8A. The sub-blocks are consistent with the structure of FIG. 7B. The conductive layers in the stack are illustrated for reference at the left hand side. Each sub-block includes multiple NAND strings, where one example NAND string is illustrated. For example, SBa comprises an example NAND string NS0, SBb comprises an example NAND string NS1, SBc comprises an example NAND string NS2, SBd comprises an example NAND string NS3, and SBe comprises an example NAND string NS4.

Additionally, NS0_SBa include SGS transistors 900 and 901, dummy memory cells 902 and 903, data memory cells 904, 905, 906, 907, 908, 909, 910, 911, 912, 913 and 914, dummy memory cells 915 and 916, and SGD transistors 917 and 918.

NS1_SBb include SGS transistors 920 and 921, dummy memory cells 922 and 923, data memory cells 924, 925, 926, 927, 928, 929, 930, 931, 932, 933 and 934, dummy memory cells 935 and 936, and SGD transistors 937 and 938.

NS2_SBc include SGS transistors 940 and 941, dummy memory cells 942 and 843, data memory cells 944, 945, 946, 947, 948, 949, 950, 951, 952, 953 and 954, dummy memory cells 955 and 956, and SGD transistors 957 and 958.

NS3_SBd include SGS transistors 960 and 961, dummy memory cells 962 and 963, data memory cells 964, 965, 966, 967, 968, 969, 970, 971, 972, 973 and 974, dummy memory cells 975 and 976, and SGD transistors 977 and 978.

NS4_SBe include SGS transistors 980 and 981, dummy memory cells 982 and 983, data memory cells 984, 985, 986, 987, 988, 989, 980, 981, 982, 983 and 984, dummy memory cells 985 and 986, and SGD transistors 987 and 988.

At a given height in the block, memory cells in each sub-block are at a common height. For example, one set of memory cells (including the memory cell 904) is among a plurality of memory cells formed along tapered memory holes in a stack of alternating conductive and dielectric layers. The one set of memory cells is at a particular height z0 in the stack. Another set of memory cells (including the memory cell 924) connected to the one word line (WLL0) are also at the particular height. In another approach, another set of memory cells (e.g., including the memory cell 912) connected to another word line (e.g., WLL8) are at another height (z8) in the stack.

Figure 9B:
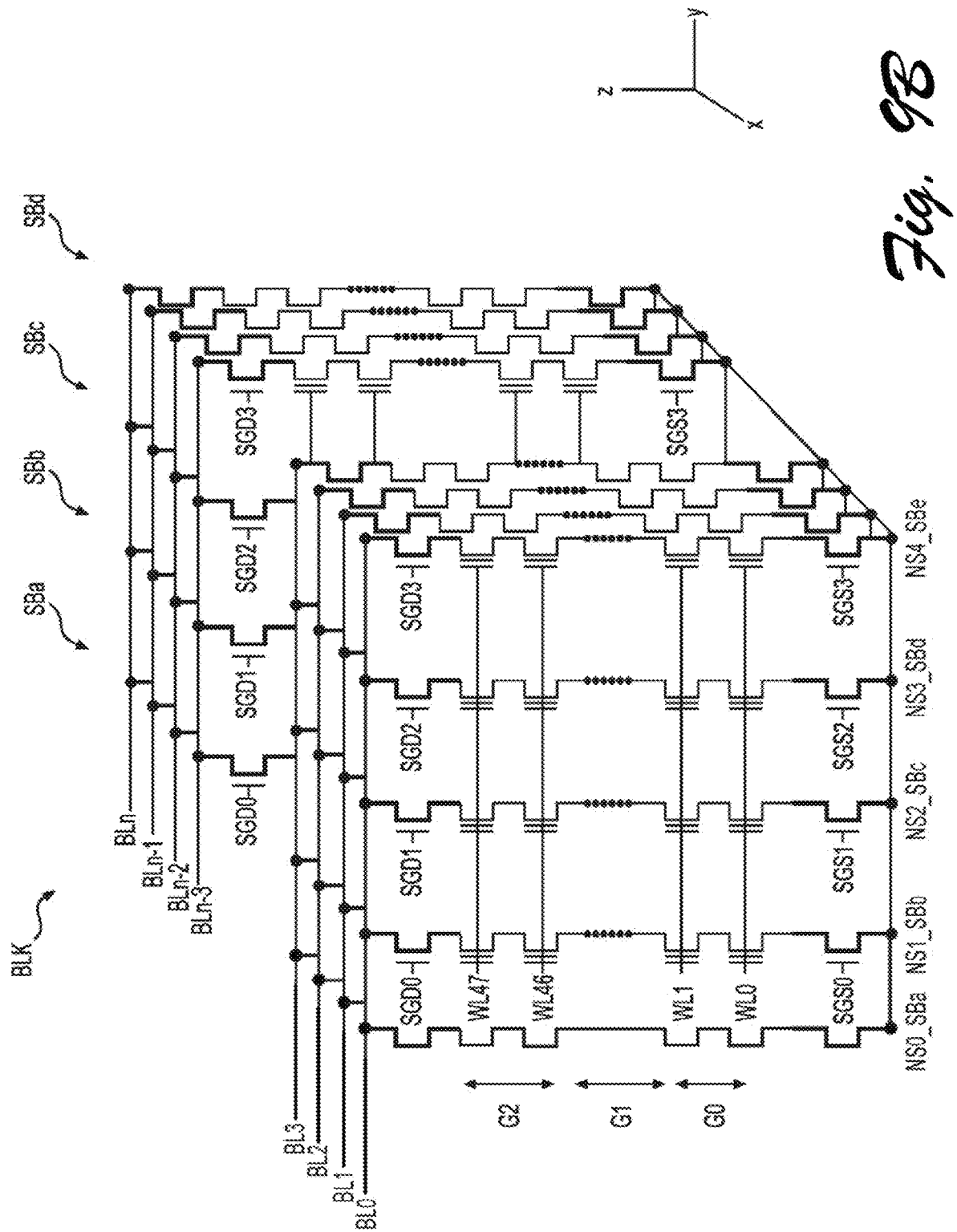
FIG. 9B illustrates another example view of NAND strings in sub-blocks.

FIG. 9B illustrates another example view of NAND strings in sub-blocks. The NAND strings include NS0_SBa, NS1_SBb, NS2_SBc, NS3_SBd, and NS4_SBe which have 48 word lines (e.g., WL0-WL47). Each sub-block comprises NAND string groups which extend in the x direction and which have a common SGD line, e.g., SGD0, SGD1, SGD2, SGD3, or SGD4. In this simplified example, there is only one SGD transistor and one SGS transistor in each NAND string. The NAND strings NS0_SBa, NS1_SBb, NS2_SBc, NS3_SBd, and NS4_SBe are in sub-blocks SBa, SBb, SBc, SBd, and SBe, respectively. Further, example, groups of word lines G0, G1 and G2 are illustrated.

Figure 10:
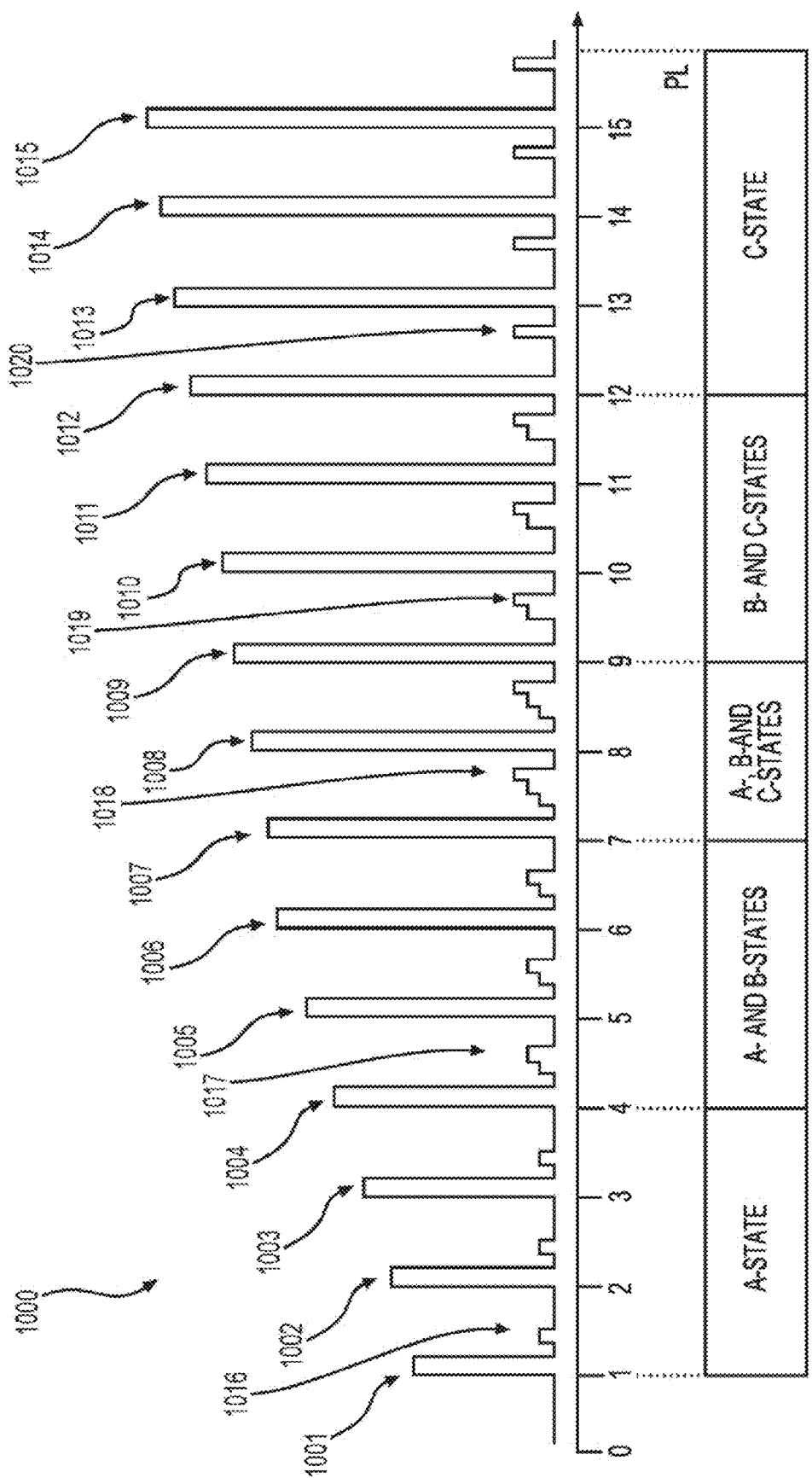
FIG. 10 illustrates a waveform of an example programming operation.

FIG. 10 illustrates a waveform of an example programming operation. The horizontal axis illustrates program loop numbers and the vertical axis illustrates program voltage values and program verify values. A program voltage (Vpgm) may include a word line voltage (WLVpgm) and/or a bit line voltage (BLVpgm). Generally, a programming operation may involve applying a pulse train to a selected word line, where the pulse train includes multiple program-verify (PV) iterations. The program portion of a PV iteration comprises the program voltage and the verify portion of the PV iteration comprises one or more verify voltages.

For each program voltage, a square waveform is illustrated for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming step in which the programming is completed. ISPP can also be used in each programming step of a multistep operation. Generally, a background approach to program flash memory cells using ISPP is described by Suh et al., "A 3.3V 32 Mb NAND Flash Memory with Incremental Step Pulse Programming Scheme" IEEE International Solid State Circuits Conference, 1995, page 128-130, the full disclosure of which is hereby incorporated by reference herein for all purposes. Implementations of the present disclosure that utilize ISPP add a number of important innovative improvements over the background approach of Suh et al., as further described herein.

A pulse train typically includes program voltages which increase stepwise in amplitude in each program-verify iteration using a voltage bias (dVpgm). The voltage bias may, for example, be a word line voltage bias. A new pulse train may be applied in each programming step of a multistep program-verify operation, starting at an initial program voltage (e.g., an initial Vpgm) and ending at a final program voltage (e.g., a final Vpgm) which does not exceed a threshold voltage Vth (e.g., a maximum allowed value). The initial program voltages can be the same or different in different programming steps. The final program voltages can also be the same or different in different programming steps. The voltage biases may be the same or different in the different programming steps. In some cases, a smaller voltage bias is used in a final programming step to reduce Vth distribution widths.

The pulse train 1000 includes a series of program voltages 1001, 1002, 1003, 1004, 1005, 1006, 1007, 1008, 1009, 1010, 1011, 1012, 1013, 1014, and 1015 that are applied to a word line selected for programming, and an associated set of non-volatile memory cells. In the example shown, one, two, or three verify voltages are provided after each program voltage, for example, based on a number of target data states which are being verified. The number of target data states being verified may, for example, correspond to a number of memory cells associated with the word line. A program voltage and corresponding verify voltage can be separated by applying 0 V to the selected word line between the program voltage and the verify voltage.

In the example shown, an A-state verify voltage of VvA (e.g., waveform or programming signal 1016) may be applied after each of the first, second, and third program voltages 1001, 1002, and 1003, respectively. A- and B-state verify voltages of VvA and VvB (e.g., programming signal 1017) may be applied after each of the fourth, fifth and sixth program voltages 1004, 1005 and 1006, respectively. A-, B- and C-state verify voltages of VvA, VvB, and VvC (e.g., programming signal 1018) may be applied after each of the seventh and eighth program voltages 1007 and 1008, respectively. B- and C-state verify voltages of VvB and VvC (e.g., programming signal 1019) may be applied after each of the ninth, tenth and eleventh program voltages 1009, 1010, and 1011, respectively. Finally, a C-state verify voltage of VvC (e.g., programming signal 1020) may be applied after each of the twelfth, thirteenth, fourteenth and fifteenth program voltages 1012, 1013, 1014, and 1015, respectively.

In some embodiments, the memory device 100 (e.g., using the state machine 112 of the control circuitry 110, the controller 122, and/or the control circuit 150) may use different program voltages and/or different program voltage biases along with controlled rise/fall or clamped voltages to perform the verify operation. In some embodiments, a program voltage and a program voltage bias used to perform the programming operation may include a word line voltage and a word line voltage bias, respectively. Additionally, or alternatively, the program voltage and the program voltage bias used to perform the programming operation may include a bit line voltage and a bit line voltage bias, respectively.

Figure 11A:
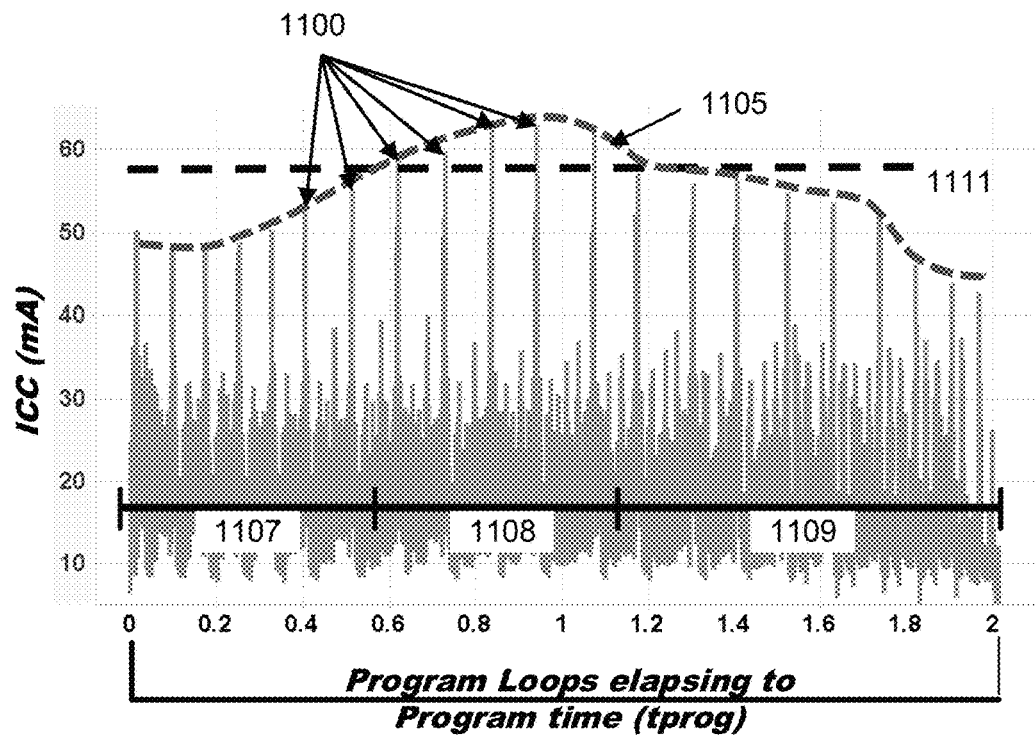
FIG. 11A illustrates a graph showing an exemplary current profile over a plurality of programming loops for a solid-state memory programming operation.

FIG. 11A is a graph illustrating an exemplary current profile over a plurality of programming loops for a solid-state memory programming operation. The figure shows measured peak ICC current for multiple programming loops/cycles (as used herein, "programming loops" and "programming cycles" are deemed interchangeable) that were discussed generally in FIG. 10, with the bottom axis reflecting the total time to completely program the selected cells of the memory device through multiple programming cycles (the time for this programming operation may alternately be referred to as "tprog"). According to certain solid-state programming schemes, as described above, memory cells are progressively programmed from an erase state to a final desired state (e.g., states A, B, C, etc.). The charge state of a memory cell being progressively programmed may be increased progressively over a plurality of programming loops/cycles until the final desired charge state is reached (generally, at time "tprog"). Once the final programming charge state for a particular memory cell has been reached, the bit line associated with that particular memory cell may be locked-out by applying an inhibit voltage/bias level thereto. As explained in more detail below, the most prominent ICC current peaks occur during phases of programming where bit lines that are to be placed under an inhibit voltage/bias are being charged to the desired inhibit level ($V_{INHIBIT}$ or $V_{DDSA}$, depending on nomenclature). The "inhibit voltage level" may correspond to a voltage level that is sufficiently high to counteract the effect of programming voltage pulses applied to storage elements associated with a respective control line (e.g. a word line).

As shown in FIG. 11A, the peak ICC current levels (for example, those identified by reference numeral 1100) from a plurality of programming loops over the programming period tprog form a peak current envelope 1105 envelope level, reaching a highest state during a middle section of tprog. This change in peak current ICC levels over the plurality of programming loops is related to varying capacitance upon the bit lines being placed in program or inhibit mode. Generally, these ICC peaks can grouped into a beginning section 1107 where the peaks are higher but do not usually exceed a predetermined threshold (the illustrated horizontal line 1111), a middle section 1108 where ICC peaks may likely exceed a predetermined threshold 1111, or an ending section 1109, where ICC peaks descend and generally remain below predetermined threshold 1111.

Figure 11B:
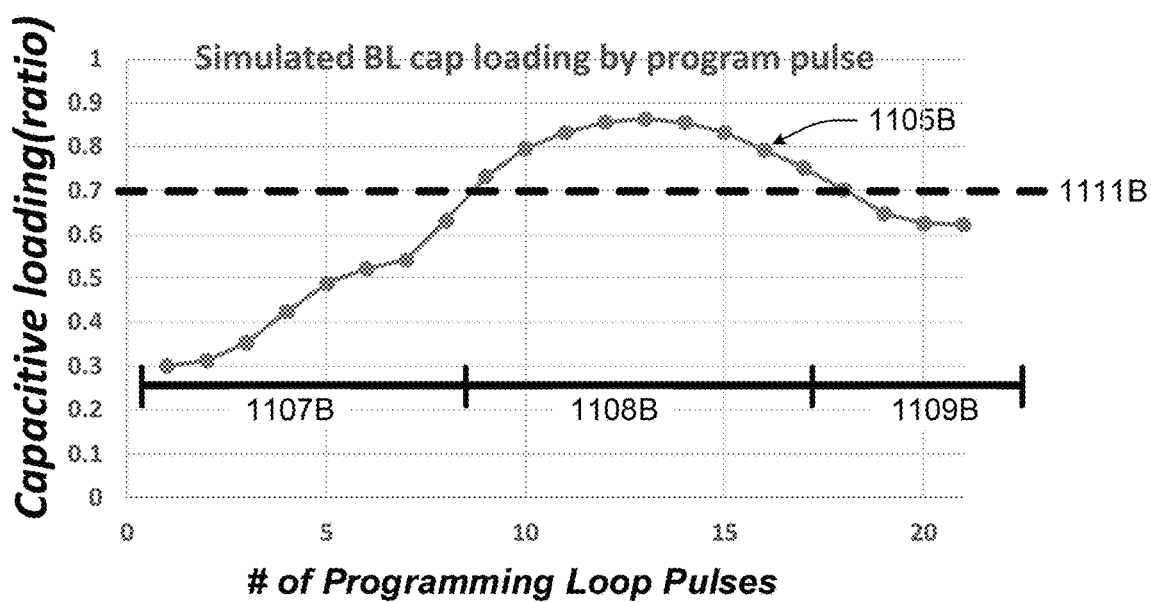
FIG. 11B illustrates a graph showing simulated bit line/control line loading capacitance plotted by program loops.

The causes for the shape of the peak envelope 1105 are related to several factors including capacitance of bit lines being charged to an inhibit state. Referring to FIG. 11B, if simulated bit line loading capacitance is plotted by program loops, a similar shape to the characteristic shape seen for peak ICC curve 1105 may also be seen in varying bit line capacitances shown over the programming in the profile 1105B. As mentioned previously, large peak ICC values may cause storage device malfunctions, particularly those over a predetermined level such as the one shown at 1107 in FIG. 11A, and aspects of the present disclosure seek to reduce the peak ICC, particularly in the middle high-ICC section 1108. Capacitance affecting bit lines/control lines is discussed in more detail below, especially in regard to FIGS. 14B-D.

Figure 11C:
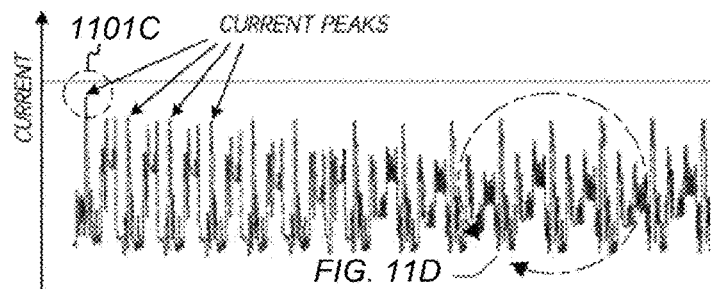
FIG. 11C illustrates a current profile for a programming operation in accordance with one or more aspects of the present disclosure.
Figure 11D:
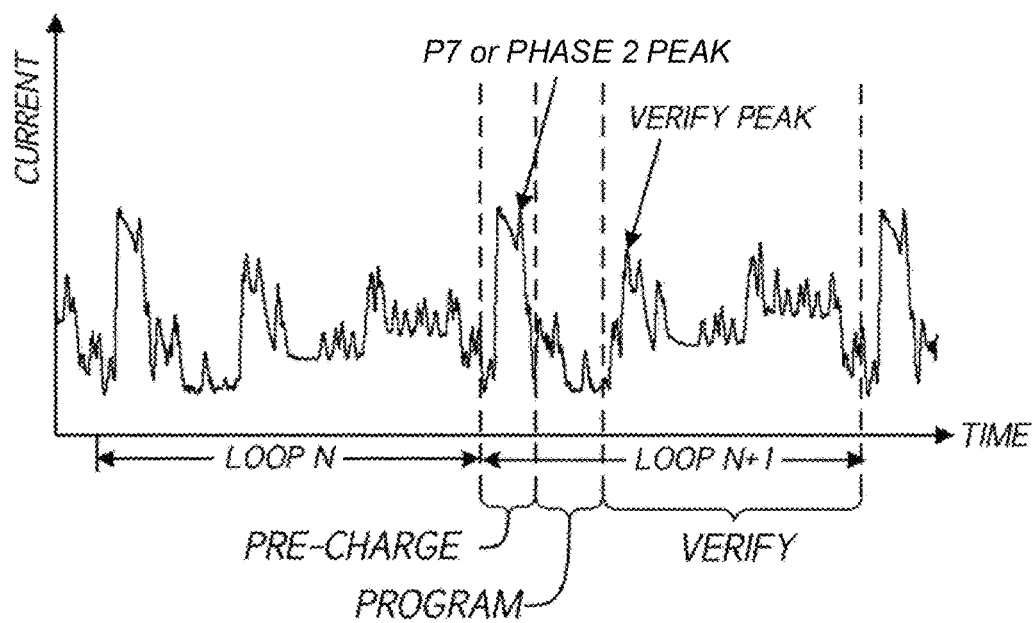
FIG. 11D illustrates a segment view of the graph of FIG. 11C including a subset of the programming loops of the programming operation shown in FIG. 11C, showing a relationship between current peaks and programming stages for a memory device of the present disclosure.

FIGS. 11C and 11D illustrate a relationship between current peaks and programming stages for a memory device, with individual programming loops and stages within the individual loops illustrated along with occurrences of peak ICC. FIG. 11C provides a graph similar in format to FIG. 11D, illustrating an exemplary current profile over a plurality of programming loops for a solid-state memory programming operation in accordance with one or more embodiments. For example, the profile shown in FIG. 11C may correspond to a programming operation in a 3-D NAND memory chip comprising, for example, up to 96 layers or more, and configured to implement multi-level cell (MLC), triple-level cell (TLC), and/or quad-level cell (QLC) programming architectures.

FIG. 11D illustrates a segment of the graph of FIG. 11C, wherein the segment of FIG. 11D includes a subset of the programming loops of the relevant programming operation. The graphs of FIGS. 11C and 11D illustrate three distinct stages, or periods, within individual programming loops, these programming loops illustrated in exemplary manner as two loops "Loop N" and "Loop N+1" of FIG. 11D, including a pre-charging stage, a programming pulse stage, and a verify stage, each of which are identified in FIG. 11D. Each stage may be further divided into more granular stages, as described below. In some implementations, during the programming pulse stage, a relatively high voltage (e.g., 20 V) may be applied to program the memory cells. During first and second phases of the pre-charging stage, and during the verify stage, certain current peaks may occur, as illustrated. Generally, the peaks that have the greatest impact on peak current consumption for the memory array and/or device may occur during the pre-charging stage, while lesser peaks may occur during the verify stage. By reducing or controlling the current peaks in the pre-charging and/or verify stages, peak current consumption for the data storage device may be managed or suppressed. As explained in more detail below, embodiments of the present disclosure provide approaches to reduce the current peaks in the pre-charge stages, and alternative approaches to current peak reduction are provided for later stages such as in a program recovery stage or a read/verify stage.

For a given programming operation, as shown for the programming operation illustrated in the graph of FIG. 11C, the pre-charging stage of the first programming loop of the programming operation may be associated with a peak current 1101C that represents a highest peak current of the programming stage within a loop. As described in detail above, the pre-charging stage of a programming loop comprises a first phase ("Phase 1", also seen in FIGS. 12A &

12B) associated with a timing clock during which a constant current is used to charge-up control lines (e.g., bit lines) to a target voltage level, which may be a percentage or portion of the inhibit voltage level (e.g., 70-90% of the inhibit voltage level, as set by determining a loop-dependent programming adjustment parameter such as $V_{HSATGT}$).

Figure 12A:
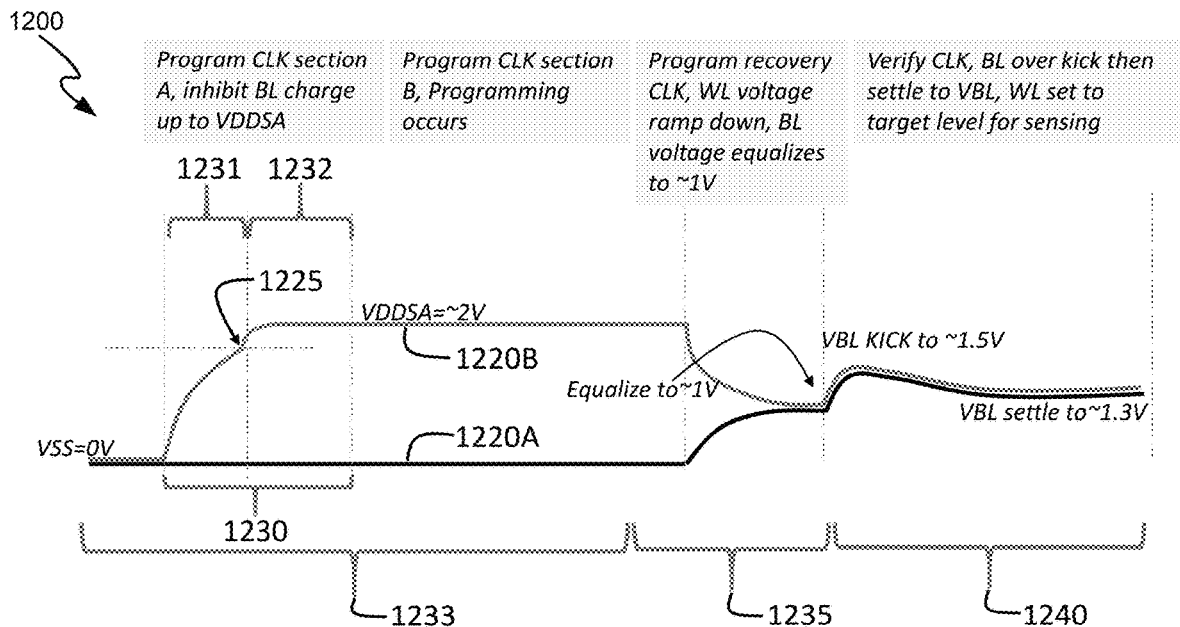
FIGS. 12A and 12B provide additional detail of voltage level transitions within a selected portion of a programming loop.
Figure 12B:
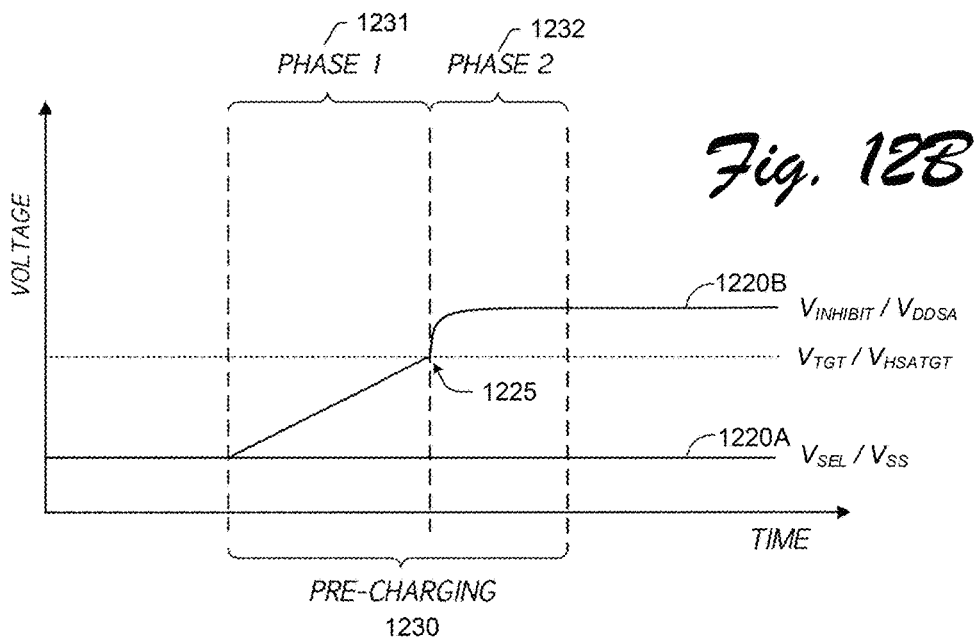

FIGS. 12A and 12B provide detail of voltage level transitions of memory circuit signals that are operating within a selected portion of a programming loop. FIG. 12A shows a portion of a programming loop 1200 for a particular collection of cells to be programmed, e.g. a page of cells in the storage device section of a memory array of a storage device. The voltage states of a bit line/control line is shown at 1220B for a bit line to be charged to an inhibit voltage state ($V_{INHIBIT}/V_{DDSA}$), and 1220A for a bit line to be configured into a program state ($V_{SEL}/V_{SS}$). Several stages of the illustrated program lop section 1200 are shown, including a program stage 1233, a pre-charge stage 1230, a first pre-charge phase 1231 of the pre-charge stage 1230, a second pre-charge phase 1232 of the pre-charge stage 1230, a program recovery stage 1235, and a read/verify stage 1240. For additional clarity, FIG. 12B provides an alternative view showing phase 1 and phase 2 (1231, 1232, respectively) of the pre-charge stage 1230 of a bit line 1220B to be charged into an inhibit state, and a bit line 1220A to be charged into a program state.

Each of the ICC current "spikes" shown in FIG. 11A (such as those shown at 1100) occurs in the vicinity of the inflection point/quick ramp up of the inhibit bit line voltage to $V_{DDSA}$ beginning (at the bit line charging point approximately 1225, and peaking at about P7, or the end of the first phase 1231 of the pre-charge stage 1230). More particularly, in view of FIGS. 11C-D and 12A-B, the first phase 1231 of the pre-charging stage 1230 may be considered a "constant-current phase," in that the current supplied to the relevant control line (i.e. a bit line that is to be placed in an inhibit state) may maintain a constant value over at least a portion of the first phase, and this constant value may be regulated through a parameter such as $V_{HSASLOWP}$. $V_{HSASLOWP}$, for example in the range of about 20-30 mA, provides a bit line pre-charge current control (per plane) in program/soft program modes (that is, provides for peak current control). Furthermore, the first phase of the pre-charging state may be referred to as a "managed-current phase," or a "regulated-current phase," in the sense that the current may be managed or regulated by certain control circuitry to achieve a desired charge level up to the threshold point determined by a $V_{HSATGT}$ setting. "Managed current," "managed charging current," "regulated current," and "regulated charging current" are used herein respectively according to their broad and ordinary meanings, and generally refer to current flow that is managed or regulated in some manner. Generally, as the current is managed during the first phase of the pre-charging stage, ICC spikes are not of concern during this phase of the program loop.

Once a bit line 1231 has reached a predetermined threshold during bit line/control line charge-up (such as when a threshold voltage such line reaches 1225 a predetermined threshold represented by $V_{HSATGT}$), a second phase 1232 of the pre-charge stage 1230 is entered. During the second phase 1232 of the pre-charging process, unlimited current may be allowed to relatively rapidly charge up the desired control line(s) (e.g., bit line(s)). Such phase may be referred to herein as the "unregulated" or "unmanaged" current phase. The terms "unregulated charging current," "unregulated current," "unmanaged charging current," and "unmanaged current" are used herein according to their broad and ordinary meanings, and generally refer to charging current, such as for charging a control line/bit line, that is not substantially managed or regulated. While allowing the remaining charging of the control line/bit line to occur in an unregulated manner minimizes the amount of time necessary to reach a predetermined level such as $V_{DDSA}$ (or alternatively, $V_{INHIBIT}$), the penalty that ensues is a high ICC current spike arising from the rapid charging that ensues. Logically, one approach to control this current may be to change (or increase) the threshold voltage (e.g. $V_{HSATGT}$, or $V_{TGT}$) that the control system utilizes to modify the charging of the control line/bit line from a regulated current to an unregulated current, thus reducing the amount of unregulated/fast charging that occurs in the second phase of the pre-charging stage of the program loop. However, raising the $V_{HSATGT}/V_{TGT}$ threshold increases the amount of time the program loop requires to complete the pre-charge phase, and thus negatively impacts the overall operating speed of the memory device.

FIGS. 12A and 12B may be seen to illustrate pre-charging voltage applied to a control line, such as a bit line, in accordance with one or more embodiments. The terms "control line pre-charging," "control line pre-charging stage," and "pre-charging" are used herein according to their broad and ordinary meanings, and may refer in certain contexts to a process for driving a voltage/charge level of a control line (e.g., bit line) to a target voltage level (e.g., inhibit voltage level, desired programming bias, or other voltage). Control line pre-charging may serve to inhibit programming for associated storage element(s), or promote faster read/write operations, depending on the application. The graph of FIG. 12B shows voltage levels for two types of control lines: (1) a "selected" control line 1220B, which may generally refer to a bit line that is selected for programming or memory cells on this bit line are currently being programmed; and (2) an "unselected," or "inhibited," control line (e.g., bit line) 1220A, which may generally refer to a bit line one which memory cells are not currently being programmed, or is currently, or intended to be, pre-charged to an inhibit voltage or other target voltage level. The control line 1220A, as shown, may be maintained at a ground reference voltage level $V_{SEL}$ or $V_{SS}$ throughout the pre-charging stage time period 1230, whereas the unselected control line 1220B may start at the ground reference voltage $V_{SEL}$ or $V_{SS}$, and rise to a higher voltage level during the pre-charging time period, such as an inhibit voltage $V_{INHIBIT}$, also called $V_{DDSA}$. The "inhibit voltage level" may correspond to a voltage level that is sufficiently high to counteract the effect of programming voltage pulses applied to storage elements associated with a respective control line (e.g. a word line).

As shown in FIGS. 12A-12B, the pre-charging process for a control line, such as a bit line, may involve multiple phases. For example, a first phase ("Phase 1") 1231 may be associated with constant-current control line charging. Constant-current control line charging limits or controls the current draw through the line during pre-charging. By limiting or controlling the current draw through the control line initially during pre-charging, the current spikes occurring during the initial phase of pre-charging can be reduced. However, because the current draw is limited, the amount of time required for the control line to be charge to the desired bias level may be greater than if charging is unlimited or uncontrolled. During the first phase, a regulated or controlled current may be used to charge the control line 1220B. During Phase 1, by managing constant-current charging, high current consumption is mitigated.

During Phase 1, the control line 1220B may be charged to a target voltage level $V_{TGT}/V_{HSATGT}$. The charging of the control line 1220B to the target voltage level $V_{TGT}/V_{HSATGT}$ may take place over a period of time that spans the duration Phase 1. The term "period of time" is used herein according to its broad and ordinary meaning, and may refer to any temporal duration or period associated with one or more phases of a pre-charging process. The charge pump circuitry associated with the graph of FIGS. 12A and 12B may be configured to limit the charging current during Phase 1 and/or make the charging current constant, such that the first phase may be considered a constant-current pre-charging phase. In Phase 1, for example, the current on the control line 1220B may be limited to approximately 40 mA, which may help control or prevent relatively high current spiking during the first phase of pre-charging. By controlling the ramp-up rate of the control line 1220B during Phase 1, the peak current consumption may be decreased or controlled at the expense of requiring additional time to reach the voltage target level $V_{TGT}/V_{HSATGT}$.

Once the control line has reached the target threshold voltage level $V_{TGT}/V_{HSATGT}$, a second phase ("Phase 2") of the pre-charging process illustrated in FIG. 12B may involve charging the control line 1220B without controlling or regulating the current provided to the control line. That is, while in Phase 1, a controlled or regulated current level may be ensured, in Phase 2, no such regulation or control may be implemented on the current from the voltage source (e.g., the inhibit) to the control line.

During Phase 2, after point 1225, the current provided to the control line 1220B may be considered a free current, in that the current is not limited, or regulated or controlled any manner. Therefore, the current on the control line 1220B may be as high as possible based on the voltage differential between the voltage source and the control line and the impedance associated with the charge path. During Phase 2, relatively high peak current consumption may be experienced due at least in part to control-line-to-control-line (e.g., bit-line-to-bit-line) capacitive coupling, and results in a large peak ICC as shown, for example, at 1100 in FIG. 11A.

Some implementations of the present disclosure provide for reduction in peak current consumption during Phase 1 and/or Phase 2 of the pre-charging process. The degree to which the peak current consumption is reduced or controlled may be determined and/or managed by controlling a delay between the beginning of Phase 1 and the beginning of Phase 2. Additionally or alternatively, the degree to which the peak current is reduced may be controlled at least in part by manipulating the voltage target level $V_{TGT}/V_{HSATGT}$, such as by increasing the voltage target level $V_{TGT}/V_{HSATGT}$ to thereby elongate the period of time associated with Phase 1.

Although the terms $V_{INHIBIT}/V_{DDSA}$ are used in FIG. 12B and the associated description, it should be understood that the voltage level to which a control line is charged during pre-charging may be any bias level, such as a read voltage level, or the like. In embodiments in which the control line 1220B is a word line, wherein pre-charging of the word line is implemented in connection with a voltage read operation, Phase 1 may involve ramping the word line voltage from approximately 0 V to the reading voltage associated with unselected word lines. For example, the reading voltage may be approximately 6-8 V, which may consume current. Therefore, Phase 1 may serve to provide current control to limit the peak current.

Prior techniques to control peak ICC have not addressed modification of the threshold point 1225 per program loop. As discussed above in regards to FIGS. 11A-11B, peak current varies by programming loop as capacitance on control lines/bit lines varies. The magnitude of the peak ICC in phase 2 (1232) of the pre-charge phase (1230) (or shown near P7 in FIG. 12A) is strongly loop dependent, due to bit line capacitive loading that varies with the number of bit lines charged to inhibit mode in a plurality of memory cells that to which a programming pulse is to be applied. Therefore it is difficult to set a single regulated charging current transition point (1225) to unregulated current (and, accordingly a single $V_{HSATGT}$ level) to provide a "sweet spot" point to optimize both peak ICC and tprog in all loops during a tprog programming cycle.

The peak ICC of the second phase 1232 of the pre-charge stage 1230 of a program loop can be partially controlled by proper selection of the threshold voltage of the bit line 1220B where regulated charging current is switched to unregulated charging current; in various embodiments of the present disclosure, modification of this voltage threshold may be accomplished through methods incorporating a selected threshold voltage detection parameter $V_{HSATGT}$ in a manner that is loop dependent, or more particularly, bit-line capacitance-dependent. If this detection level set to a higher range, peak ICC will be reduced but tprog will increase. On the other hand, if this detection level parameter is set to a lower value, peak ICC will be high but tprog will be reduced, as the following figures show.

Figure 13A:
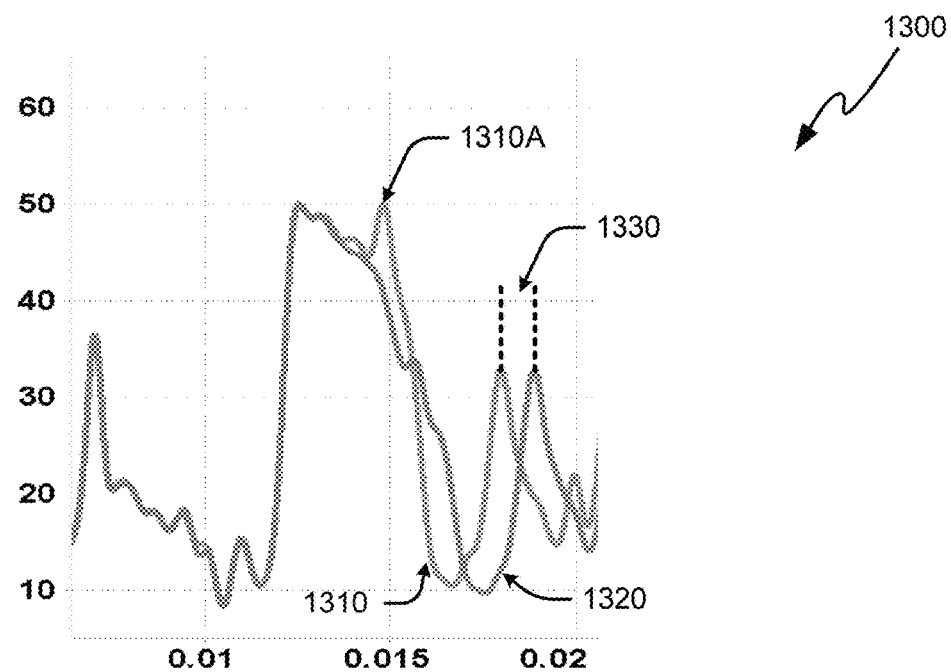
FIG. 13A shows a close-in ICC current profile view of a portion of a programming loop, particularly a portion of a loop either early in the programming cycle.

FIG. 13A shows a close-in ICC current profile view 1300 of a portion of a programming loop, particularly a portion of a loop either early in the programming process of the tprog cycle (such as during a beginning section (FIG. 11A, 1107)), or late in the programming cycle (such as during ending section FIG. A, 1109)). Two versions of ICC output current (1310, 1320) are superimposed to show outputs where in a first case corresponding to the first current profile 1310, a lower threshold detect level $V_{TGT}/V_{HSATGT}$, was utilized, for example at 70.6% of $V_{DDSA}$, and it can be seen that while a minor current spike 1310A occurred for current profile 1310, the current is still well controlled. Raising the threshold detect level $V_{TGT}/V_{HSATGT}$ to a higher amount, for instance 88.2% of $V_{DDSA}$, resulted in a current profile 1320 that had lower ICC output late in the phase 1 period, although with a delay 1330 that resulted from the longer time for later transition time for inhibited bit to change over from regulated charging current to unregulated (fast) charging current. Given that the late peak 1310 corresponding to the lower threshold detect voltage scenario resulting in current prOfle 1310, the reduced programming time from the lower threshold detect level $V_{TGT}/V_{HSATGT}$ is warranted over the higher threshold detect level threshold detect level $V_{TGT}/V_{HSATGT}$ resulting in current profile 1320. As mentioned elsewhere, the relatively modest rise in the ICC for the case where the threshold detect level is set to a lower value arises from loop operation within the beginning or end section ((FIG. 11B, 1107B, 1109B, respectively)), where bit line capacitances are lower than the middle section (FIG. 11B, 1108B)).

Figure 13B:
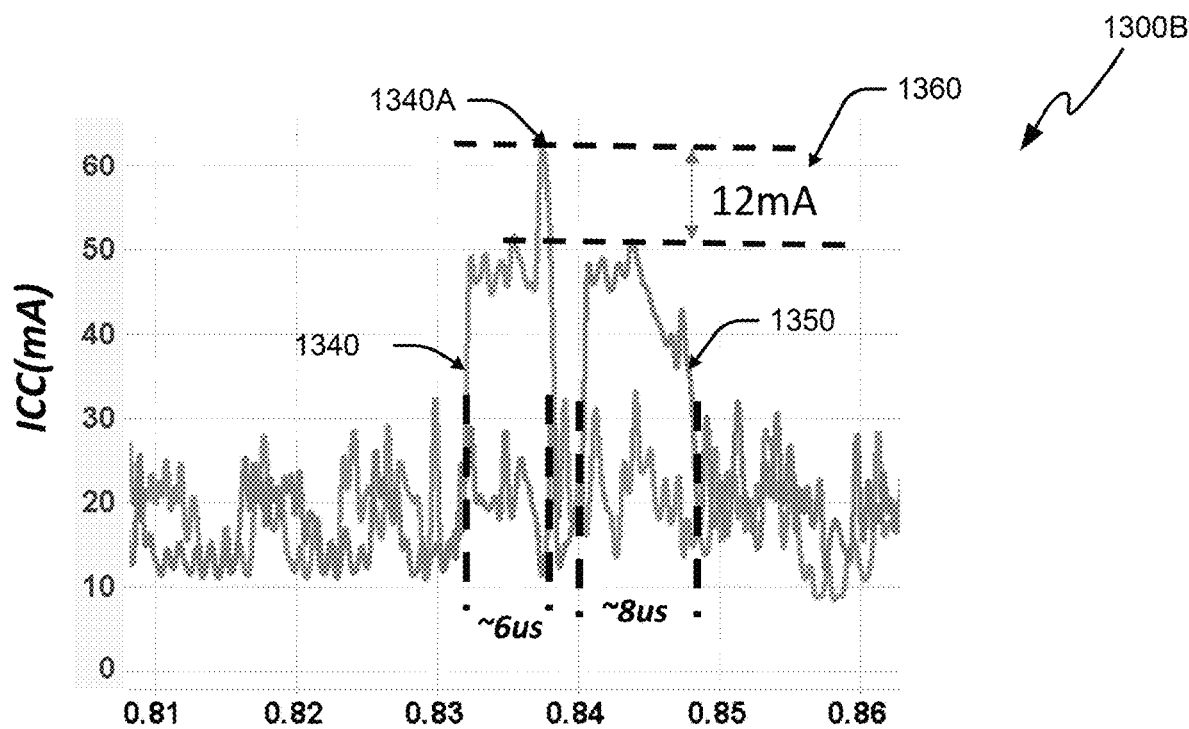
FIG. 13B shows a close-in ICC current profile view of a portion of a programming loop, particularly a portion of a loop in the middle section of a programming cycle.

FIG. 13B shows a close-in ICC current profile view 1300B of a portion of a programming loop, particularly a portion of a loop in a middle section of the programming process of the tprog cycle (e.g., FIG. 11A, 1108)). Similarly to the examples shown in FIG. 13B, two versions of ICC output current (1340, 1350) are superimposed to show outputs where in a first case corresponding to the first current profile 1340, a lower threshold detect level $V_{TGT}/V_{HSATGT}$, was utilized, for example at 70.6% of $V_{DDSA}$, and it can be seen that a significant current spike 1340A occurred for current profile 1340. Raising the threshold detect level $V_{TGT}/V_{HSATGT}$ to a higher amount, for instance 88.2% of $V_{DDSA}$, resulted in a current profile 1350 that had significantly lower ICC output late in the phase 1 period, approximately 12 mA less at peak in the illustrated figure, although an increased time to bit line charge-up ensued (8 μs versus 6 μs for current profile 1340), and bit line charge-up occurred significantly later in time. Given that the peak 1340A corresponding to the lower threshold detect voltage scenario was over 12 mA in excess of the maximum ICC for current profile 1350, the reduced programming time from the lower threshold detect level $V_{TGT}/V_{HSATGT}$ may not be justified for the middle-section higher bit line capacitance cases, especially when excess peak ICC may cause circuit malfunctions.

As shown above in regards to FIGS. 13A and 13B, one method to control peak ICC is to control the charge-up of the bit lines that are to be brought to an inhibit voltage level, as the highest ICC peaks are often seen during a middle section of device loop programming where bit lines often experience higher capacitance. FIGS. 13A-C illustrate example memory arrays and corresponding parasitic capacitances that arise depending on the inhibit/program state of bit lines that are in electrical communication with the memory array.

Figure 14A:
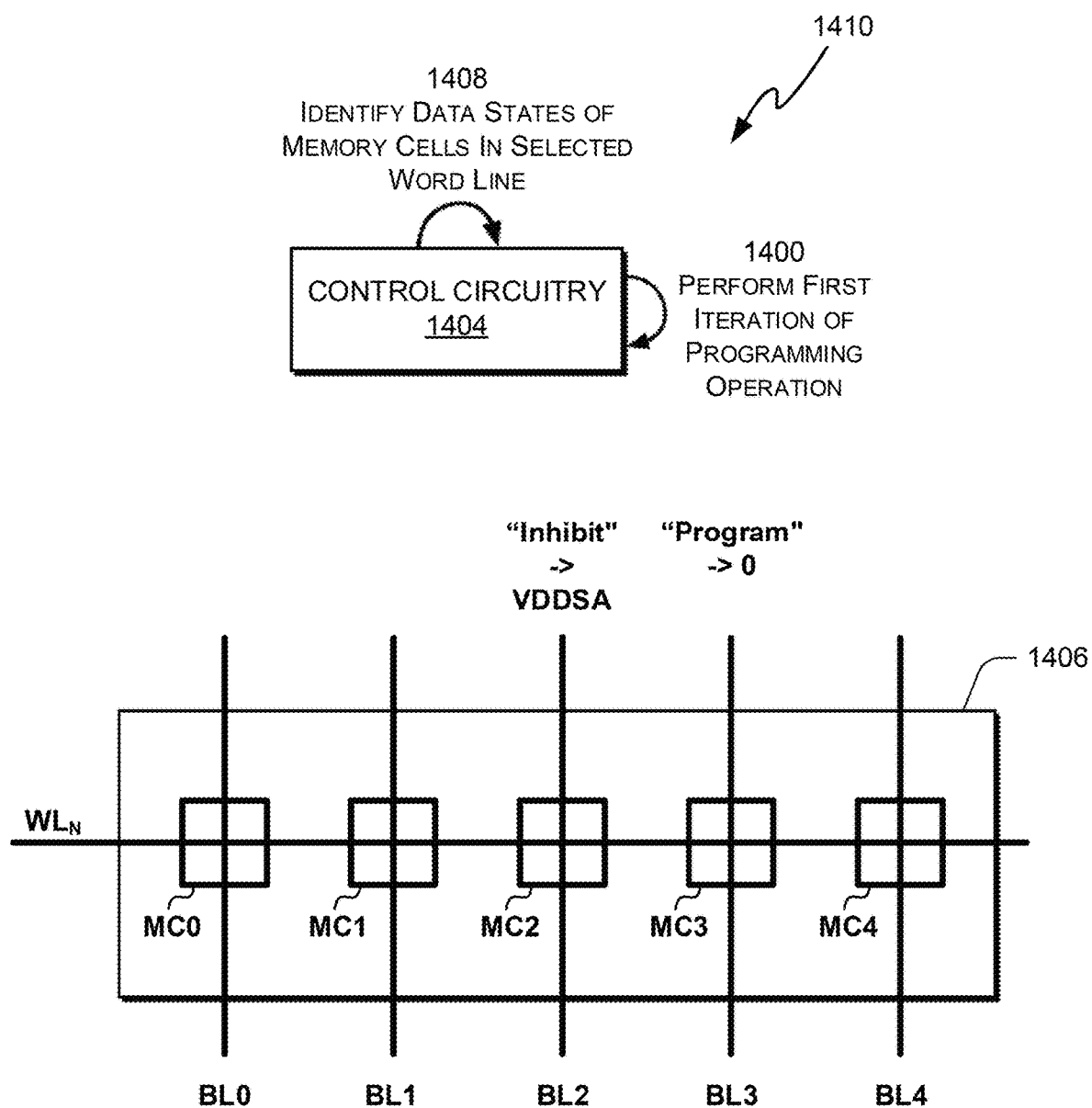
FIG. 14A illustrates a memory cell array of the present disclosure and associated control circuitry.

In regards to FIG. 14A, the memory cell array 1406 may include a set of memory cells MC0-MC4 connected via word lines and bit lines. The control circuitry 1404 may include a state machine capable of communicating with memory cells in the memory cell array 1406. The memory cells of the selected word line (shown as WL$_n$) may include memory cell (MC)0, MC1, MC2, and MC3. The selected word line may be connected to a set of bit lines, which include bit line (BL)0, BL1, BL2, and BL3. The control circuitry 1404 may verify memory cells using different verification techniques for different iterations of a verify operation, as will be described further herein.

As shown in FIG. 14A by reference number 1408, the control circuitry 1404 may identify a set of data states for the set of memory cells of the selected word line. In some embodiments, the control circuitry 1404 may receive program command data (e.g., from a controller associated with the non-volatile memory device) and the program command data may specify memory cells and/or data states that each respective memory cell is to be programmed into. Additionally, or alternatively, the control circuitry may identify the data states by performing one or more read operations (sometimes referred to as sense operations). For example, the control circuitry may perform a read operation that includes providing a signal to a data latch of a memory cell. The signal may cause the data latch to provide the control circuitry with a return signal capable of identifying the data state. The control circuitry may perform a read operation for each respective memory cell connected to the selected word line. As shown by reference number 1410, and as described above, the control circuitry 1404 may perform a programming operation to begin to program the memory cells of the selected word line.

Figure 14B:
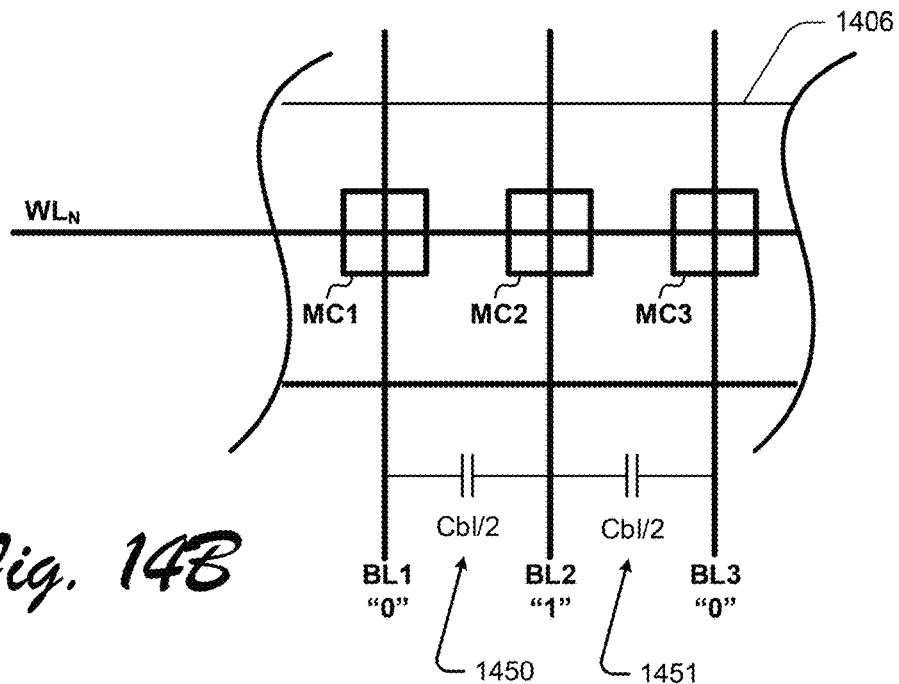
FIG. 14B illustrates a portion of a memory cell array of the present disclosure and associated bit line capacitance for three bit lines.

FIG. 14B illustrates a portion of the memory cell array 1406 of FIG. 14A, in the context of bit line capacitance. As mentioned above, parasitic capacitive coupling may occur between neighboring bit lines (represented by the illustrated parasitic equivalent capacitors 1450, 1451). When an "unselected" or "inhibit" bit line is charged to a level such as $V_{DDSA}$, but its neighbor is grounded (indicating a programming state for that line), the coupling or loading between bit lines may be relatively high. Therefore, a relatively large amount of charge (or current) may be required to charge the unselected/inhibited bit line. Whether an unselected bit line is neighbored on one or both sides by a selected bit line can also impact the amount of charge (or current) needed to charge the unselected bit line. For example, when an unselected bit line is neighbored on one side by a selected bit line, then a coupling capacitance between the two bit lines will result, in the magnitude of a bit line capacitance. Furthermore, when an unselected/inhibited bit line is neighbored on both sides by a selected bit then, then two coupling capacitances will be charged, as is illustrated in FIG. 14B (bit line BL1 is selected ("0"), bit line BL2 is charged to an unselect/inhibit state ("1"), and bit line 3 is shown as selected ("0"). In this case, capacitances on both sides of BL2 apply, and each value Cbl/2 and Cbl/2 are added together to form a parasitic capacitance value of Cbl. The actual values of Cbl/2 vary by circuit topology, semiconductor processes and materials used in fabrication, magnitude of $V_{DDSA}$, etc., but may in certain examples be on the order of a pF or less. On the other hand, when an unselected bit line is positioned between two other unselected bit lines, this may be viewed as not having to charge a coupling capacitance between the bit lines, and thus no parasitic contribution occurs.

Figure 14C:
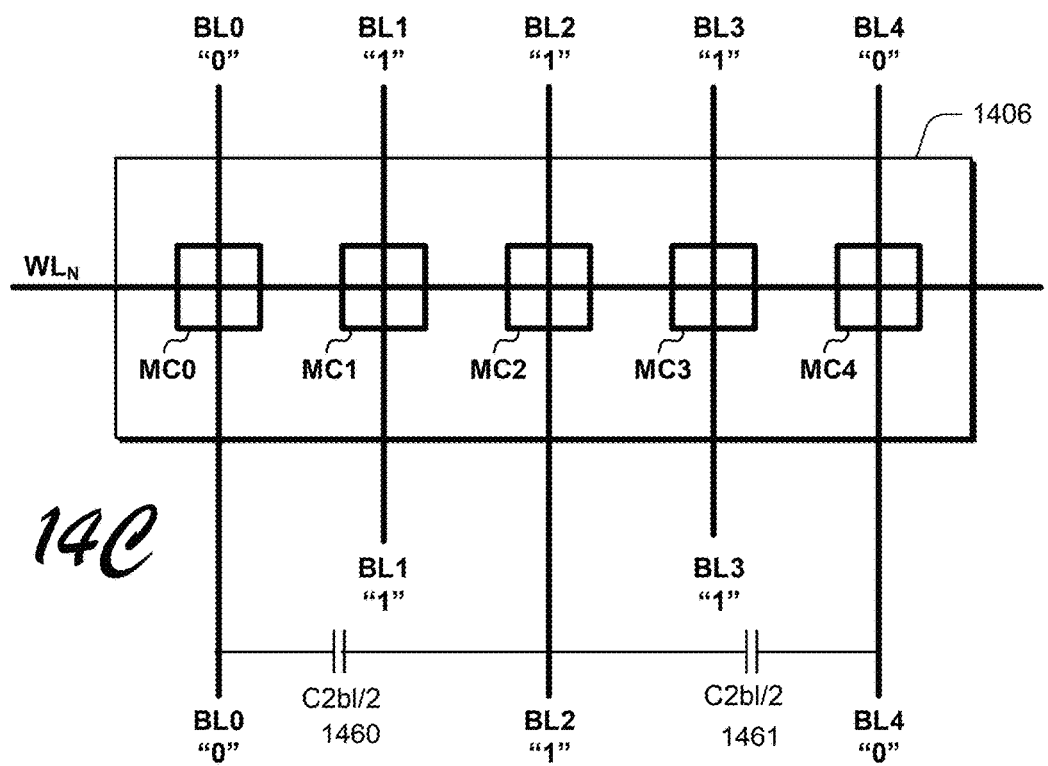
FIG. 14C illustrates a memory cell array of the present disclosure and associated bit line capacitance for five bit lines.

FIG. 14C shows the case where parasitic capacitances are considered for a 5-bit line situation; more particularly between the most distant bit lines BL0 and BL4, and a central bit line BL2. In this case, the bit line configuration for BL0 . . . BL4 is 0 1 1 1 0, meaning the three central bit lines are in an unselect/inhibit state, and the distant bit lines are in a program state. As mentioned above, when bit lines such as BL1, BL2, and BL3 are at the same potential (in this case a "1" or $V_{DDSA}$, there is little measurable parasitic capacitance that arises between BL1 and BL2, or BL3 and BL2, thus these may be treated as zero. However, for this data pattern configuration of bit lines BL0 . . . BL4, parasitic capacitances 1460, 1461 arise between BL2 and BL0 and BL2 and BL4, respectively. Depending on the circuit geometries, processes, voltages, etc. described above, these capacitances C2$bl$/2 (for the two-bit-line parasitic capacitance equivalents) may be on the order of a fraction of a pF, but still not negligible. Capacitances beyond two bit lines away may also be modeled, but an approximate distant capacitance (for example "$C_0$" can be assigned for the average case bit line configuration for the chosen size of memory array 1406. A table for calculation of capacitances base on bit line configurations is shown in FIG. 14D, and once specific values for process-dependent capacitances are plugged into the variables in the table, specific capacitances can be calculated for each data pattern. As an example, for a TLC-type memory array if we count all cells from different state, total probability of inhibit "1" and program "0" cells can be calculated for each pulse, and a probability of each BL pattern can be calculated. Thus total capacitance loading for each pulse $C_{total(n)} = \Sigma_{i=1}^{32} C\_bl(i) P\_bl(i,n) * N\_bl$, where C_bl(i) represents capacitance for pattern i, P_bl(i,n) represents probability of pattern i for pulse #n, and N_bl represent total BL number. Thus, aspects of the present disclosure provide for determine bit line capacitive distribution over the programming loops that occur during a programming cycle (e.g., over tprog), by modeling distribution probabilities of certain bit line patterns over the loops that form the programming cycle.

Thus, in one aspect of the present disclosure, individual bit line capacitances arising from the above cross-bit line parasitic capacitances and through statistical methods are applied to programming loops to determine an average loop capacitance for a particular memory cell type and configuration. To summarize, early in the tprog programming cycle (for instance, during section 1107 of FIG. 11A) as memory cell arrays start at an erased state, few of the bit lines will be in inhibit/unselect mode as most of the memory cells will need to be programmed, thus many assuming a zero/low voltage value, and there will be low or negligible cross-line capacitance. During this section, the lower capacitance means that lowering the inhibit voltage charge up threshold $V_{HSATGT}$ as shown and described in accordance with FIG. 13A and related text may result in a faster charge-up of the relevant bit lines to $V_{DDSA}$ without incurring significant current spikes, and thus lowering a regulated to unregulated charge transition by adjusting voltage detection parameter $V_{HSATGT}$ may be advantageous during this section from a performance standpoint. Further, during the middle section of programming loops (for instance, during section 1108 of FIG. 11A), some memory cells are becoming fully programmed and thus their corresponding bit lines will be placed in a high or inhibit/unselect state, increasing the likelihood that bit line configurations such as those shown towards the top of the table in FIG. 14D are more likely to occur, thus bit lines are more likely to have significant parasitic capacitances associated with them. Accordingly, the current profiles shown in FIG. 13B apply to this section of program loops, and the significant capacitance-related spiking in this state warrants an increasing a regulated to unregulated charge transition point by upwardly adjusting voltage detection parameter $V_{HSATGT}$ may be advantageous during this section even though a delay is induced (at the expense of a significant savings in peak ICC). Finally, during the ending section of programming loops (for instance, during section 1109 of FIG. 11A), more and more cells are becoming programmed, and thus a majority of bit lines begin to assume the inhibit/unselect mode, with fewer "0" or select modes interspersed, again lowering the parasitic capacitances associated with particular bit line configurations over the programming loops, and downwardly adjusting transition voltage detection parameter $V_{HSATGT}$ during this section may decrease delay in charging inhibit bit lines while not causing undesired peak ICC spikes.

Embodiments of the present disclosure may determine the where transition points lie between where early sections (e.g. FIG. 11A, 1107), middle/pre-charge sections (e.g. FIG. 11A, 1108) an end sections (FIG. 11A, 1109). For example, as FIGS. 11A and 11B show, in one exemplary configuration, capacitance of bit line charging states varying across programming loops leads to three approximately equal intervals based over the total number of programming loops to complete the programming cycle (e.g. at time tprog). Therefore, once a maximum loop count is set (as explained in more detail below), the first third of the number of programming loops may have a lower $V_{HSATGT}$ value, the middle third will have a higher $V_{HSATGT}$ value, and the last third will have a lower $V_{HSATGT}$ value. For example, for a particular memory device configuration, if the maximum loop count is set to 21, then programming loops 1-7 would use a lower $V_{HSATGT}$ setting, for example in the range of 65% to 75%, loops 8-13 would use a $V_{HSATGT}$ setting, for example in the range of 85% to 95%, and loops 1-7 would use a lower $V_{HSATGT}$ setting, for example in the range of 65% to 75%.

In yet another embodiment, a controller of the memory storage device may maintain $V_{HSATGT}$ at a constant level for a programming cycle, or for a predetermined number of programming cycles, for example 10 cycles, during the process tracking and storing peak ICC values for each programming loop within the respective cycle. Once peak ICC values have been tracked and logged, programming loop numbers are correlated with peaks in ICC, and $V_{HSATGT}$ may be adjusted in future programming cycles on a per-loop basis (for example, raising $V_{HSATGT}$ for loops known to consistently exceed the maximum desired ICC level prevent peak ICC from exceeding a predetermined max ICC level; an exemplary predetermined maximum ICC may be set to 50 mA (or any other desired maximum threshold value). In this way, current usage by the storage device is regulated to avoid undesired ICC peaks while impacts to programming delays are minimized.

An embodiment also provides for incremental changes in $V_{HSATGT}$ over a program cycle to minimize impacts to programming time tprog. In some embodiments, $V_{HSATGT}$ is transitioned in a stepwise manner from low to high then from high to low, through the early, middle, and end sections of the programming cycle discussed above. However, in various embodiments, small changes are introduced to $V_{HSATGT}$ as the pre-charge (or middle) section of programming is entered, incrementally raising $V_{HSATGT}$ as programming loops become closer to a halfway point between a start and completion of the pre-charge/middle section. During this incremental $V_{HSATGT}$ raising section, $V_{HSATGT}$ could be raised an incremental amount for each successive programming loop, by an amount such as ($V_{HSATGT}$ Max–$V_{HSATGT}$ Min)/(# of loops in one half of the pre-charge/middle section), where $V_{HSATGT}$ Max is a predetermined maximum value that $V_{HSATGT}$ may be raised to, for example 88%, $V_{HSATGT}$ Min is a minimum value that $V_{HSATGT}$ may be lowered to, for example 70%, and the # of loops in one half of the pre-charge/middle section represents one half of the number of programming loops that elapse in a pre-charge programming section, for example section 1108 as shown in FIG. 11A. In this way, $V_{HSATGT}$ will be progressively increased from a minimum value to a maximum value as the programming loops enter the pre-charge/middle section 1108, and are raised to an approximate maximum value in about a midpoint of the pre-charge/middle section 1108. Likewise, in the remaining programming loops from a midpoint of the pre-charge/middle section 1108 to an exit point of the pre-charge/middle section 1108 approaching the end section 1109, $V_{HSATGT}$ may be incrementally decremented in each programming loop by an amount such as ($V_{HSATGT}$ Max–$V_{HSATGT}$ Min)/(# of loops in one half of the pre-charge/middle section) so that as the programming loops are completed in the pre-charge/middle section 1108, and the end section 1109 is entered, $V_{HSATGT}$ will approximate $V_{HSATGT}$ Min, and the operation continues for each loop until the end of the current programming cycle. In this way, $V_{HSATGT}$ has been increased and decreased more smoothly, reducing the impact on programming time tprog that results from increases in $V_{HSATGT}$. Although linear increments are described, any increment/decrement approach may be used to smoothly alter changes in $V_{HSATGT}$.

In yet another embodiment, a controller of the present disclosure utilizes a bit line data pattern configuration on a programming loop-wise basis to perform a table look up from a pre-stored data pattern to $V_{HSATGT}$ table, where $V_{HSATGT}$ in this table is directly correlated to a bit line equivalent capacitance (as seen, for example, in table 14D, but where $V_{HSATGT}$ is not shown in an illustrated column but would be correlated with entries "BL Equiv Cap" so that higher amounts of BL Equiv Cap would equate to a higher $V_{HSATGT}$ within a predetermined range, and lower BL Equiv Cap values would equate to a lower $V_{HSATGT}$ within the predetermined range. In this way, any pre-configured $V_{HSATGT}$ patterns can be stored for specific bit lines that are known to present specific capacitive impacts to peak ICC, and $V_{HSATGT}$ may be changed on a basis corresponding to the table-look up values for each bit line configuration. In a related embodiment, $V_{HSATGT}$ values as stored in the table for each bit line configuration may be updated by a processor of the present disclosure, if, for example, processing loops are experiencing peak ICC values above a particular threshold (wherein stored values of $V_{HSATGT}$ could be increased for such bit line configurations in the table). Likewise, stored values of $V_{HSATGT}$ may be decreased if it is determined that peak ICC is well below a maximum desired ICC level for specific bit line data configurations, thus minimizing impacts to programming time.

Figure 15:
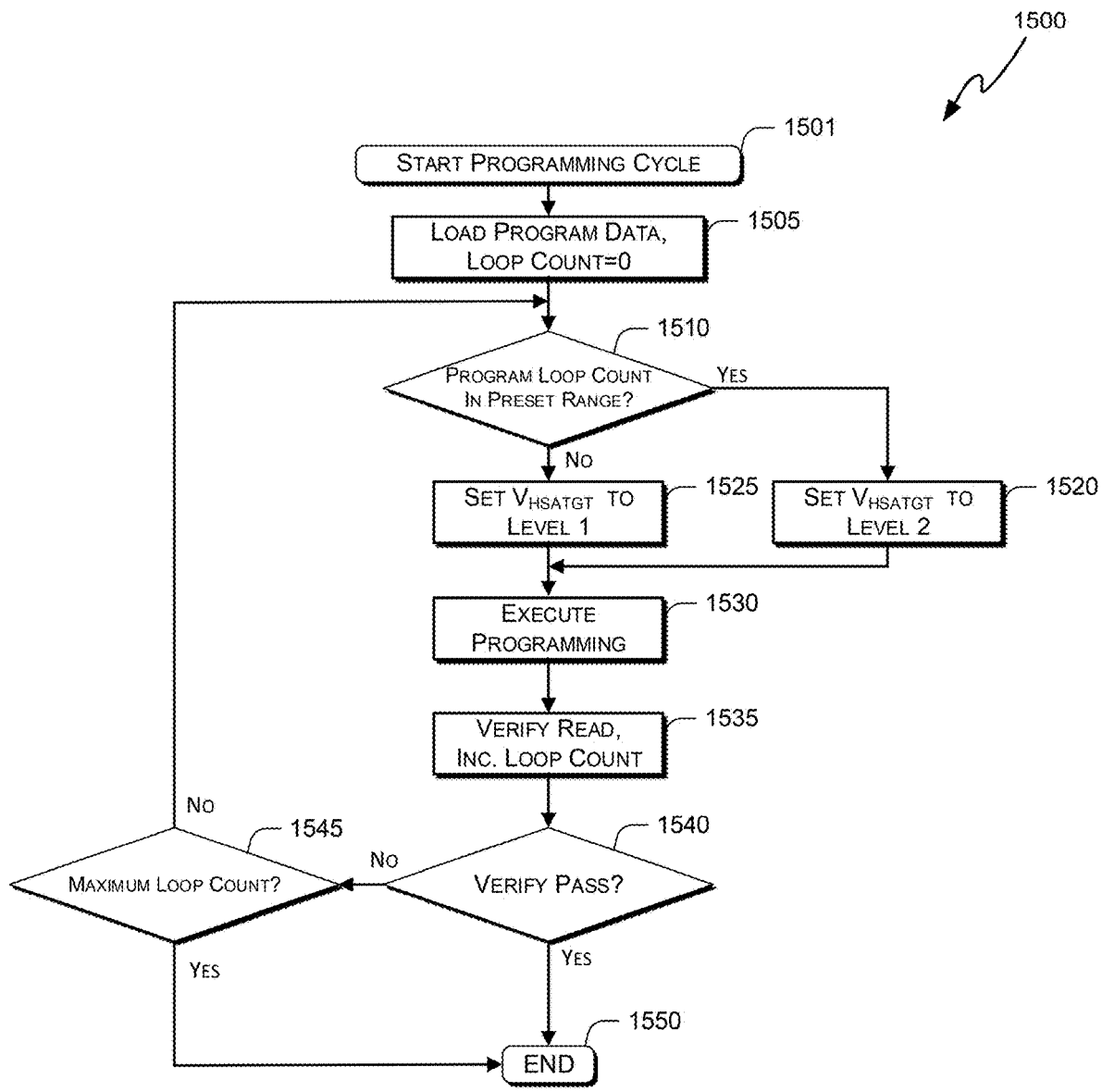
FIG. 15 illustrates a process flow of the present disclosure.

FIG. 15 illustrates a process flow 1500 of the present disclosure. The programming process of an array of memory cells of a memory device begins 1501, and program data for the cells within the array of memory cells to be programmed is loaded 1505, and a programming loop counter is reset. During programming, memory cells are progressively programmed from an erase state to a final desired state (e.g., states A, B, C, etc.). The charge state of a memory cell being programmed may be increased progressively over a plurality of programming loops until the final desired charge state is reached. Once the final programming charge state for a memory cell has been reached, the bit line associated with the memory cell may be locked-out by applying an inhibit voltage/bias level thereto. Generally, for a plurality of parallel bit lines associated with respective memory cells programmed in connection with a programming operation, the progressive locking-out/inhibiting of the bit lines over the course of the programming loops of the programming operation may be considered predictable when programming data is scrambled (also referred to as randomized). Therefore, a table or other data structure may be predefined that maps programming loops, or loop numbers, to bit line bias level variance values or expected bit line capacitance. As a programming operation iterates through a plurality of programming loops, parameters such as $V_{HSATGT}$ may be dynamically adjusted depending on the loop count, the current loop position in the full programming sequence, or the predicted loop-dependent individual bit line capacitance; any desired operational parameters may be dynamically adjusted to reflect the current loop in the programming operation.

The process 1500 continues with determining 1510 whether the loop count is within a "preset range." A "preset range" may be determined by any appropriate method; in one embodiment, a loop count is within a preset range when the loop number is within a middle section of program loops such as section 1108 in FIG. 11A, or a section of programming loops where bit line capacitance is expected to be high, such as section 1108B of FIG. 11B, or within the approximate middle one third of programming loops used to complete a programming cycle. If the loop count is within a preset range, a parameter is set 1525 to reduce the magnitude of ICC peaks, such as increasing $V_{HSATGT}$ as detailed above to reduce the unregulated current charge-up of inhibited bit lines. If the loop count is not within a preset range, a parameter such as $V_{HSATGT}$ is set to reduce the charge-up time of inhibited bit lines while minimizing total programming time. Once the parameters are set, programming of the selected memory cells ensues 1530 according to processes described above, and selected cells have floating gate thresholds increased during the programming step. Once programming 1530 is complete, the cells of the memory array are read and verified to determine whether sufficient threshold voltages have been achieved within memory cells (thus requiring future bit lines in the programming cycles to be inhibited or unselected) or whether additional programming is required to increase cell threshold voltages to a predetermined level as determined in step 1505; the loop count is also incremented. If the verification has passed 1540 for all involved memory cells, the programming ends 1550, otherwise if a maximum loop count has not been achieved 1545, the process continues with step 1510, to determine whether the loop count is within a preset range. Otherwise, if the maximum loop count has been reached, the process terminates 1550.

Maximum loop count may be determined in any appropriate manner. Generally, storage devices may be pre-characterized based on their semiconductor process technology, design rules, memory cell configuration, and the like, and a maximum loop count may be determined and pre-set. For example, exemplary memory cells will be capable of being completely programmed within about 20 loops. For this exemplary configuration, an allowed maximum loop count may be set to a slightly higher number, for instance 24. In this way, a small population of manufactured storage devices that require slightly more than 20 loops to complete program can be found to be within operating specifications, and for the outlier storage devices that still cannot finish programming certain memory cells after the loop count reaches 24, the programming cycle may be terminated and a program failure reported so the controller of the storage device will retire the block with the un-programmable memory cells. This approach prevents storage devices of the present disclosure from becoming trapped into a dead loop and experiencing undesired voltage stresses. Also, for a particular product incorporating features of the present disclosure, the loop count required to finish programming can be pre-evaluated and is generally very close to a fixed number, with a lifetime variation typically less than 5%. In an alternate embodiment, a controller of the present disclosure maintains a counter that maintains a running total of the number of programming loops required to fully program memory cells over separate programming cycles, and based on the running total, a maximum loop count may be determined based on actual performance of the memory device (for instance, an average of the maximum loop counts may be computed and used as a maximum loop count, or a maximum value of the running total may be utilized as a maximum loop count value for future programming.

Figure 16:
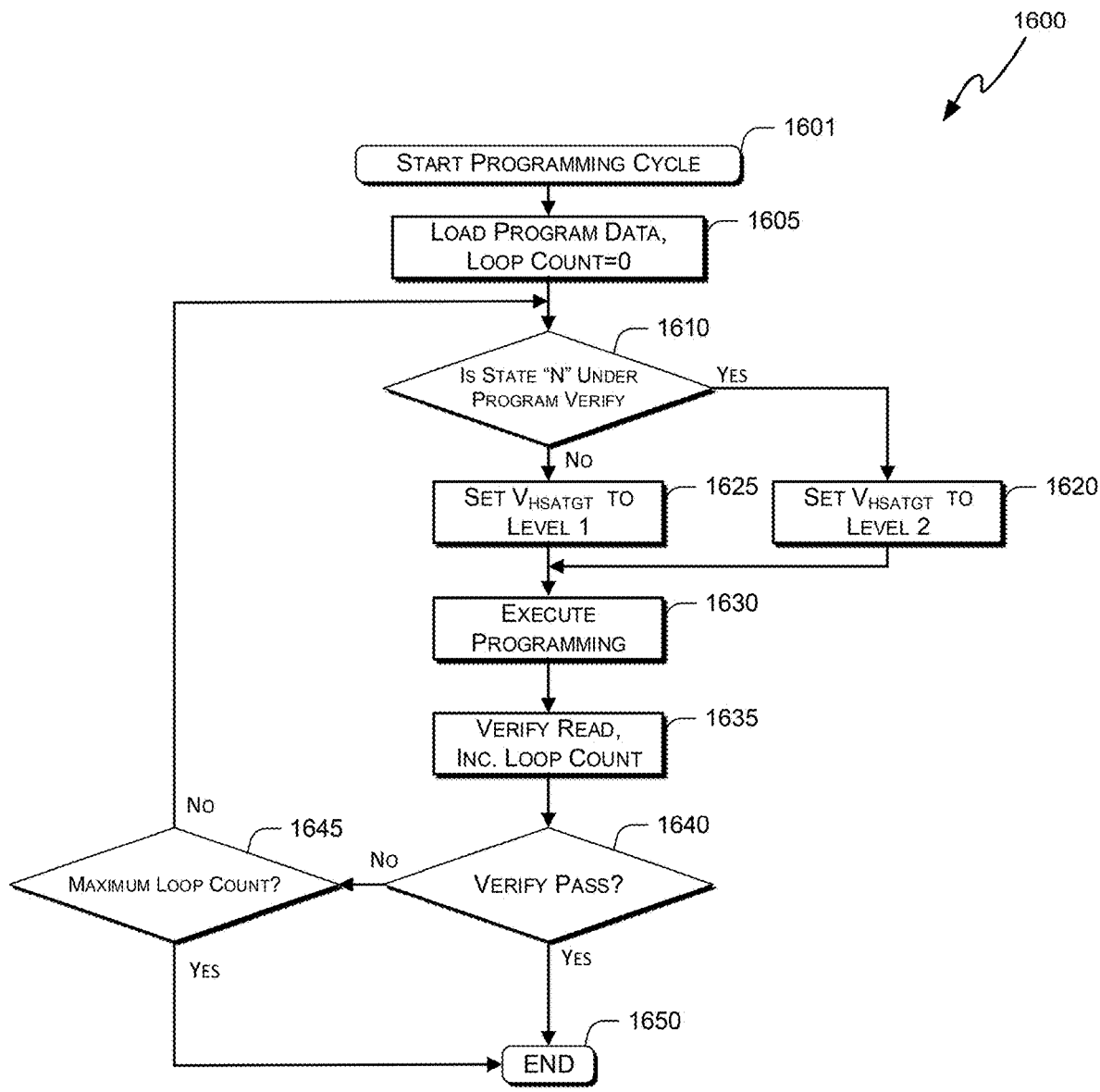
FIG. 16 illustrates another process flow of the present disclosure.

FIG. 16 illustrates a process flow 1600 of the present disclosure, where aspects of the present disclosure can use memory cell state to distinguish the switch point for bit line charge up. The programming process of an array of memory cells of a memory device begins 1601, and program data for the cells within the array of memory cells to be programmed is loaded 1605, and a programming loop counter is reset. During programming, memory cells are progressively programmed from an erase state to a final desired state (e.g., states A, B, C, etc.). The process 1600 continues with determining 1610 whether a particular programming state's $V_T$ will be checked in the verify operations following the current program pulse. If that result is affirmative, then the parameter $V_{HSATGT}$ is set to a higher level 1620 to reduce peak ICC as explained above; otherwise a first lower level is used 1625. For example, in 3 bit/per cell NAND devices, there are seven states (S1, S2, S3, S4, S5, S6, and S7) that need to be programmed. If certain states' (i.e, S3 or S4) $V_T$ will be checked in the verify operations following the current program pulse, the PR_CLK bit line equalization time is set longer.

In an embodiment regarding the above description, a higher $V_{HSATGT}$ is first applied at a program loop when a particular state begins to be verified, and the initial lower $V_{HSATGT}$ is applied again at a program loop when a particular state has completed programming and is no longer being verified. In general, the starting loop for higher $V_{HSATGT}$ could also be determined by when a particular state has completed programming, and the ending loop for higher $V_{HSATGT}$ could be determined by when a particular state begins to be verified.

Once the parameters are set, programming of the selected memory cells ensues 1630 according to processes described above, and selected cells have floating gate thresholds increased during the programming step. Once programming 1630 is complete, the cells of the memory array are read and verified to determine whether sufficient threshold voltages have been achieved within memory cells (thus requiring future bit lines in the programming cycles to be inhibited or unselected) or whether additional programming is required to increase cell threshold voltages to a predetermined level as determined in step 1605; the loop count is also incremented. If the verification has passed 1640 for all involved memory cells, the programing ends 1650, otherwise if a maximum loop count has not been achieved 1645, the process continues with step 1610, to determine whether the loop count is within a preset range. Otherwise, if the maximum loop count has been reached, the process terminates 1650.

Figure 17:
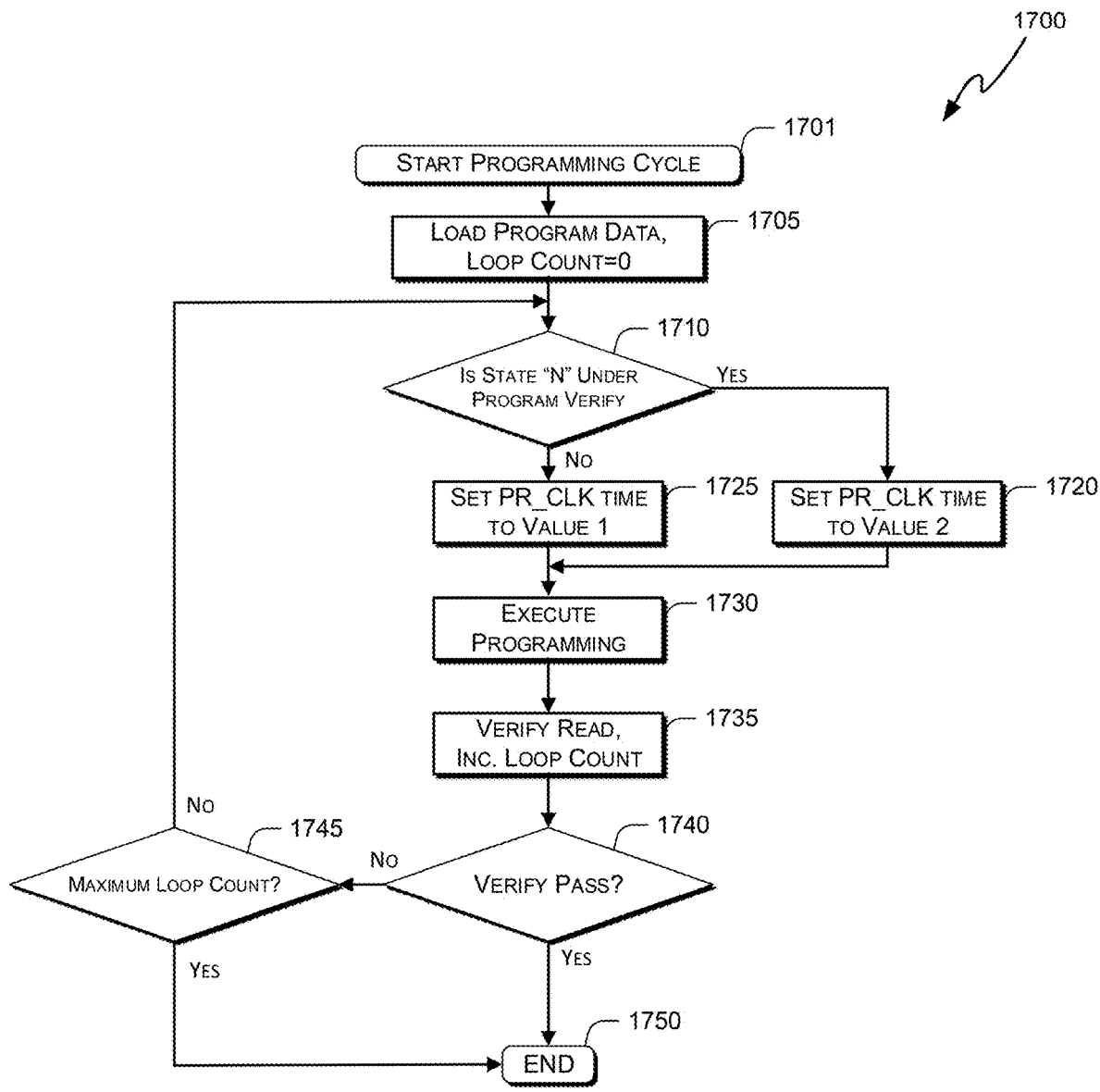
FIG. 17 illustrates another process flow of the present disclosure.

FIG. 17 illustrates a process flow 1700 of the present disclosure, where aspects of the present disclosure can use memory cell state to adjust program reset timing (PR_CLK timing). For example, if certain state under program verify, PR_CLK bit line equalization time is set longer, to allow bit lines to equalize to $V_{CELSRC}$ (inhibit bit line discharge and program bit line charge up, as shown in interval 1235 of FIG. 12A). This timing is also related to bit line capacitance and has a pulse-dependent signature due to different data patterns creating varying levels of parasitic bit line capacitance. As a result, the PR_CLK timing parameter can be set longer for certain pulses with high bit line capacitive loading while shorter PR_CLK timing may be set for other pulses with relatively smaller bit line capacitive loading.

The programming process of an array of memory cells of a memory device begins 1701, and program data for the cells within the array of memory cells to be programmed is loaded 1705, and a programming loop counter is reset. During programming, memory cells are progressively programmed from an erase state to a final desired state (e.g., states A, B, C, etc.). The process 1700 continues with determining 1710 whether a particular programming state indicates that a bit line is to be inhibited or charged up (such as the situation where state C or state D is under program verify). If that result is affirmative, then the parameter PR_CLK is set to a longer value 1720 to allow sufficient time for the higher-capacitance effected bit lines to settle to $V_{CELSRC}$; otherwise a first lower timing is used 1725 to shorten programming time where possible.

Once the parameters are set, programming of the selected memory cells ensues 1730 according to processes described above, and selected cells have floating gate thresholds increased during the programming step. Once programming 1730 is complete, the cells of the memory array are read and verified to determine whether sufficient threshold voltages have been achieved within memory cells (thus requiring future bit lines in the programming cycles to be inhibited or unselected) or whether additional programming is required to increase cell threshold voltages to a predetermined level as determined in step 1705; the loop count is also incremented. If the verification has passed 1740 for all involved memory cells, the programing ends 1750, otherwise if a maximum loop count has not been achieved 1745, the process continues with step 1710, to determine whether the loop count is within a preset range. Otherwise, if the maximum loop count has been reached, the process terminates 1750.

Figure 18:
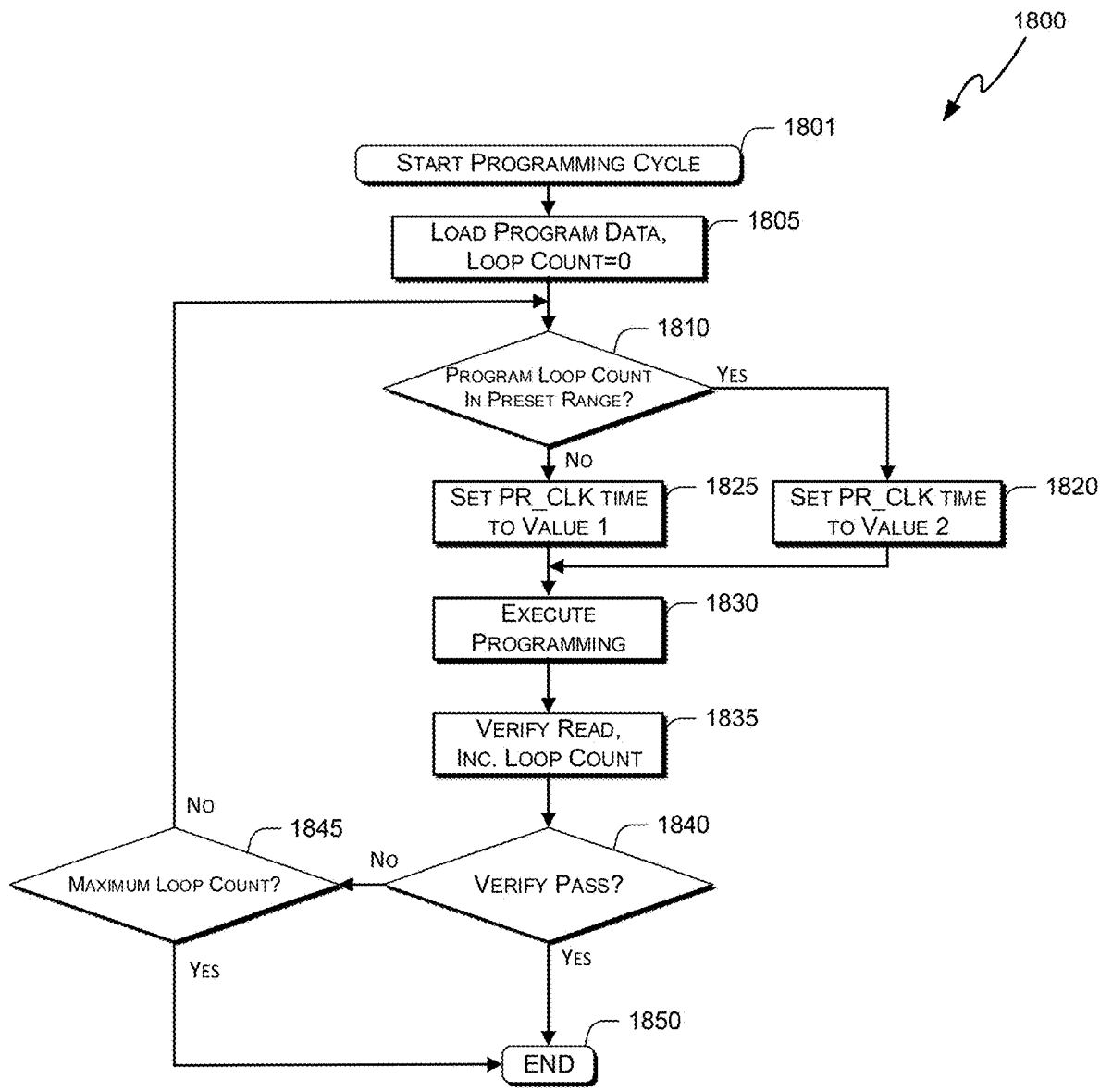
FIG. 18 illustrates another process flow of the present disclosure.

FIG. 18 illustrates a process flow 1800 of the present disclosure, where aspects of the present disclosure can use memory cell state to adjust program reset timing (PR_CLK timing). For example, For example, if current loop count is within a pre-set range as described above, PR_CLK bit line equalization time is set longer, to allow bit lines to equalize to $V_{CELSRC}$ (inhibit bit line discharge and program bit line charge up, as shown in interval 1235 of FIG. 12A). This timing is also related to bit line capacitance and has a pulse-dependent signature due to different data patterns creating varying levels of parasitic bit line capacitance. As a result, the PR_CLK timing parameter can be set longer for certain pulses with high bit line capacitive loading while shorter PR_CLK timing may be set for other pulses with relatively smaller bit line capacitive loading.

The programming process of an array of memory cells of a memory device begins 1801, and program data for the cells within the array of memory cells to be programmed is loaded 1805, and a programming loop counter is reset. During programming, memory cells are progressively programmed from an erase state to a final desired state (e.g., states A, B, C, etc.). The process 1800 continues with determining 1810 whether the loop count is within a "preset range." A "preset range" may be determined by any appropriate method; in one embodiment, a loop count is within a preset range when the loop number is within a middle section of program loops such as section 1108 in FIG. 11A, or a section of programming loops where bit line capacitance is expected to be high, such as section 1108B of FIG. 11B. If that result is affirmative, then the parameter PR_CLK is set to a longer value 1820 to allow sufficient time for the higher-capacitance effected bit lines to settle to $V_{CELSRC}$; otherwise a first lower timing is used 1825 to shorten programming time where possible.

Once the parameters are set, programming of the selected memory cells ensues 1830 according to processes described above, and selected cells have floating gate thresholds increased during the programming step. Once programming 1830 is complete, the cells of the memory array are read and verified to determine whether sufficient threshold voltages have been achieved within memory cells (thus requiring future bit lines in the programming cycles to be inhibited or unselected) or whether additional programming is required to increase cell threshold voltages to a predetermined level as determined in step 1805; the loop count is also incremented. If the verification has passed 1840 for all involved memory cells, the programing ends 1850, otherwise if a maximum loop count has not been achieved 1845, the process continues with step 1810, to determine whether the loop count is within a preset range. Otherwise, if the maximum loop count has been reached, the process terminates 1850.

Figure 19:
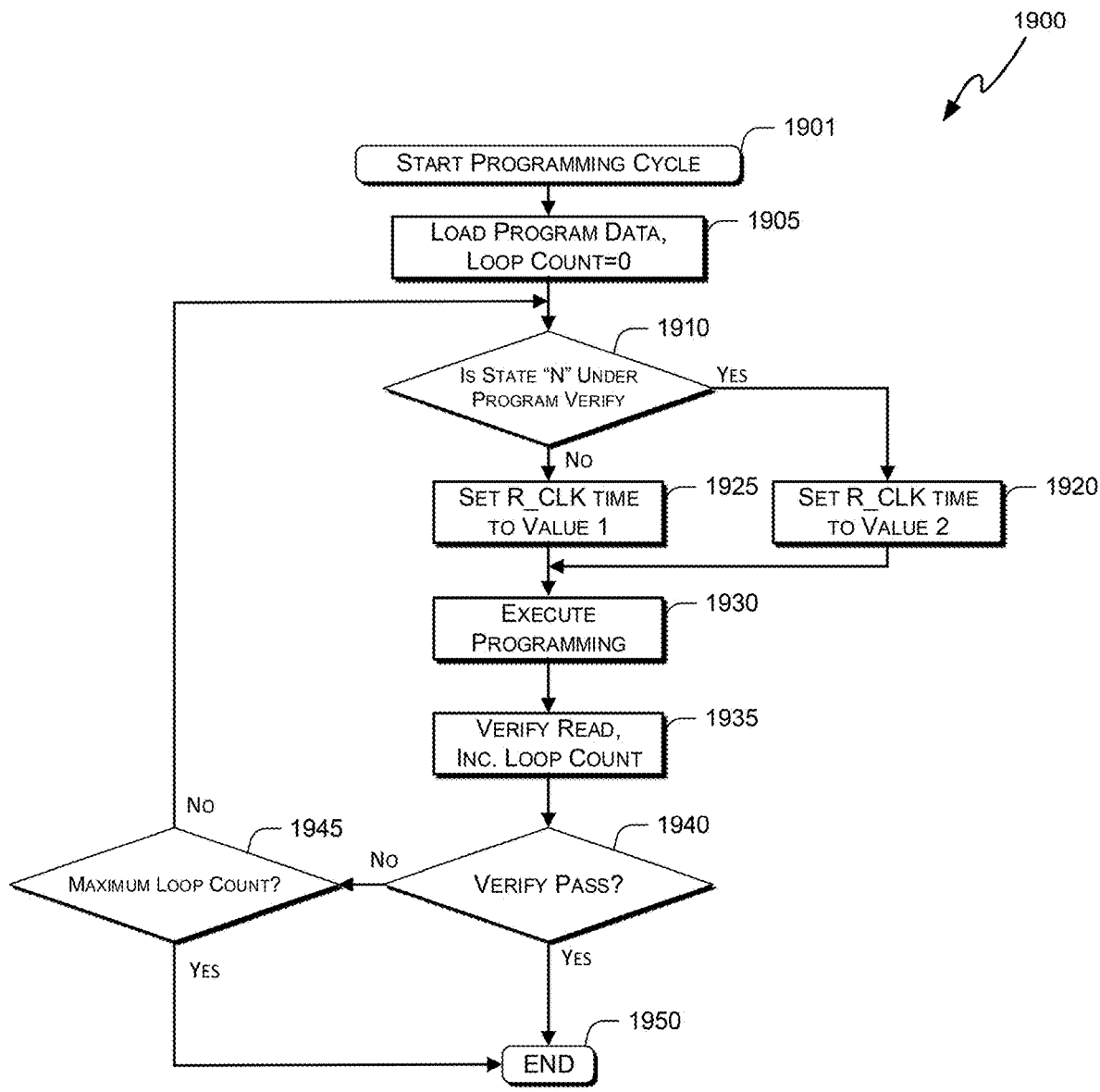
FIG. 19 illustrates another process flow of the present disclosure.
Figure 20:
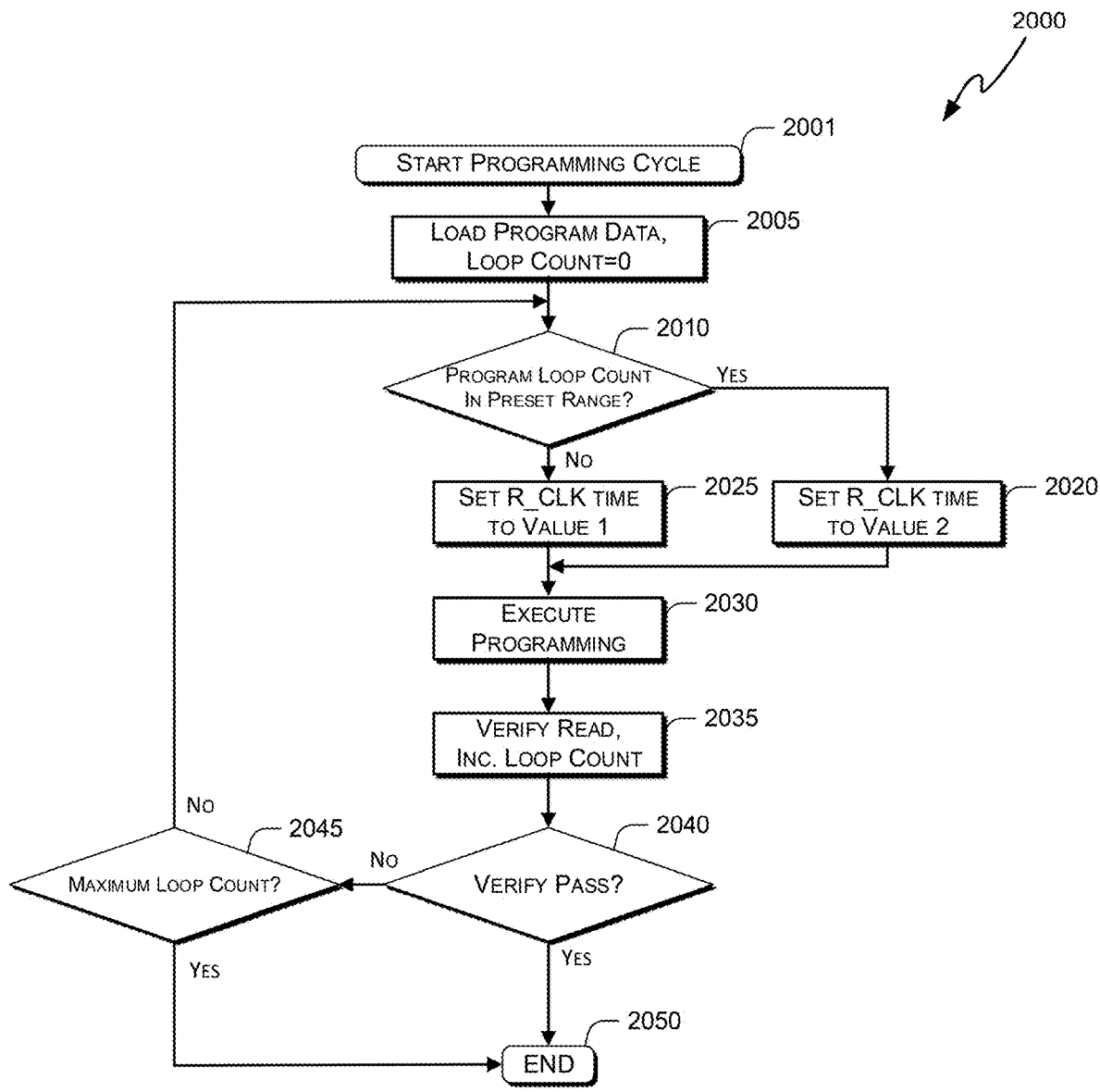
FIG. 20 illustrates another process flow of the present disclosure.

In regards to FIGS. 19-20, additional embodiments of the present disclosure are disclosed, an R_CLK verify timing parameter may be modified (bit line set up to $V_{BL}$ timing) by programming loop. If a bit line is not properly discharged prior to the read/verify stage, it would impact timing that the bit line takes to set to the $V_{BL}$ level for sensing (a visual depiction may be seen in FIG. 12A region 1240). (For example, for SLC with 2-3 total program loops, it has been observed that over program issues may arise if bit line set up time is not sufficiently long; for TLC, certain states have also be observed for this condition, if bit line set up timing is not of sufficient duration, over programming may occur. This timing is also related to bit line capacitance and has a pulse-dependent signature due to different data patterns creating varying levels of parasitic bit line capacitance. As a result, the R_CLK timing parameter can be set longer for certain pulses with high bit line capacitive loading while shorter R_CLK timing may be set for other pulses with relatively smaller bit line capacitive loading.

Regarding FIG. 19, the programming process of an array of memory cells of a memory device begins 1901, and program data for the cells within the array of memory cells to be programmed is loaded 1905, and a programming loop counter is reset. During programming, memory cells are progressively programmed from an erase state to a final desired state (e.g., states A, B, C, etc.). The process 1900 continues with determining 1910 whether a particular programming state indicates that a bit line is to be inhibited or charged up (such as the situation where state C or state D is under program verify). If that result is affirmative, then the parameter R_CLK is set to a longer value 1920 to allow sufficient time for the higher-capacitance effected bit lines to settle to $V_{BL}$; otherwise a first lower timing is used 1925 to shorten programming time where possible.

Once the parameters are set, programming of the selected memory cells ensues 1930 according to processes described above, and selected cells have floating gate thresholds increased during the programming step. Once programming 1930 is complete, the cells of the memory array are read and verified to determine whether sufficient threshold voltages have been achieved within memory cells (thus requiring future bit lines in the programming cycles to be inhibited or unselected) or whether additional programming is required to increase cell threshold voltages to a predetermined level as determined in step 1905; the loop count is also incremented. If the verification has passed 1940 for all involved memory cells, the programing ends 1750, otherwise if a maximum loop count has not been achieved 1945, the process continues with step 1910, to determine whether the loop count is within a preset range. Otherwise, if the maximum loop count has been reached, the process terminates 1950.

FIG. 20 illustrates a process flow 2000 of the present disclosure, where aspects of the present disclosure can use memory cell state to adjust program read/verify timing (R_CLK timing). For example, For example, if current loop count is within a pre-set range as described above, PR_CLK bit line equalization time is set longer, to allow bit lines to equalize to $V_{BL}$ (FIG. 12A region 1240). This timing is also related to bit line capacitance and has a pulse-dependent signature due to different data patterns creating varying levels of parasitic bit line capacitance. As a result, the R_CLK timing parameter can be set longer for certain pulses with high bit line capacitive loading while shorter R_CLK timing may be set for other pulses with relatively smaller bit line capacitive loading.

The programming process of an array of memory cells of a memory device begins 2001, and program data for the cells within the array of memory cells to be programmed is loaded 2005, and a programming loop counter is reset. During programming, memory cells are progressively programmed from an erase state to a final desired state (e.g., states A, B, C, etc.). The process 2000 continues with determining 2000 whether the loop count is within a "preset range." A "preset range" may be determined by any appropriate method; in one embodiment, a loop count is within a preset range when the loop number is within a middle section of program loops such as section 1108 in FIG. 11A, or a section of programming loops where bit line capacitance is expected to be high, such as section 1108B of FIG. 11B. If that result is affirmative, then the parameter R_CLK is set to a longer value 2020 to allow sufficient time for the higher-capacitance effected bit lines to settle to $V_{BL}$; otherwise a first lower timing is used 2025 to shorten programming time where possible.

Once the parameters are set, programming of the selected memory cells ensues 2030 according to processes described above, and selected cells have floating gate thresholds increased during the programming step. Once programming 2030 is complete, the cells of the memory array are read and verified to determine whether sufficient threshold voltages have been achieved within memory cells (thus requiring future bit lines in the programming cycles to be inhibited or unselected) or whether additional programming is required to increase cell threshold voltages to a predetermined level as determined in step 2005; the loop count is also incremented. If the verification has passed 2040 for all involved memory cells, the programing ends 2050, otherwise if a maximum loop count has not been achieved 2045, the process continues with step 2010, to determine whether the loop count is within a preset range. Otherwise, if the maximum loop count has been reached, the process terminates 2050.

As used herein, the verify operation may be a verify portion of a program-verify operation.

The foregoing detailed description of the disclosure has been presented for purposes of illustration and description. It is not intended to be exhaustive or to limit the disclosure to the precise form disclosed. Many modifications and variations are possible in light of the above teachings. The described embodiments were chosen in order to best explain the principles of the disclosure and its practical application, to thereby enable others skilled in the art to best utilize the disclosure in various embodiments and with various modifications as are suited to the particular use contemplated. It is intended that the scope of the disclosure be defined by the claims appended hereto.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

The foregoing detailed description of the disclosure has been presented for purposes of illustration and description. It is not intended to be exhaustive or to limit the disclosure to the precise form disclosed. Many modifications and variations are possible in light of the above teachings. The described embodiments were chosen in order to best explain the principles of the disclosure and its practical application, to thereby enable others skilled in the art to best utilize the disclosure in various embodiments and with various modifications as are suited to the particular use contemplated. It is intended that the scope of the disclosure be defined by the claims appended hereto.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in may be directly on the other layer of substrate, or intervening layers may also be present. Further, it will be understood that when a layer is referred to as being "under" another layer, it may be directly under, and one or more intervening layers may also be present. Furthermore, when a layer is referred to as "between" two layers, it may be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A non-volatile memory device, comprising:
   a plurality of memory cells electrically respectively electrically coupled to a plurality of bit lines; and
   control circuitry coupled to the plurality of memory cells and configured to program the plurality of memory cells in a programming operation that includes a plurality of program loops, the control circuitry being further configured to:
      count the program loops to establish a loop count of a sequence of programming loops to complete the programming operation,
      precharge in two phases a plurality of bit lines coupled to memory cells to be inhibited from further programming, the two phases including a current restricted phase and a current unrestricted phase,
      in at least one program loop, transition from the current restricted phase of precharge to the current unrestricted phase occurs in response to a voltage applied to the bit lines coupled to the memory cells to be inhibited from further programming exceeding a target voltage, and
      set the target voltage to a first lower target voltage if a position of the loop count is in a beginning section of the sequence of programming loops, set the target voltage to a higher target voltage value if the position of the loop count is in a middle section of the sequence of programming loops, and set the target voltage to a second lower target voltage value if the position of the loop count is in an ending section of the sequence of programming loops.

2. The non-volatile memory device of claim 1, wherein because the target voltage is dependent on the loop count, peak current utilization by the memory device during the programming operation is reduced.

3. The non-volatile memory device as set forth in claim 1 wherein the sequence of program loops includes at least twenty program loops and wherein the middle section of the sequence of program loops includes no more than six program loops.

4. The non-volatile memory device as set forth in claim 1 wherein the programming operation programs the memory cells to at least three bits per memory cell.

5. The non-volatile memory device as set forth in claim 1 wherein during the current unrestricted phase of precharge, the voltage applied to the bit lines coupled to the memory cells to be inhibited from further programming is increased to an inhibit voltage.

6. A method of controlling a non-volatile memory device that includes a plurality of memory cells respectively electrically coupled to a plurality of bit lines and includes control circuitry coupled to the plurality of memory cells and configured to program the memory cells in a programming operation that includes a plurality of program loops, the method comprising the steps of:
   counting the program loops to establish a loop count of a sequence of programming loops to complete the programming operation;
   precharge in two phases at least one bit line of the plurality of bit lines that is coupled to memory cells to be inhibited from further programming, the two phases including a current restricted phase and a current unrestricted phase; and
   in at least one program loop, transitioning from the current restricted phase of precharge to the current unrestricted phase of precharge in response to a voltage applied to the bit lines coupled to the memory cells to be inhibited from further programming exceeding a target voltage, and
   setting the target voltage to a first lower target voltage if a position of the loop count is in a beginning section of the sequence of programming loops, set the target voltage to a higher target voltage value if the position of the loop count is in a middle section of the sequence of programming loops, and set the target voltage to a second lower target voltage value if the position of the loop count is in an ending section of the sequence of programming loops.

7. The method of claim 6, wherein because the target voltage is dependent on the loop count, peak current utilization by the memory device during the programming operation is reduced.

8. The method as set forth in claim 6 wherein the sequence of program loops includes at least twenty program loops and wherein the middle section of the sequence of program loops includes no more than six program loops.

9. The method as set forth in claim 6 wherein the programming operation programs the memory cells to at least three bits per memory cell.

10. The method as set forth in claim 6 wherein during the current unrestricted phase of precharge, the voltage applied to the bit lines coupled to the memory cells to be inhibited from further programming is increased to an inhibit voltage.

11. An apparatus, comprising:
    a memory device including a plurality of memory cells that are electrically coupled to a plurality of bit lines;
    a controller coupled to the plurality of memory cells and to the plurality of bit lines and configured to program the memory cells in a plurality of program loops, the controller being further configured to:
       maintain a loop count of a sequence of programming loops to complete programming;

set a target voltage to a first lower target voltage if a position of the loop count is in a beginning section of the sequence of programming loops, set the target voltage to a higher target voltage value if the position of the loop count is in a middle section of the sequence of programming loops, and set the target voltage to a second lower target voltage if the position of the loop count is in an ending section of the sequence of programming loops; and precharge at least one of the plurality of bit lines that is coupled to at least one of the plurality of memory cells that is programmed in a first phase where current is controlled until a voltage applied to the at least one of the plurality of bit lines surpasses the target voltage that is based on the loop count.

12. The apparatus as set forth in claim 11, wherein the sequence of program loops includes at least twenty program loops and wherein the middle section of the sequence of programming loops includes no more than six program loops.

13. The apparatus as set forth in claim 11, wherein the programming operation programs the memory cells to at least three bits of data per memory cell.

14. The apparatus as set forth in claim 11, wherein during a current unrestricted phrase of precharge, the voltage applied to the bit lines coupled to the memory cells to be inhibited from further programming is increased to an inhibit voltage.

* * * * *